(12) United States Patent
Chakraborty et al.

(10) Patent No.: US 7,958,479 B2
(45) Date of Patent: Jun. 7, 2011

(54) METHOD AND APPARATUS FOR DESCRIBING AND TESTING A SYSTEM-ON-CHIP

(75) Inventors: Tapan J. Chakraborty, Princeton Junction, NJ (US); Chen-Huan Chiang, Princeton Junction, NJ (US); Suresh Goyal, Warren, NJ (US); Michele Portolan, Blandshardstown (IE); Bradford Gene Van Treuren, Lambertville, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 485 days.

(21) Appl. No.: 11/950,138

(22) Filed: Dec. 4, 2007

(65) Prior Publication Data

US 2009/0144594 A1   Jun. 4, 2009

(51) Int. Cl.
*G06F 17/50* (2006.01)
(52) U.S. Cl. .................. 716/114; 716/116; 716/138
(58) Field of Classification Search .................. 716/1, 4, 716/16–17, 114, 116, 136–138; 714/725–727, 714/729, 734–736, 742
See application file for complete search history.

(56) References Cited

U.S. PATENT DOCUMENTS

| | | | |
|---|---|---|---|
| 6,088,822 A | 7/2000 | Warren | |
| 6,430,718 B1 | 8/2002 | Nayak | |
| 6,456,961 B1 | 9/2002 | Patil et al. | |
| 6,665,828 B1 | 12/2003 | Arimilli et al. | |
| 6,708,144 B1 | 3/2004 | Merryman et al. | |
| 7,006,960 B2 | 2/2006 | Schaumont et al. | |
| 7,188,330 B2 | 3/2007 | Goyal | |
| 2003/0046015 A1 | 3/2003 | Gotoh et al. | |
| 2003/0131296 A1 | 7/2003 | Park et al. | |
| 2003/0131327 A1 | 7/2003 | Dervisoglu et al. | |
| 2003/0145286 A1 | 7/2003 | Pajak et al. | |
| 2004/0002832 A1 | 1/2004 | Chan | |
| 2005/0097416 A1 | 5/2005 | Plunkett | |
| 2005/0262460 A1 | 11/2005 | Goyal et al. | |
| 2005/0262465 A1 | 11/2005 | Goyal | |
| 2006/0179373 A1 | 8/2006 | Ishikawa | |
| 2006/0282729 A1 | 12/2006 | Dastidar et al. | |

(Continued)

FOREIGN PATENT DOCUMENTS

WO   WO 2007/049171 A   5/2007

(Continued)

OTHER PUBLICATIONS

Rearick, J., et al., "IJTAG (Internal JTAG): A Step Toward a DFT Standard", 2005, IEEE, pp. 1-10.*

(Continued)

*Primary Examiner* — Stacy A Whitmore
(74) *Attorney, Agent, or Firm* — Wall & Tong, LLP

(57) ABSTRACT

The present invention provides a new hardware description language for chip-level JTAG testing. This new hardware description language, referred to as New BSDL (NSDL), enables testing resources of a system-on-chip to be described, thereby enabling the system-on-chip to be described in a manner that facilitates testing of the system-on-chip. The present invention provides a bottom-up approach to describing a system-on-chip. The present invention supports algorithmic descriptions of each of the components of the system-on-chip, and supports an algorithmic description of interconnections between the components of the system-on-chip, thereby enabling generation of an algorithmic description of the entire system-on-chip or portions of the system-on-chip.

24 Claims, 22 Drawing Sheets

U.S. PATENT DOCUMENTS

| | | |
|---|---|---|
| 2007/0094629 A1 | 4/2007 | Alter et al. |
| 2008/0141087 A1 | 6/2008 | Whetsel |
| 2009/0144592 A1 | 6/2009 | Chakraborty et al. |
| 2009/0144593 A1 | 6/2009 | Chakraborty et al. |
| 2009/0193304 A1 | 7/2009 | Chakraborty et al. |
| 2009/0193306 A1 | 7/2009 | Chakraborty et al. |

FOREIGN PATENT DOCUMENTS

| | | |
|---|---|---|
| WO | WO 2005/078465 A | 8/2008 |

OTHER PUBLICATIONS

Carlsson, G., et al., "Protocol Requirements in an SJTAG/IJTAG Environment", 2007, IEEE, pp. 1-9.*

Crouch, A., et al., "IJTAG: The Path to Organized Instrument Connectivity",2007, IEEE, pp. 1-10.*

Eklow, B., et al., "Microsoft Power Point—ETS06—IJTAG-Embedded-Tutorial-v2", May 23, 2006, IEEE P1687 (IJTAG), pp. 1-42.*

"IEEE Standard Test Access Port and Boundary-Scan Architecture," IEEE Std. 1149.1-2001.

IEEE 1687 IJTAG HW Proposal, 1687 Proposed Hardware Architecture Summary Update, v7.0, Jun. 25, 2007.

"Hierarchical Scan Description Language Syntax Specification," ASSET InterTech, Inc. 1997.

IEEE Standard VHDL Language Reference Manual, IEEE Std 1076, 2000 Edition.

International Search Report and Written Opinion dated Mar. 19, 2009 in International Application No. PCT/US2008/013110, Alcatel-Lucent USA Inc., Applicant, 15 pages.

International Search Report and Written Opinion dated Mar. 19, 2009 in International Application No. PCT/US2008/013054than, Alcatel-Lucent USA Inc., Applicant, 15 pages.

International Search Report and Written Opinion, dated Feb. 19, 2009, in PCT/US2008/013109, Alcatel-Lucent USA Inc., Applicant, 15 pages.

Melocco K et al: "A comprehensive approach to assessing and analyzing 1149.1 test logic" Proceedings International Test Conference 2003. (ITC). Charlotte, NC, Sep. 30-Oct. 2, 2003; [International Test Conference], New York, NY : IEEE, US, vol. 2, Sep. 30, 2003, pp. 40-49, XP010685379 ISBN: 978-0-7803-8106-3.

Brian Foutz et al: "Automation of IEEE 1149.6 Boundary Scan Synthesis in an ASIC methodology" Test Symposium, 2006. ATS '06. 15$^{th}$ Asian, IEEE, PI, Nov. 1, 2006, pp. 381-388, XP031030539 ISBN: 978-0-695-2628-7.

* cited by examiner

600

700

900

1000

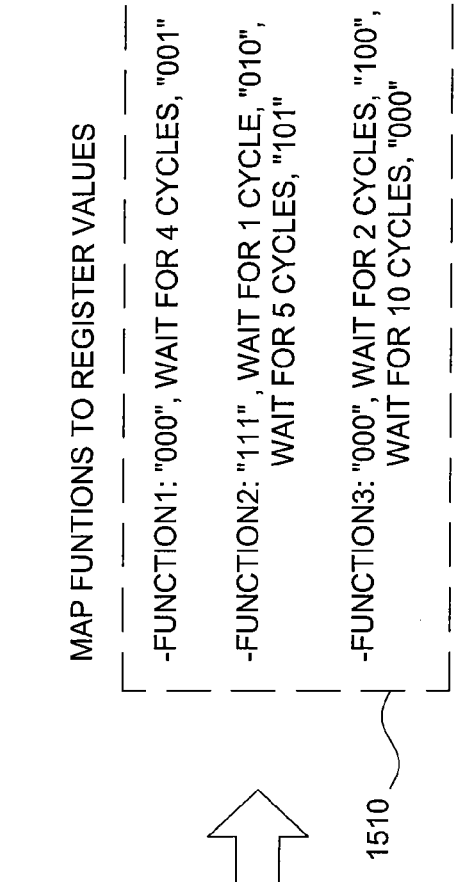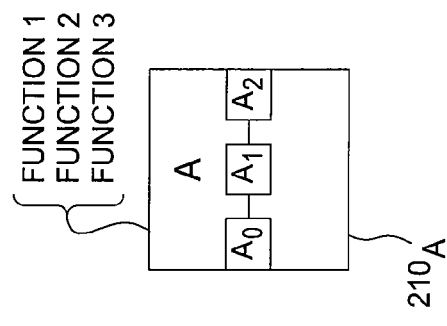
FIG. 15
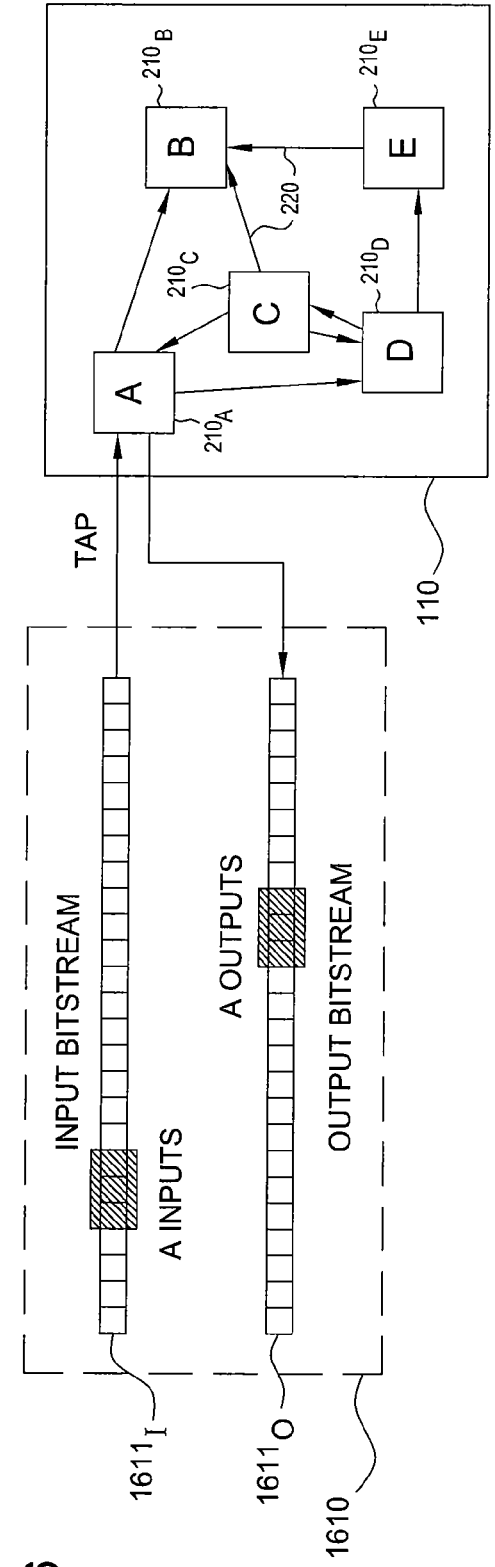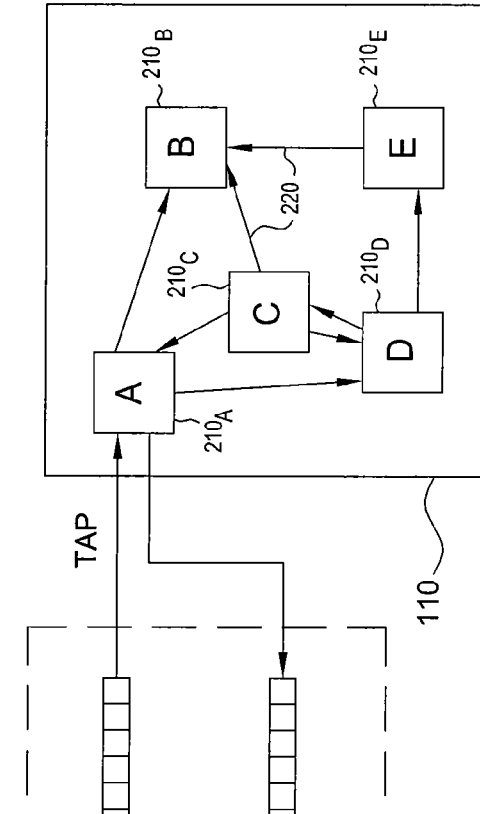
FIG. 16

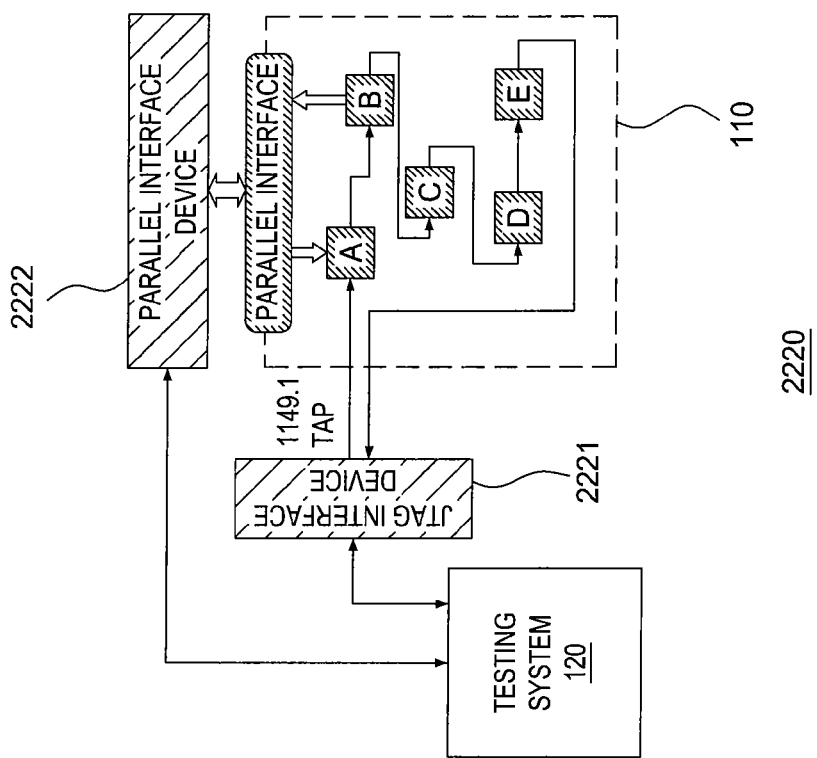
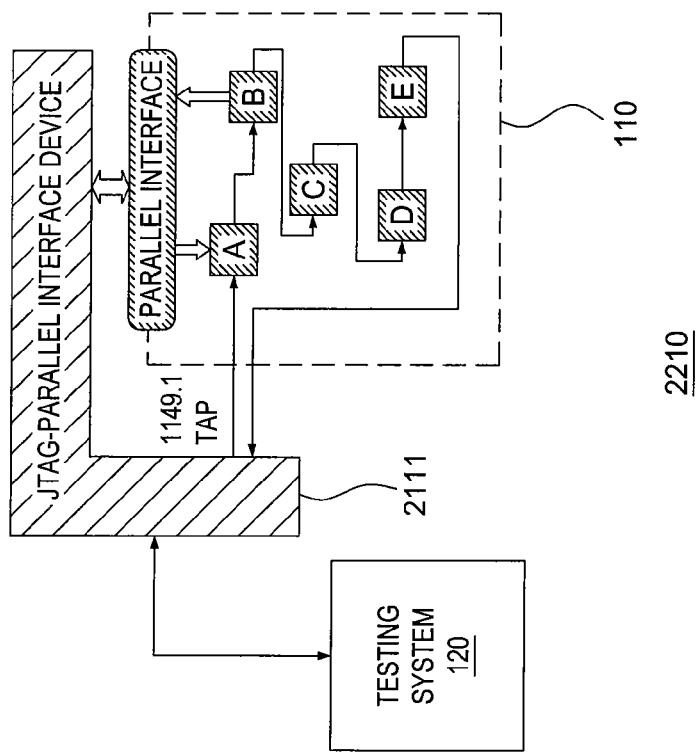
FIG. 22

METHOD AND APPARATUS FOR DESCRIBING AND TESTING A SYSTEM-ON-CHIP

CROSS-REFERENCE TO RELATED APPLICATIONS

This application is related to U.S. patent application Ser. No. 11/950,177, entitled "METHOD AND APPARATUS FOR DESCRIBING COMPONENTS ADAPTED FOR DYNAMICALLY MODIFYING A SCAN PATH FOR SYSTEM-ON-CHIP TESTING," and is related to U.S. patent application Ser. No. 11/950,212, entitled "METHOD AND APPARATUS FOR DESCRIBING PARALLEL ACCESS TO A SYSTEM-ON-CHIP;".

FIELD OF THE INVENTION

The invention relates to the field of printed circuit boards and, more specifically, to testing of printed circuit boards.

BACKGROUND OF THE INVENTION

Joint Test Action Group (JTAG) refers to the IEEE 1149 standard for test access ports for testing printed circuit boards using boundary scan. JTAG is used by Automated Test Generation (ATG) tools to test printed circuit boards. Boundary Scan Description Language (BSDL) has been developed as part of the IEEE 1149.1 standard for board-level JTAG and, further, Hierarchical Scan Description Language (HSDL) has been developed as an extension of BSDL. BSDL/HSDL describe resources available on a board or a component of a board (where HSDL describes components composed of other components). While BSDL/HSDL is efficient for board-level JTAG, passage from board-level JTAG to chip-level JTAG highlights limitations of BSDL/HSDL.

Instruction JTAG (IJTAG) is being standardized (denoted as the P1687 standard) to overcome existing JTAG limitations associated with the move from board-level JTAG to chip-level JTAG; however, ongoing work associated with IJTAG has revealed that BSDL/HSDL is unable to satisfy description requirements for chip-level JTAG testing. BSDL/HSDL relies on an ordered list of cells composing the boundary scan register, however, such a static description is not suited to describe complex dynamic scan chains required in IJTAG. Furthermore, BSDL/HSDL fails to provide any space for describing test procedures needed for each component of the system.

SUMMARY OF THE INVENTION

The present invention provides a new hardware description language for chip-level JTAG testing. This new hardware description language, referred to as New BSDL (NSDL), enables testing resources of a system-on-chip to be described, thereby enabling the system-on-chip to be described in a manner that facilitates testing of the system-on-chip. The present invention provides a bottom-up approach to describing a system-on-chip. The present invention supports algorithmic descriptions of each of the components of the system-on-chip, and supports an algorithmic description of interconnections between the components of the system-on-chip, thereby enabling generation of an algorithmic description of the entire system-on-chip or portions of the system-on-chip.

In one embodiment, a method for testing a system-on-chip having a plurality of components interconnected by a plurality of interconnections is provided. In one such embodiment, the method includes receiving an algorithmic description of each component of the system-on-chip, receiving an algorithmic description of a plurality of interconnections between the components of the system-on-chip, receiving an algorithmic description of the system-on-chip using the algorithmic descriptions of the components and the algorithmic descriptions of the interconnections, and storing the algorithmic description of the system-on-chip.

In one embodiment, a method for testing a component of a system-on-chip, wherein the component comprises at least one register, is provided. In one such embodiment, the method includes receiving an algorithmic description of the component, wherein, for each of at least one function supported by the component, the algorithmic description defines a mapping of the function to at least one register value for the at least one register of the component, and storing the algorithmic description of the component. This method may be repeated for each of the components of a system-on-chip.

BRIEF DESCRIPTION OF THE DRAWINGS

The teachings of the present invention can be readily understood by considering the following detailed description in conjunction with the accompanying drawings, in which:

FIG. 15 depicts use of a description of one of the components of the system-on-chip of FIG. 2 to determine register bit values for a test procedure for testing that component;

FIG. 16 depicts use of a description of the composition of the system-on-chip of FIG. 2 to determine bitstreams for a test procedure for testing one of the components of the system-on-chip of FIG. 2;

FIG. 22 depicts a high-level block diagram illustrating two exemplary parallel access connection schemes;

To facilitate understanding, identical reference numerals have been used, where possible, to designate identical elements that are common to the figures.

DETAILED DESCRIPTION OF THE INVENTION

Figure 1:
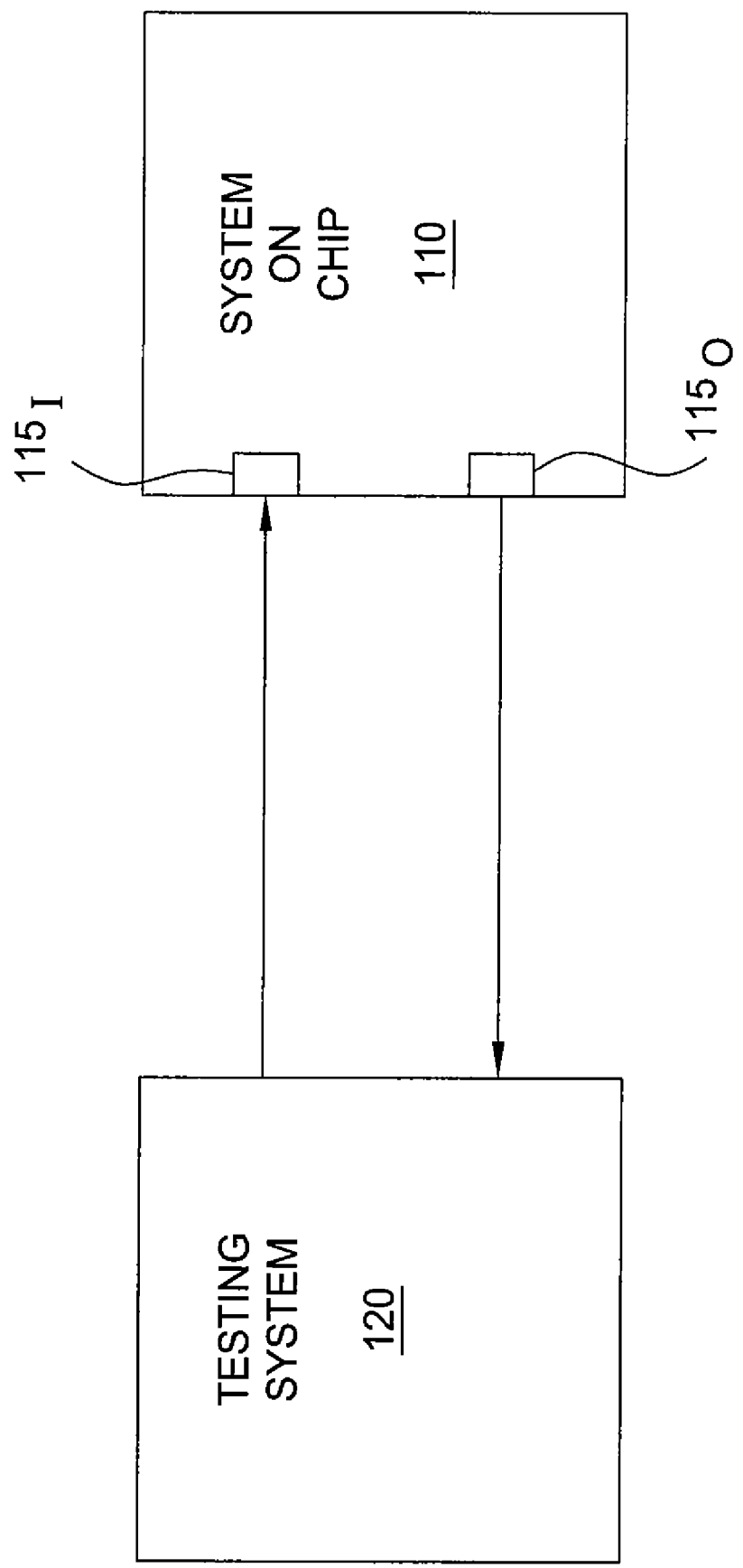
FIG. 1 depicts a high-level block diagram of a testing environment.

As described herein, Instruction JTAG (IJTAG) is being standardized (referred to as the P1687 standard, or, alternatively, IJTAG) to overcome existing JTAG limitations associated with the move from board-level JTAG testing to chip-level JTAG testing; however, ongoing work associated with IJTAG has revealed that BSDL/HSDL is unable to satisfy description requirements for chip-level boundary scan. The present invention provides a new hardware description language which overcomes the limitations of BSDL/HSDL for chip-level JTAG testing. This new hardware description language is referred to herein as New BSDL (NSDL). The NSDL language enables description of testing resources of a system-on-chip, thereby facilitating testing of the system-on-chip. The numerous advantages of the NSDL description language may be seen from the following description of NSDL.

As described herein, the new hardware description language, NSDL, also enables additional advancements in JTAG-based testing. The NSDL description language enables use of so-called "crossroad devices" to facilitate testing of system-on-chip devices. A crossroad device enables dynamic modification of the system scan path of the system-on-chip. The NSDL description language also enables use of parallel access to facilitate testing of system-on-chip devices. The parallel access to system-on-chip devices may be provided in many ways. Further, it should be noted that, although such advancements have been enabled by the NSDL description language, such advancements may also be utilized in conjunction with other description languages which may be developed later.

In the hardware development process, there are three primary actors: device providers, system architects, and test engineers. A device provider produces specific devices. A system architect uses the devices provided by the device provider to compose a system. A test engineer tests the system to ensure that the system is functioning properly (e.g., testing interconnections between devices of the system, functions of the devices, functions of the system, and the like). The NSDL language may be used by the device provider (e.g., to describe its devices), the system architect (e.g., in composing the system), and the system tester (e.g., in testing the system). Thus, the NSDL language is expected to be used throughout the hardware development process.

In the system-on-chip development process, the devices of which the system is composed may be "soft" devices, i.e., a description of the device in some hardware description language. In this process, the system architect integrates the soft devices with system level code in a system level development flow to obtain the system-on-chip that is ultimately tested by the test engineer. As the complexity of the system-on-chip increases (e.g., in terms of numbers of devices, interconnections between devices, intra-device dependencies, inter-device dependencies, and the like), the complexity of testing the system-on-chip increases. The NSDL language enables system-on-chip devices of any complexity to be easily described and, thus, tested.

FIG. 1 depicts a high-level block diagram of a testing environment. Specifically, testing environment 100 includes a system-on-chip (S-o-C) 110 and a testing system (TS) 120. The TS 120 tests S-o-C 110 (e.g., testing individual components of S-o-C 110 (including functions of components), interconnections between devices on S-o-C 110, system level functions of S-o-C 110, and the like, as well as various combinations thereof). The TS 120 tests S-o-C 110 via a Test Access Port (TAP) 115, which includes an input port $115_I$ (denoted as a TDI port) and an output port $115_O$ (denoted as a TDO port).

In one embodiment, in a P1687 environment, TAP 115 is described by the IEEE 1149.1 standard. Although primarily depicted and described herein using the TDI port $115_I$ and the TDO port $115_O$, TAP 115 may include other control ports, such as a TCK port, a TMS port, and, optionally, a TRST port (which have been omitted for purposes of clarity). Further, although primarily depicted and described with respect to a TAP described by the IEEE 1149.1 standard, TAP 115 may utilize various other ports (e.g., ports described by other standards and the like, as well as various combinations thereof).

The TS 120 performs testing on S-o-C 110 using test procedures. The TS 120 may perform one or more tests using one or more test procedures. A test procedure may be used to test a portion of a component (e.g., a function of a component, a set of functions of a component, intra-component dependencies, and the like), a component, a group of components (e.g., interconnections between components, inter-component dependencies, and the like), one or more system level functions, and the like, as well as various combinations thereof).

The TS 120 generates a test procedure to test S-o-C 110. The test procedure specifies information required to test S-o-C 110. A test procedure for S-o-C 110 may specify a description of S-o-C 110 (including descriptions of each of the individual components of S-o-C 110, as well as a system level description of S-o-C 110). A test procedure may specify an input test vector and an expected output test vector. A test procedure may include other information associated with a test, such as an estimated time required for the test, output data handling for the test (e.g., logging, error triggering, recovery actions, and so forth), the like, as well as various combinations thereof).

The TS 120 generates the test procedure to test S-o-C 110 using a description of S-o-C 110 (including descriptions of each of the individual components of S-o-C 110, as well as a system level description of S-o-C 110). The descriptions of the individual components of S-o-C 110 may be specified using NSDL. The description of an individual component may describe an internal scan path of the component. The system level description of S-o-C 110 may be specified using NSDL. The system level description of S-o-C 110 may describe a topology of S-o-C 110 (e.g., interconnections between components, inter-component dependencies, and the like).

The description information for S-o-C 110 (including descriptions of individual components, the system-level description, and the like) includes information adapted for use in generating test procedures for S-o-C 110. For example, the description information includes component scan path information, system topology information, and the like, which may be processed to determine scan path length information, scan path hierarchy information, and the like, as well as various combinations thereof. The description information for S-o-C 110 may include any other description information described herein.

The TS 120 tests S-o-C 110 by executing one or more test procedures on S-o-C 110. The TS 120 generates input bitstreams and expected test results (e.g., expected output bit values or output bitstreams) for each test to be performed. The TS 120 provides the input bitstreams (referred to as input test vectors) to TDI port $115_I$ and receives corresponding output bitstreams (referred to as output test vectors) from TDO port $115_O$. The TS 120 compares the actual output bitstreams to the expected output bitstreams in order to determine the results of the test. The TS 120 may store the test results.

The TS 120 may execute one or more test procedures to test S-o-C 110. The TS 120 may organize execution of multiple test procedures in a manner for minimizing a total test time (since different scheduling decisions will result in different testing completion times for the same set of test procedures). The TS 120 may specify a testing schedule (i.e., a schedule specifying an order according to which test procedures must be executed). The TS 120 may perform various other functions associated with testing of a system-on-chip.

Figure 2:
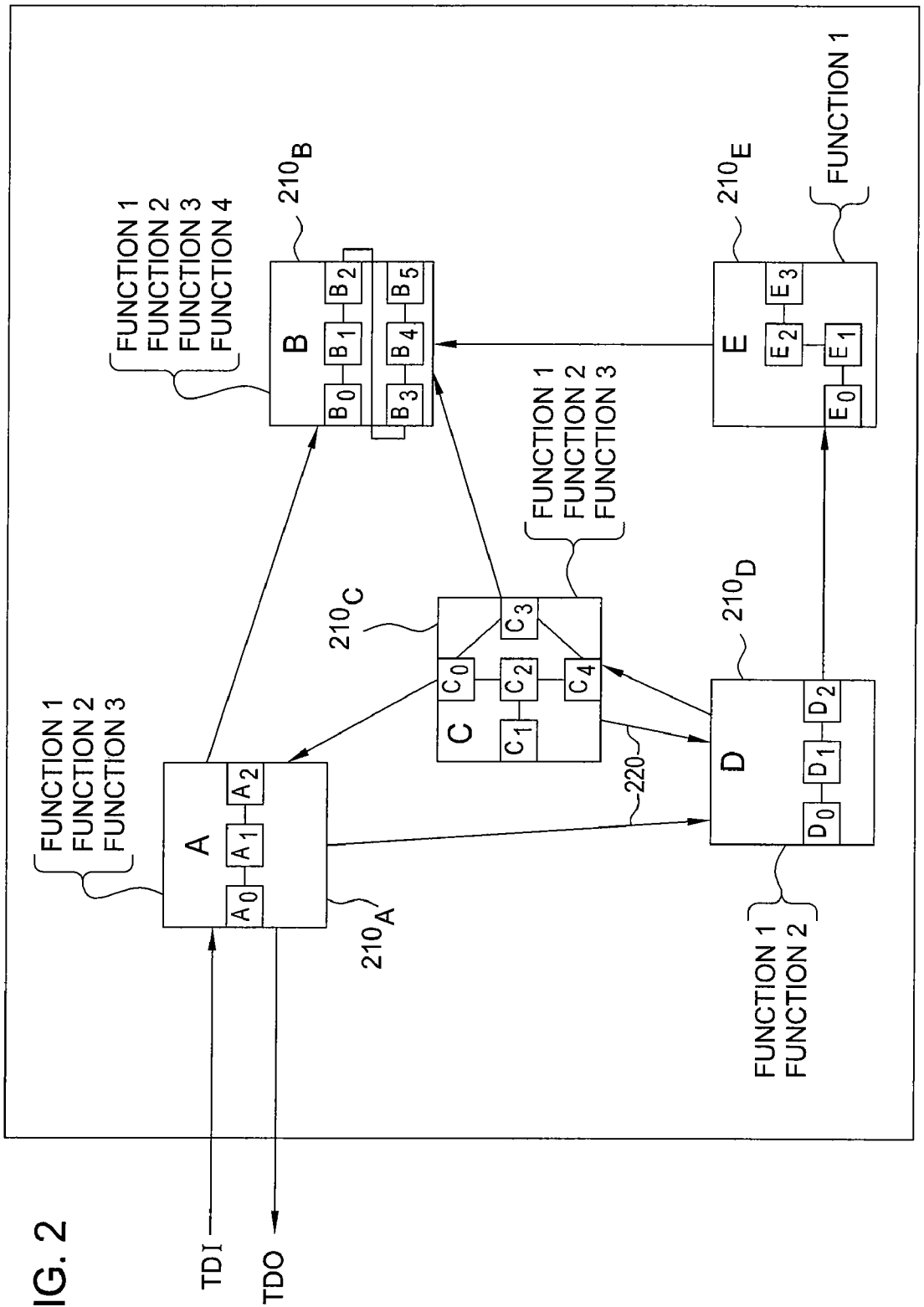
FIG. 2 depicts a high-level block diagram of the system-on-chip of the testing environment of FIG. 1.

FIG. 2 depicts a high-level block diagram of the system-on-chip of the testing environment of FIG. 1. As depicted in FIG. 2, S-o-C 110 includes a plurality of components $210_A$-$210_E$ (collectively, components 210) which are interconnected by a plurality of component interconnections 220 (collectively, component interconnections 220).

The components 210 may include any components which may be included in a system-on-chip system. The components 210 may be described using NSDL. The components 210 may also be referred to herein as test resources.

In one embodiment, in a system according to the P1687 standard, components 210 may include IPs, instruments, and/or select instrument bits (SIBs).

An intellectual property (IP) device is a normal device requiring testing.

An instrument is a device which, apart from requiring testing, offers functionality adapted for helping testing (e.g., reading values, monitoring values, providing useful information, and the like, as well as various combinations thereof). For example, an instrument may be an output of a temperature sensor to be used to parameterize lifetime-acceleration testing. For example, an instrument may be the reference value of a sensor used for calibrating a tunable filter for the acquisition stage of a software-defined radio. In other words, instruments may help testing both during initial system testing, as well as throughout the lifetime of the system.

In that IPs/instruments may be quite similar, the two terms may be used interchangeably herein. Further, since IPs and instruments may be used as components of a system-on-chip, IPs and instruments may be more generally referred to herein as components.

An IP/instrument may include a hierarchical scan path. A component having a hierarchical scan path includes an internal scan path which becomes part of the system scan path when the component is introduced into the system.

A SIB is a hierarchical scan path cell which enables portions of the scan path to be dynamically included in or removed from the scan path (depending on which device or devices will be used in testing). The SIB forms part of the Hardware Proposal of the current draft of the P1687 standard.

In general, hierarchy improves testing of components of a system-on-chip. For example, hierarchy enables minimization of the active system scan path and isolation of components during testing, thereby reducing access time to components of a system-on-chip).

In other embodiments, in systems according to other standards, components 210 may include other types of components.

In one embodiment, components 210 may include one or more crossroad devices. The use of crossroad devices in system-on-chip testing is enabled by use of the NSDL language (i.e., most such devices are not capable of being described by BSDL/HSDL). The use of crossroad devices in system-on-chip testing may be better understood with respect to FIG. 6-FIG. 10.

As depicted in FIG. 2, each of the components 210 includes a plurality of internal registers. Specifically, component $210_A$ includes three registers ($A_0$, $A_1$, $A_2$), component $210_B$ includes six registers ($B_0$, $B_1$, $B_2$, $B_3$, $B_4$, $B_5$), component $210_C$ includes five registers ($C_0$, $C_1$, $C_2$, $C_3$, $C_4$), component $210_D$ includes three registers ($D_0$, $D_1$, $D_2$), and component $210_E$ includes four registers ($E_0$, $E_1$, $E_2$, $E_3$). The registers of each component 210 form an internal scan path for that component 210. The internal scan path of each component 210 may be described using NSDL.

As depicted in FIG. 2, each of the components 210 supports at least one function. Specifically, component $210_A$ supports three functions, component $210_B$ supports four functions, component $210_C$ supports three functions, component $210_D$ supports two functions, and component $210_E$ supports one function. The functions supported by each of the components 210 make use of the registers (i.e., the internal scan paths) of each of the components 210, respectively. Thus, the functions supported by each of the components 210 may be described using NSDL.

As depicted in FIG. 2, components 210 of S-o-C 110 are connected via component interconnections 220 of S-o-C 110. The components 210 (i.e., internal scan paths of the components 210) and component interconnections 220 between components 210 form a system scan path (or paths) from the input test port (TDI) of S-o-C 110 to the output test port (TDO) of S-o-C 110. The system scan path may be defined using NSDL (e.g., by defining each of the individual components using NSDL and defining the composition of the system using NSDL, to form thereby an overall system description based on NSDL).

As described herein, the overall system description of S-o-C 110 based on NSDL is an algorithmic description (i.e., because each of the components 210, component interconnections 220, intra-component and inter-component dependencies, and the like is described in using a collection of interrelated algorithms). The algorithmic description of S-o-C 110 includes information adapted for use by TS 120 in testing the S-o-C 110 (e.g., scan path length information, scan path hierarchy information, and the like, as well as various combinations thereof).

A system-on-chip may be described by describing each of the components of the system-on-chip (e.g., descriptions of IPs, instruments, crossroad devices (where used), and the like, as well as various combinations thereof) and describing the topology of the system-on-chip (including descriptions of the interconnections between each of the components of the system-on-chip, intra-component and inter-component dependencies, and the like, as well as various combinations thereof).

In one embodiment, in a system according to the P1687 standard, where components may include IPs, instruments, and/or select instrument bits (SIBs), description of the system-on-chip requires a description of each IP/instrument (e.g., including the meaning of internal registers, sets of procedures/bitstreams to apply/observe, and the like), a description of each SIB (where SIBs are used), a description of the composition of the system scan path (i.e., how the scan path passes through the system-on-chip, including how the internal scan path of each component passes through the component, and the like), and the like, as well as various combinations thereof.

The insertion of an IP into a scan chain enables testing of the IP through the scan chain. The use of an IP within a system-on-chip varies according to access privilege level (APL) for the IP (e.g., no access, limited access, full access).

If the APL for an IP is "no access" the testing tool has no knowledge of the internals of the IP and, thus, must rely on information provided by the provider of the IP. For example, the set of bitstreams for the IP must be provided (i.e., the input bitstreams and the expected output bitstreams). In this case, the bitstreams are considered static bitstreams. The testing tool must insert the static input bitstreams for the IP into the system bitstream for the system-on-chip and process the corresponding output bitstreams as specified by the provider of the IP.

If the APL for an IP is "full access" the testing tool has full knowledge of the internals of the IP, including both the internal scan chain of the IP described in NSDL and the sources of the IP in a description language of choice. In this case, the testing tool can directly compute the required input bitstreams and expected output bitstreams for the IP (e.g., using its own algorithm), or the provider of the IP can provide a set of precomputed bitstreams (e.g., as static and/or dynamic bitstreams).

If the APL for an IP is "limited access" the testing tool has only limited knowledge of the internals of the IP. An NSDL description of the IP is provided. The NSDL description of the IP includes a description of the internal scan chain of the IP and a set of procedures which may be used to test the IP. In this case, the testing tool uses the description of the IP in order to generate bitstreams (e.g., input bitstreams and expected output bitstreams) for use in testing the IP.

The insertion of an instrument into a system-on-chip enables testing of the system-on-chip via inspection of some values or conditions. An instrument may support one or more functions which may be used for testing purposes. Thus, while the description of an IP includes only a set of procedures needed to test the IP, the description of an instrument also includes a set of procedures (and/or bitstreams) which may be used to access the functions of the instrument. The description of the instrument may include a description of functions of the instrument in terms of the register values of registers of which the instrument is composed. Thus, using NSDL, the only difference between IPs and instruments is the set of procedures.

As described herein with respect to IPs and instruments, descriptions of IPs and instruments may be specified using procedures. A procedure may be considered a concatenation of atomic instructions to be executed each time the procedure is called.

The descriptions of procedures for an IP/instrument may depend on the APL of the IP/instrument.

If the APL of a component is "no access", the procedures may be represented as bitstream values (i.e., values to be written into the scan path and values to be read from the scan path).

If the APL of a component is "limited access" or "full access", knowledge of the scan path of the IP/instrument provides additional freedom with respect to representation of the procedures for the IP/instrument, such that the procedures may be composed. A spatial composition of procedures indicates how the inputs/outputs of different procedures can be used to compose the inputs/outputs of the system scan path of the system-on-chip. A temporal composition indicates how procedures may be sequentially applied to the same component (e.g., IP/instrument) to perform specific operations. Additionally, procedures may be nested to and/or from greater procedures and/or from multiple lesser procedures.

A procedure includes procedure attributes (i.e., a description of the procedure) and a procedure body. The descriptions of procedures may include information such as length, busy mode indications, entry conditions, exit conditions, dependencies, internal scan path descriptions, and the like, as well as various combinations thereof.

A fixed-length procedure may be defined as a procedure that always takes the same amount of time to be executed. A variable-length procedure may be defined as a procedure that takes a variable amount of time to be executed. A variable-length procedure may be defined using other time values (e.g., best and worst case times, average times, and the like, as well as various combinations thereof). In one embodiment, at least one exit condition must be provided for each variable-length procedure.

The procedure length may be expressed in terms of cycles (or, where expression in terms of cycles is not possible, in some other absolute terms, such as seconds or some other measure of time). For example, it may not be possible to express procedure length in terms of cycles for instruments that take physical measurements, asynchronous instruments, instruments that are operating in non-synchronized clock domains, and the like. If the procedure length is expressed in time, the testing tool may determine the cycle count (e.g., with knowledge of the actual testing clock period) or estimate the cycle count (e.g., using a reference clock period).

The procedure busy mode should be declared by the procedure. The busy mode of a procedure is "hold" if, during execution of the procedure, the value of the scan chain must not vary (i.e., each scan access must reset it at the same value). For example, a "hold" instrument may be a combinatorial device (i.e., where each modification affects the result). The busy mode of a procedure is "don't care" if, during execution of the procedure, the value of the scan chain is not important. For example, a "don't care" instrument may be any device which samples inputs only when triggered.

The description of a system-on-chip also includes descriptions of dependencies associated with the system-on-chip.

The dependencies of a system-on-chip include intra-component dependencies (between functions or procedures of one component of the system-on-chip) and inter-component dependencies (between functions or procedures of different components of the system-on-chip). The descriptions of dependencies may be specified in many ways (e.g., by listing them, name-based linking, and the like, as well as various combinations thereof).

For example, a function X may be described through an indication that "function X depends on completion of functions $X_1, X_2, \ldots, X_n$", which means that function X cannot begin its execution until each of the listed sub-functions is complete. For example, a procedure X may be described through an indication that "procedure X depends on procedure Y" means that, for any number of reasons, procedure Y must be completed before procedure X is executed. The dependencies of a system-on-chip may be described in various other ways.

The intra-component and inter-component dependencies of a system-on-chip should be declared. The declaration of dependencies enables the testing tool to perform test scheduling. In one embodiment, a dependency may be declared as part of the declarative part of the procedure(s) of the dependency. In one embodiment, a dependency may be declared using explicit naming. In one such embodiment, generic parameters may be utilized to link external dependencies with the symbolic name(s) of the components with which the external dependencies are associated.

Using NSDL, description and declaration of dependencies may be performed in various other ways.

The construction of a procedure (or procedures) for a component (or group of components) changes based on the APL(s) of the component(s), which affects knowledge of input/output information associated with the component.

Figure 3:
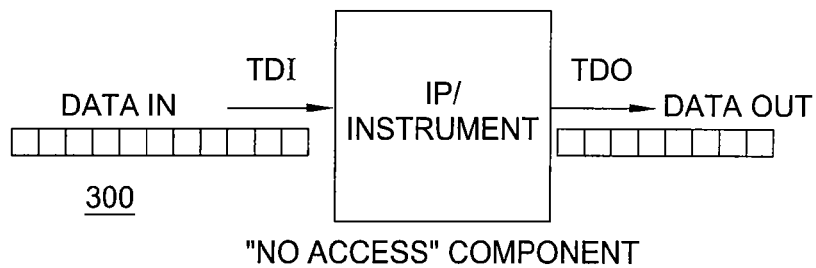
FIG. 3 depicts input-output knowledge of a "no access" component.

FIG. 3 depicts input-output knowledge of a "no access" component 300. If the APL of a component is "no access", for each function supported by the component, the body of the function will be composed of input bitstream information (to be used to compose the input bitstream), function length and scan path length information, and output bitstream information (e.g., the expected output bitstream, required output bitstream handling, and the like, as well as various combinations thereof).

Figure 4:
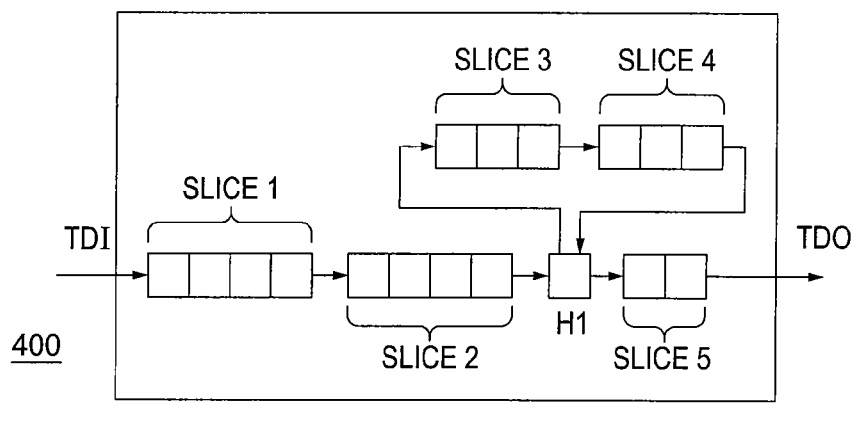
FIG. 4 depicts input-output knowledge of a "limited access" or "full access" component.

FIG. 4 depicts input-output knowledge of a "limited access" or "full access" component 400. If the APL of a component is "limited access" or "full access", the internal scan path of the component is known (i.e., each of the registers of the component, as well as the topology of the registers, is known). The internal scan path of the component can be partitioned into multiple slices, which may be distributed over one or more hierarchical levels. The access to different hierarchical levels may be controlled in any manner (e.g., using one or more registers of the adjacent level). The partitioning of an internal scan path of a component into multiple hierarchical levels may be better understood with respect to the component depicted and described with respect to FIG. 4.

As depicted in FIG. 4, the internal scan path is partitioned into five slices (denoted as slices 1, 2, 3, 4, 5). The five slices of the internal scan path are distributed over two hierarchical levels (denoted as levels 0, 1). The slices 1, 2, 3, 4, and 5 are composed of four, four, three, three, and two registers, respectively. The slices 1, 2, and 5 are located in level 0 of the hierarchy. The slices 3 and 4 are located in level 1 of the hierarchy. A register (denoted as register H1) controls access between level 0 and level 1 of the internal scan path hierarchy. The H1 register controls the internal scan path such that either slices 3 and 4 are bypassed (i.e., they are excluded from the internal scan path) or slices 3 and 4 are not bypassed (i.e., they are included in the internal scan path).

As depicted in FIG. 4, the internal scan path is composed as follows. The input of slice 1 is TDI and the output of slice 1 is the input of slice 2. The input of slice 2 is the output of slice 1 and the output of slice 2 is a first input to H1 (level 0 input). At level 0, the input of H1 is the output of slice 2 and the output of H1 is the input of slice 5. At level 1, the output of H1 is the input of slice 3 and the input of H1 is the output of slice 4. The input of slice 3 is an output of H1 (level 1 output) and the output of slice 3 is the input of slice 4. The input of slice 4 is the output of slice 3 and the output of slice 4 is an input of H1 (level 1 input). The input of slice 5 is an output of H1 (level 0 output) and the output of slide 5 is TDO.

In one embodiment, partitioning of an internal scan path of a component into multiple slices is functional, i.e., each slice of the internal scan path has one or more slice functions operating on it, each of which may be tested using one or more slice procedures, each of which is independently schedulable by the testing tool. In this embodiment, the body of a function operating on a given slice of the internal scan path may be composed in a manner similar to composition of the body of a function of a "no access" component (i.e., the body of the function is described using input bitstream information, function length and scan path length information, output bitstream information, and the like, as well as various combinations thereof).

Thus, utilizing different procedures operating with different slices or combinations of slices of the internal scan path, the partitioning of the internal scan path of a component may be used in a variety of ways. For example (referring to FIG. 4), a first procedure P1 associated with slice 1 could be executed to write data into slice 1, thereby triggering execution of some function in the component which results in storage or result data in slice 2 and error data in slice 5. Then, two additional procedures P2 and P5 (operating on slices 2 and 5, respectively) could be executed to read the values of slices 2 and 5, respectively. Thus, partitioning of the internal scan path into slices (including partitioning across multiple hierarchical levels) provides great flexibility in system-on-chip testing. The TS 120 can easily translate the algorithmic procedure into serial testing bitstreams (e.g., input bitstreams and expected output bitstreams).

Since different procedures may be developed for utilizing slices of an internal scan path of a component, procedures utilizing slices of an internal scan path must be able to reference slices (including the signals inside them). A procedure may reference a slice in any manner. In one embodiment, for example, a procedure may reference a slice using explicit naming. In one such embodiment, each slice (i.e., register or group of registers) is assigned a unique name, thereby enabling hierarchically instantiated slices to be accessed like records. An example of using explicit naming to identify slices of a component is depicted and described with respect to FIG. 5.

Figure 5:
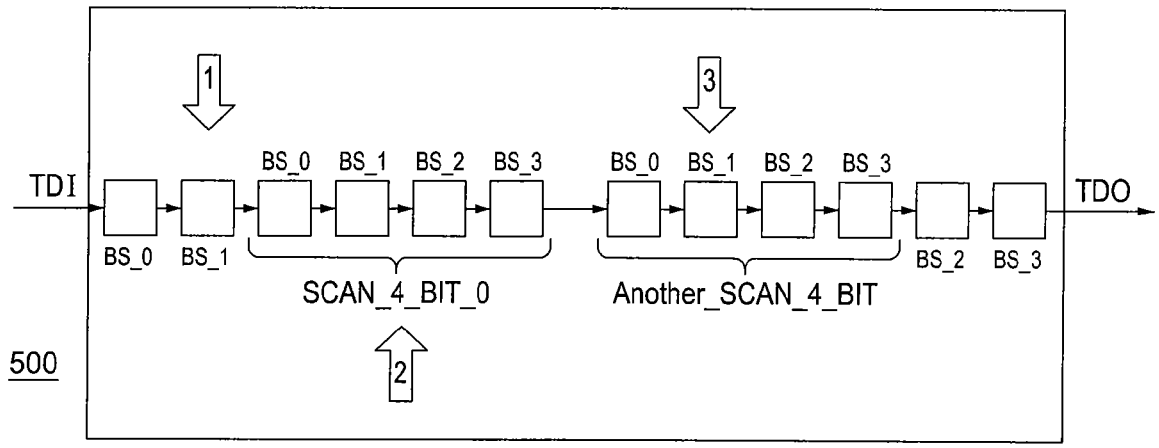
FIG. 5 depicts explicit referencing of slices of an internal scan path of a component.

FIG. 5 depicts explicit referencing of slices of an internal scan path of a component 500. As depicted in FIG. 5, the component 500 includes a 12-register scan path having six slices, each of which is referred to by a unique name. The first slice is a single register named BS_0. The second slice is a single register named BS_1. The third slice is a serial chain of four registers named SCAN_4_BIT_0, which includes four registers named BS_0, BS_1, BS_2, and BS_3. The fourth slice is a serial chain of four registers named Another_SCAN_4_BIT, which includes four registers named BS_0, BS_1, BS_2, and BS_3. The fifth slice is a single register named BS_2. The sixth slice is a single register named BS_3.

As described herein, hierarchically instantiated registers may be accessed like records. For example, the unique name of the register indicated by arrow 1 is BS_1 (even though two other registers are named BS_1, it will be seen how use of hierarchical naming ensures unique naming of registers). For example, the unique name of the slice (i.e., group of registers) indicated by arrow 2 is SCAN_4_BIT_0. For example, the unique name of the register indicated by arrow 3 is another_SCAN_4_BIT.BS_1. In other words, each slice of the internal scan path, as well as each register of each slice, for any number of hierarchical levels of slices and registers, is able to be referenced using a unique name.

Although primarily depicted and described herein with respect to specific procedure attributes which may be utilized to define a procedure or set of procedures for a component (e.g., procedure lengths, function and procedure dependencies, internal scan path descriptions, slice descriptions, slice reference attributes, and the like), various other procedure attributes may be specified. The procedure attributes used to describe a procedure may include any information which may be used to describe the procedure in a manner which supports system-on-chip testing.

In addition to procedure attributes, a procedure includes a procedure body. The procedure body includes the details of the procedure. The procedure body may be implemented in any manner. The procedure body does not have a concept of the scan path (rather, accesses are done in parallel on the slices and the testing tool merges these operations into accesses to the system scan path). The procedure body may use various statements, asserts, nested procedures, and the like, as well as various combinations thereof.

In one embodiment, in which a system-on-chip is described using NSDL implemented using the VHDL language (and, thus, each of the procedures associated with the system-on-chip is described using NSDL implemented using the VHDL language), the procedure body may be expressed using VHDL syntax. The procedure body of a procedure may be expressed in other ways, depending on the implementation of the description of the system-on-chip.

A description of an internal scan path of a component is easily provided by NSDL. In NSDL, each register cell is considered an entity, and register cells may be grouped into packages (e.g., using VHDL rules where NSDL is implemented as a superset of VHDL). In NSDL, each register entity is described using two generic parameters: "precedent" and "following", which may be used to express the scan path by explicitly referencing register instances. The "precedent" parameter of a register entity specifies the source of the input to that register entity. The "following" parameter of a register entity specifies the destination of the output from that register entity. Thus, a register entity may include a single register, a group of registers (including hierarchical groupings), and the like.

The description of an internal scan path of a component may be better understood with respect to the following sample code corresponding to the internal scan chain depicted and described with respect to FIG. 5.

The following sample code shows a simple scan path including four basic boundary scan registers arranged serially where the first boundary scan register receives input from the TDI port and the fourth boundary scan register provides output to the TDO port:

```
BS_0: BS generic map (precedent => "TDI", following => "BS_1");
BS_1: BS generic map (precedent => "BS_0", following => "BS_2");
BS_2: BS generic map (precedent => "BS_1", following => "BS_3");
BS_3: BS generic map (precedent => "BS_2", following => "TDO");
```

This four-register scan chain can be encapsulated into an entity and instantiated hierarchically. The following sample code shows exactly how this four-register scan chain can be encapsulated into an entity and instantiated hierarchically (for ultimate use in describing the SCAN_4_BIT_0 and another_SCAN_4_BIT register entities):

Entity SCAN_4_BIT is

```
Generic (precedent : string := "TDI"; following : string := "TDO");
End entity;
```

Architecture A of SCAN_4_BIT is

```
begin
   BS_0: BS generic map (precedent => precedent,
   following => "BS_1");
   BS_1: BS generic map (precedent => "BS_0", following => "BS_2");
   BS_2: BS generic map (precedent => "BS_1", following => "BS_3");
   BS_3: BS generic map (precedent => "BS_2",
   following => following);
end;
```

The following sample code shows the representation (description) of the 12-register scan path of FIG. 5 (where the 12-register scan path is represented using descriptions of six register entities, including four individual registers and two register entities composed of four-register scan chains, as depicted and described with respect to FIG. 5).

```
BS_0: BS generic map (precedent => "TDI", following => "BS_1");
BS_1: BS generic map (precedent => "BS_0", following => "SCAN_4_BIT_0");
   SCAN_4_BIT_0: BS generic map (precedent => "BS_1",
following => "another_SCAN_4_BIT");
   another_SCAN_4_BIT: BS generic map
   (precedent => "SCAN_4_BIT_0",
following => "BS_2");
   BS_2: BS generic map (precedent => "another_SCAN_4_BIT",
following => "BS_3");
   BS_3: BS generic map (precedent => "BS_2", following => "TDO");
```

Using this type of description, information about the scan path (e.g., its length, its hierarchical structure, and the like, as well as various combinations thereof) may be automatically computed by the testing tool at compilation time (e.g., using contextual checking). Further, descriptions of register entities are highly reusable (e.g., for use in other designs). Since description information for register entities can be gathered, stored, and checked in many different ways (i.e., because implementation of the symbol table may vary significantly between compilers, e.g., in terms of hash tables, databases, and the like), such details are omitted for purposes of clarity and generality.

Furthermore, using this type of description, since each component of the system-on-chip is easily described, an overall system description of the system-on-chip may be obtained by combining descriptions of individual components (including descriptions of interconnections between components, descriptions of inter-component dependencies, and the like, as well as various combinations thereof). In other works, NSDL provides significant flexibility in describing (and, therefore, testing) system-on-chip configurations.

As described herein, in addition to being able to describe typical components which form part of the scan path of a system-on-chip, NSDL is also able to describe a device that enables dynamic changes to the scan path of a system-on-chip. This type of device is called a "crossroad device" in NSDL terms. A generic representation of a crossroad device is depicted and described with respect to FIG. 6.

Figure 6:
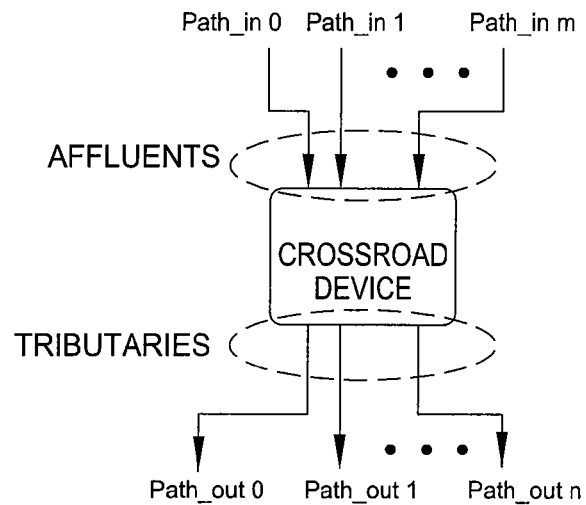
FIG. 6 depicts a high-level block diagram of a representation of a crossroad device.

FIG. 6 depicts a high-level block diagram of a representation of a crossroad device. Specifically, crossroad device representation 600 is representative of a crossroad device capable of dynamically modifying the scan path of a system-on-chip. A crossroad device routes one or more inputs (referred to as affluents) to one or more outputs (referred to as tributaries). As depicted in FIG. 6, crossroad device representation 600 includes a plurality of affluents (denoted as path_in_0 through path_in_m) and a plurality of tributaries (denoted as path_out_0 through path_out_n).

In order to utilize a crossroad device in testing a system-on-chip, the crossroad device must be described. The description of the dynamically variable scan path(s) of a crossroad device is quite difficult (if not impossible) to achieve using BSDL/HSDL, which are specifically designed to handle static scan paths. By contrast, description of the dynamically variable scan path(s) of a crossroad device is easily provided by NSDL, which provides an algorithmic description of the crossroad device that is easily understood by the testing tool.

The generic description of a crossroad device using NSDL follows:

```
IP <entity name> is
    Generic (
        precedent : string := "TDI";
        following : string := "TDO";
        affluent : string := "deselected";
        tributary : string := "deselected";
    );
End <entity name>;
```

As seen from the generic description of the crossroad device provided above, the generic parameters "affluent" and "tributary" can be used to access a hierarchical scan path. The generic parameters "affluent" and "tributary" are initially set to "deselected", such that the crossroad device merely operates as a pass-through component within the scan path (i.e., the affluent and tributary are not active and, thus, do not dynamically modify the scan path). The crossroad device may be activated to dynamically modify the scan path by using the "affluent" and "tributary" parameters to call relative selection functions.

If there is more than one affluent and/or more than one tributary, each of the affluents and/or tributaries must be uniquely identified. In one embodiment, for example, a simple ordered numbering may be used (e.g., affluent_0, affluent_1, and so on for the affluents; tributary_0, tributary_1, and so on for the tributaries). Using this NSDL-based description, the testing tool is able to understand the connections through the crossroad device merely by referencing the generic parameters.

A description of a crossroad device may be generated in any manner. In one embodiment, a description of a crossroad device is generated using a description of a set of input connections and a set of output connections interconnected via an architecture adapted for dynamically controlling access to a component (or components) of a system-on-chip. The description of the crossroad device may be stored for use in testing. A processor may receive or retrieve the description of the crossroad device (e.g., from memory, another system, or from any other source of such descriptions) for use in performing testing.

As described herein, the set of input connections includes a scan path input connection (connected to the scan path of the system-on-chip, in a direction from TDI) and at least one connection to the component (denoted as a component access input connection) and the set of output connections includes a scan path output connection (connected to the scan path of the system-on-chip, in direction toward TDO) and at least one connection to the component (denoted as a component access output connection).

In one embodiment, the set of input connections is specified using the "precedent" parameter (for the scan path input connection) and one or more "affluent" parameters (for the one or more component access input connections). In one embodiment, the set of output connections is specified using the "following" parameter (for the scan path output connection) and one or more "affluent" parameters (for the one or more component access output connections).

The crossroad device may dynamically modify the system scan path in any manner. The architecture may be any architecture for dynamically connecting ones of the set of input connections to ones of the set of output connections via the component where the crossroad device is selected to add the component to the system scan path. For example, the architecture may be a switch architecture, a bus architecture, a network architecture, and the like.

In one embodiment, the description of a crossroad device is an algorithmic description including at least one compositional rule adapted for being understood by a testing a tool. The description of the crossroad device may be dynamically modified to dynamically add the component to the scan path and dynamically remove the component from the scan path (e.g., by modifying "affluent" and "tributary" parameters).

Using NSDL to describe testing resources in system-on-chip testing enables many different crossroad devices to be described in a manner enabling the crossroad device to be used in system-on-chip testing. The different crossroad devices which may be described by NSDL may be grouped into three broad categories. Specifically, a crossroad device may represent a "wired" connection, a "transactional" connection, or a "wired-transactional" connection.

A "wired" crossroad device is a crossroad device that is basically wired into the scan path of the system-on-chip (and may be selected or deselected as needed). A "wired" crossroad device operates in a manner similar to a switch (i.e., a connection can be dynamically programmed between an affluent and a tributary, as needed). A scan path of a "wired" crossroad device needs to be explicitly deselected because the scan path of the "wired" crossroad device is wired into the system scan path of the system-on-chip. A first example of a "wired" crossroad device (specifically, a Select Instrument Bit (SIB) component, which is part of the P1687 hardware proposal) is depicted and described in FIG. 8. A second example of a "wired" crossroad device is depicted and described in FIG. 9.

A "transactional" crossroad device is a crossroad device that supports temporary connections (i.e., connections representing specific transactions). A "transactional" crossroad device may operate as any architecture (e.g., as a bus, a network-on-chip, and the like). The transactions may be any transactions which may be supported by the architecture of the "transactional" crossroad device (e.g., bus access in bus architectures, routing in network architectures, and the like). A scan path of a "transactional" crossroad device does not need to be explicitly deselected because the scan path of the "transactional" crossroad device is active only for the time of the transaction. An example of a "transactional" crossroad device is depicted and described in FIG. 10.

In a "wired" crossroad device, the at least one component access input connection and the at least one component access input connection are wired connections. Thus, the component access input connection(s) and the component access output connection(s) are different physical connections. In a "transactional" crossroad device the at least one component access input connection and the at least one component access input connection are transactional connections, such that one physical connection may be used to support multiple transactions (i.e., the component access input connection(s) and the component access output connection(s) may share the same physical connections, but may be considered different transactional connections).

Using BSDL/HSDL, while it is possible to describe a specific "wired" crossroad device (namely, the SIB component), this description is quite difficult. Furthermore, description of more complicated "wired" crossroad devices using BSDL/HSDL may not be possible. Moreover, description of "transactional" and "wired-transactional" crossroad devices using BSDL/HSDL is most likely not possible. Thus, for this reason, the only crossroad device which is being standardized in P1687 is the SIB component.

By contrast, using NSDL, description of any "wired" crossroad device, "transactional" crossroad device, and "wired-transactional" crossroad device is clearly supported, and is easily interpreted by a testing tool. Indeed, virtually any crossroad device, of any complexity, capable of dynamically modifying a scan path of a system-on-chip may be described using NSDL. In order to illustrate the power of NSDL, a few examples of crossroads devices (and their respective descriptions expressed using NSDL) are provided herein with respect to FIG. 7-FIG. 10.

Figure 7:
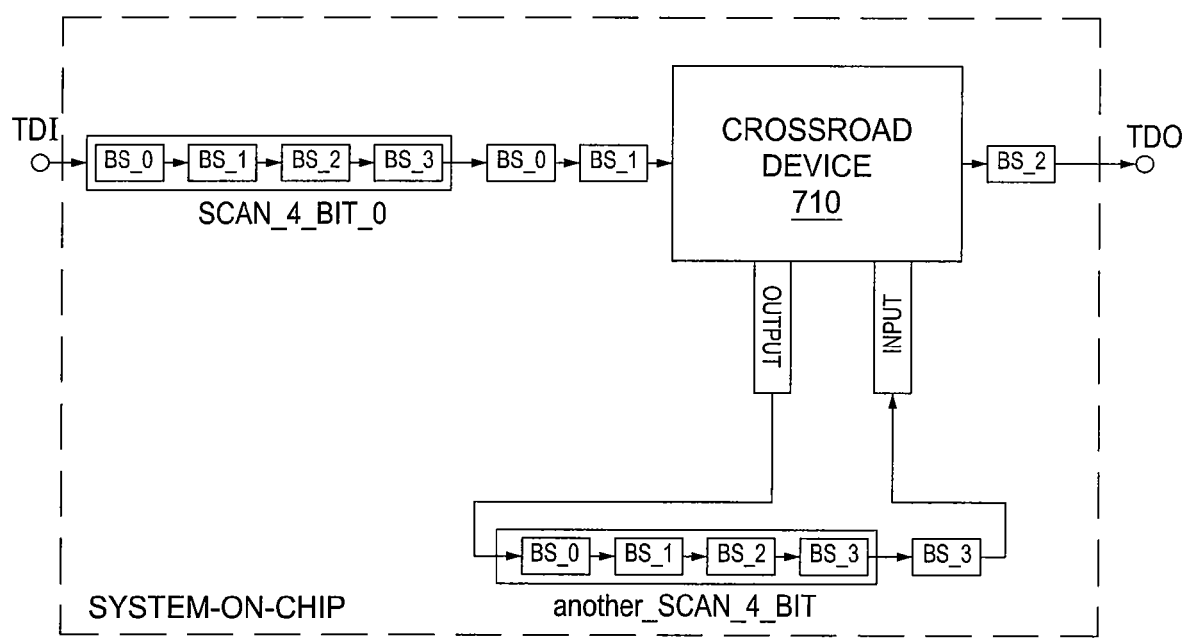
FIG. 7 depicts a high-level block diagram of use of a generic crossroad device to dynamically modify the scan path of a system-on-chip.

FIG. 7 depicts a high-level block diagram of use of a generic crossroad device to dynamically modify the scan path of a system-on-chip. As depicted in FIG. 7, system-on-chip 700 includes a scan path which includes a generic crossroad device 710. The scan path includes two permanent scan path portions (i.e., portions that are always included in the scan path) and an optional scan path portion (i.e., a portion which may be dynamically included in and removed from the scan path by way of crossroad device 710).

As depicted in FIG. 7, in the scan path of system-on-chip 700, the test access input (TDI) is coupled to the first permanent scan path portion (which includes a series of boundary scan cells), the first permanent scan path portion is coupled to a first input (i.e., the precedent) of crossroad device 710, a first output (i.e., the following) of crossroad device 710 is coupled to the second permanent scan path portion, and the second permanent scan path portion is coupled to the test access output (TDO).

The crossroad device 710 allows dynamic (selective) incorporation of the optional scan path portion to the scan path of system-on-chip 700. Specifically, crossroad device 710 includes a second output (i.e., tributary) which may be selected to couple the output of the first permanent scan path portion to an input to the optional scan path portion and includes a second input (i.e., an affluent) which may be selected to couple an output of the optional scan path portion to the input of the second permanent scan path portion.

The crossroad device 710 enables the scan path to be dynamically modified by selecting/deselecting specific combinations of inputs/outputs. When the second output and second input of crossroad device 710 are deselected, the scan path is: TDI, SCAN_4_BIT_0, BS_0, BS_1, crossroad device 710, BS_2, TDO. When the second output and second input of crossroad device 710 are selected (i.e., the first input is connected to the second output and the second input is connected to the first output), the scan path is: TDI, SCAN_4_BIT_0, BS_0, BS_1, crossroad device 710, another_SCAN_4_BIT, BS_3, crossroad device 710, BS_2, TDO.

Figure 8:
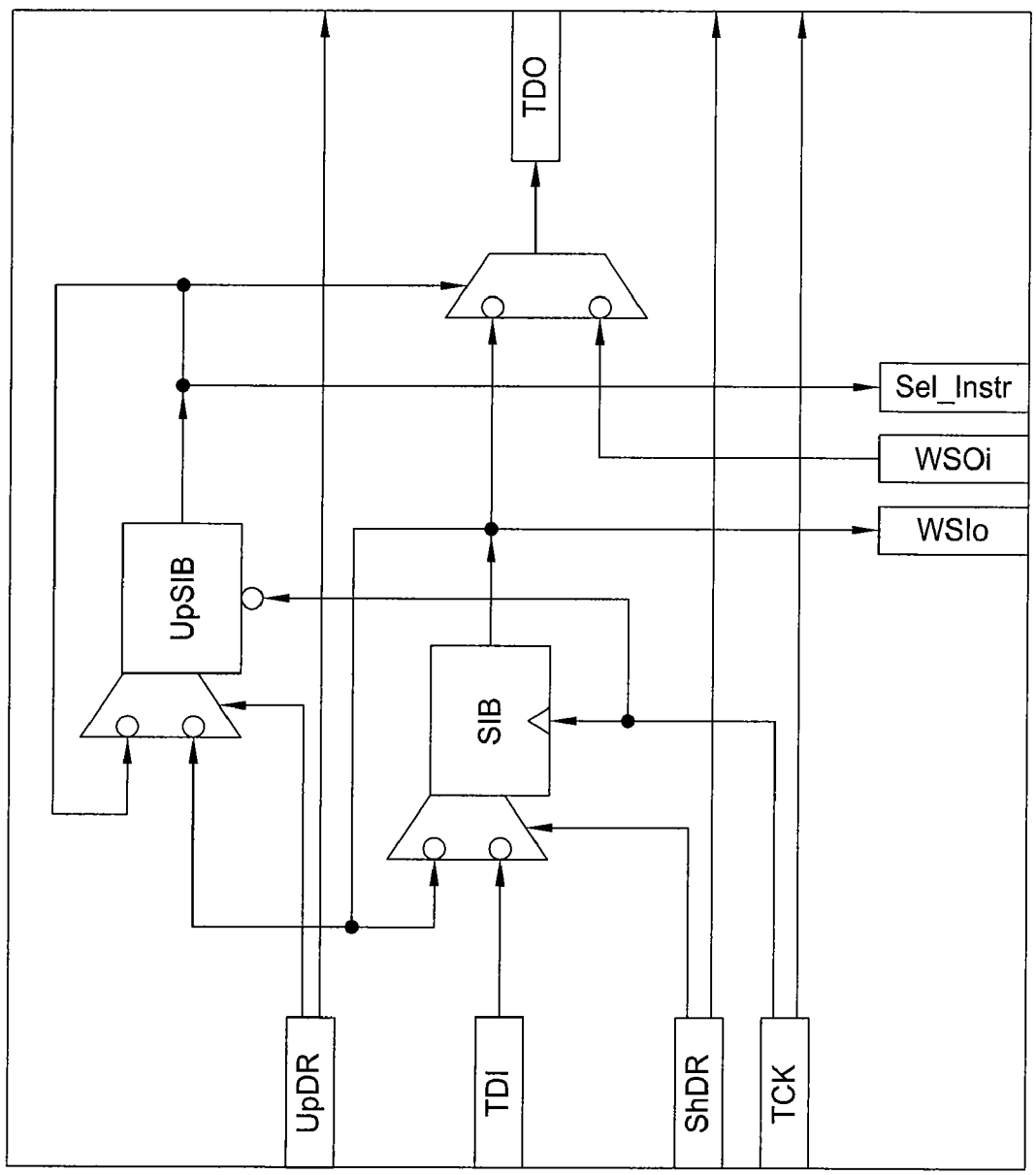
FIG. 8 depicts a high-level block diagram of one crossroad device which may be described using NSDL.

FIG. 8 depicts a high-level block diagram of one crossroad device which may be described using NSDL. Specifically, FIG. 8 depicts a SIB device 800. The SIB device 800 enables selection of another component (i.e., such that the component is added to the scan path).

The SIB device is controlled by a selection bit. When the value of the selection bit is "0", the cell is not active (it is just a bit inside the scan path). When the value of the selection bit is set to "1", the scan path is routed out through the port WSIo (i.e., the tributary) and is routed in through the port WSOi (i.e., the affluent), thereby adding to the scan path any device to which those ports are connected.

An NSDL-based description of SIB device 800 follows (with line numbers included for purposes of clarity):

```
 1  IP SIB generic (precedent : string := "TDI";
 2             following : string := "TDO";
 3             tributary : string := "deselected";
 4             affluent : string:= "deselected")
 5  Begin
 6  UpSIB : REG generic map (precedent =>"TDI",
 7             following=>"TDO"
 8             elements => 1);
 9
10  Procedure select
11  Length 1;
12  Selection wired;
13  {
14    UpSib <= '1';
15    tributary := "TDI ";
16    affluent := "TDO";
17  }
18
19  Procedure deselect
20  Length 1;
21  Selection wired;
22  {
23    UpSib <= '0';
24    tributary := "deselected";
25    affluent := "deselected";
26  }
27
28  End SIB;
```

In the description of SIB device 800: lines 6-9 declare the internal registers (i.e., the bits that the testing tool needs in order to handle the hierarchy, which is just one bit in the case of SIB device 800); and lines 10-17 show the selection procedure and lines 19-26 show the deselection procedure (easily identified by the testing tool using their respective names).

In the body of the description, it is easy to identify the two roles of NSDL: (1) the modification of the scan path and, thus, the bitstream is expressed by slice handling (see lines 14 and 23); and (2) the modification of the topology is done by assigning the values of the strings (e.g., in a manner similar to the "precedent" and "following" assignment in topology mapping).

Figure 9:
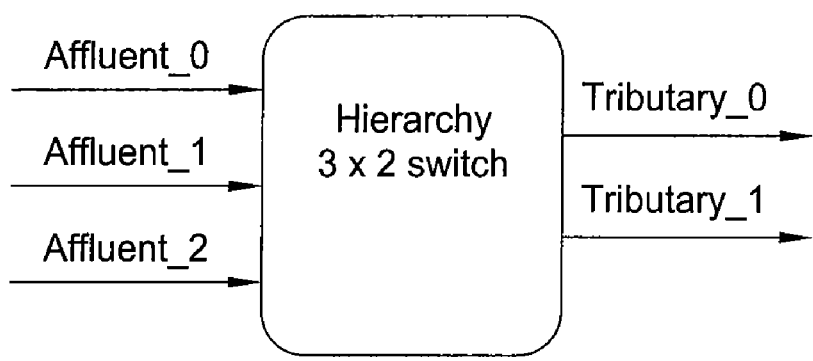
FIG. 9 depicts a high-level block diagram of one crossroad device which may be described using NSDL.

FIG. 9 depicts a high-level block diagram of one crossroad device which may be described using NSDL. Specifically, FIG. 9 depicts a hierarchy switch device 900. The hierarchy switch device 900 includes three input affluents and two output tributaries. Although depicted as having three affluents and two tributaries, any number of affluents and tributaries may be supported.

An NSDL-based description of hierarchy switch device 900 follows (with line numbers included for purposes of clarity):

```
1  IP Hierarchy_switch generic (precedent : string := "TDI";
2                               following : string := "TDO";
3                               tributary_0 : string :="deselected";
4                               tributary_1 : string :="deselected";
5                               affluent_0 : string:="deselected";
6                               affluent_1 : string:="deselected";
7                               affluent_2 : string:="deselected";
8                              )
9
10 Begin
11
12 Affl_map : Vector_REG generic map (precedent =>"TDI",
13                                   following=>"Trib_map"
14                                   elem_size => 2;
15                                   elements => 3);
16 Trib_map : Vector_REG generic map (precedent =>"Affl_map",
17                                   following=>"TDO"
18                                   elem_size => 2;
19                                   elements => 2);
20
21 subtype name is string (1 to 11);
22 type name_vector is array (natural range <>) of name;
23 constant affluent_name : name_vector (0 to 2) :=
24              ("affluent_0 ","affluent_1 ","affluent_2 ");
25 constant tributary_name : name_vector (0 to 1) :=
26              ("tributary_0","tributary_1");
27
28
29 Procedure select(affluent_nmb : in std_logic_vector(1 downto 0);
30           tributary_nmb : in std_logic)
31 Length 1;
32 Selection wired;
33 {
34   Trib_map <= affluent_nmb;
35   Affl_map <= "0"&tributary_nmb;
36
37 case (tributary_nmb)
38   when '0' => tributary_0 :=
39            affluent_name(conv_integer(affluent_nmb));
40   when '1' => tributary_1 :=
41            affluent_name(conv_integer(affluent_nmb));
42 end case;
43
44 case (affluent_nmb)
45   when "00" => affluent_0 :=
46            tributary_name(conv_integer(tributary_nmb));
47   when "01" => affluent_1 :=
48            tributary_name(conv_integer(tributary_nmb));
49   when "10" => affluent_2 :=
50            tributary_name(conv_integer(tributary_nmb));
51 when others => assert false report "ERROR!" severity failure;
52 end case;
53 }
54
55 Procedure deselect_affluent
56         (affluent_nmb : in std_logic_vector(1 downto 0))
57 Length 1;
58 Selection wired;
59 {
60   Affl_map <= "11";
61 case (affluent_nmb)
62   when "00" => affluent_0 := "deselected";
63   when "01" => affluent_1 := "deselected";
64   when "10" => affluent_2 := "deselected";
65   when others => assert false report "ERROR!" severity warning;
66   end case
67
68 }
69
70 Procedure deselect_tributary (tributary_nmb : in std_logic)
71 Length 1;
72 Selection wired;
73 {
74   Trib_map <= "11";
75 case (tributary_nmb)
76   when '0' => tributary_0 := "deselected";
77   when '1' => tributary_1 := "deselected";
78 end case;
79 }
80 End hierarchy_switch;
```

In the description of hierarchy switch device 900: lines 3-7 declare the affluents and tributaries (where each is given a unique name); lines 12-19 declare the internal scan path (i.e., similar to a switching matrix); lines 21-26 take full advantage of VHDL capabilities by defining some custom types (thereby preparing what essentially amounts to a switching matrix for the hierarchical descriptors).

In the description of hierarchy switch device 900: the "select" procedures (lines 29-53) take care of bitstream modifications and, further, takes advantage of VHDL algorithmic capabilities (and the previously defined custom types) in order to describe the dynamic scan path modifications. The parameters of the function refer to the ordinal numbers of the paths to be connected.

As seen from the description of hierarchy switch device 900, rendering a connection through hierarchy switch device 900 inactive does not require deselection of both ends of the connection; rather, deselection of only one end of the connection severs the connection. Thus, deselection may be handled by two procedures: (1) "deselect_affluent" enables deselection of affluents (using the ordinal number as parameter) and (2) "deselect_tributary" enables deselection of tributaries (using the ordinal number as parameter).

Figure 10:
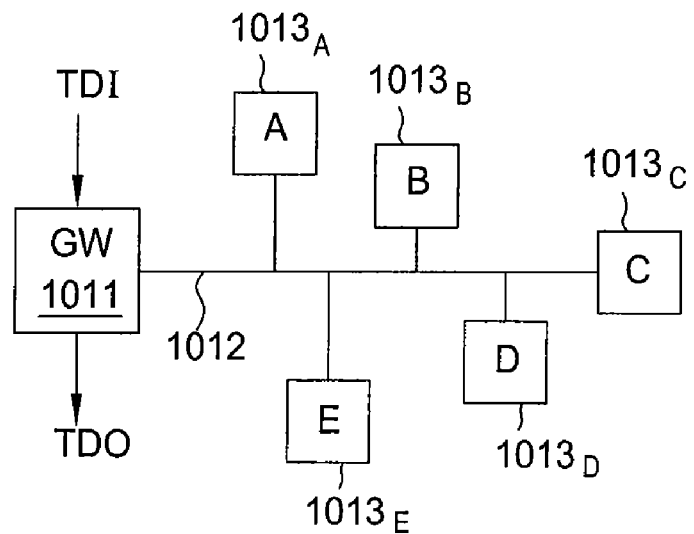
FIG. 10 depicts a high-level block diagram of one crossroad device which may be described using NSDL.

FIG. 10 depicts a high-level block diagram of one crossroad device which may be described using NSDL. Specifically, FIG. 10 depicts a bus architecture device 1000. The bus architecture device 1000 includes a master gateway component 1011 and five slave components $1013_A$-$1013_E$ (collectively, slave components 1013) interconnected via a component bus 1012.

In bus architecture device 1000, each of the slave components 1012 is assigned an address used by gateway component 1011 to access slave components 1012. A certain protocol must be supported by bus architecture device 1000 in order to enable gateway component 1011 to access slave components 1012; however, the NSDL-based description of bus architecture device 1000 does not require any information about the protocol.

An NSDL-based description of bus architecture device 1000 follows (with line numbers included for purposes of clarity):

Gateway Package Description:

```
1  Package GW_package is
2
3  Constant N_SLAVES : integer := 5;
4  Constant ADDRESS_DEPTH : integer := 3;
5  subtype slave_name_type is string (1 to 1);
6   subtype slave_address_type is std_logic_vector
7             (ADDRESS_DEPTH-1 downto 0);
8
```

-continued

```
 9 Type slave_mapping_type is record
10      slave_name : slave_name_type;
11      slave_address : slave_address_typr;
12 end record;
13
14 Type network_mapping_type is array (1 to N_SLAVES) of
15                 slave_mapping_type;
16
17 Constant BUS_OP_FIELDS : integer := 2;
18
19 Constant BUS_READ : std_logic_vector(BUS_OP_FIELDS-1
     downto 0) := "01";
20 Constant BUS_WRITE: std_logic_vector(BUS_OP_FIELDS-1
     downto 0) := "10";
21 Constant BUS_IDLE : std_logic_vector(BUS_OP_FIELDS-1
     downto 0) := "00";
22
23 End GW_package;
```

Gateway Description:

```
 1 Use GW_package.all;
 2
 3 IP GW generic (precedent : string := "TDI";
 4 following : string := "TDO";
 5          tributary : string := "deselected";
 6          affluent : string := "deselected";
 7          network_mapping : network_mapping_type);
 8
 9
10 Begin
11
12 Address_map : REG generic map (precedent =>"TDI",
13                 following=>"TDO"
14                 elements => ADDRESS_DEPTH);
15 Bus_operation : REG generic map (
16                 precedent => "Address_map";
17                 following => "TDO";
18                 elements => BUS_OP_FIELDS);
19
20 Function get_slave_address(name : in slave_name_type)
21          return slave_address_type is
22 Begin
23 for k in N_SLAVES loop
24   If network_mapping(k).slave_name = name then
25     return network_mapping(k).slave_address;
26   End loop;
27   assert false report "ERROR, slave "&name&" does not exist"
28                 severity failure;
29 end get_slave_address;
30
31 Procedure select_tributary(tributary_name :in slave_name_type)
32 Length 10;
33 Selection transaction;
34 {
35   address_map <= get_slave_address(tributary_name);
36   bus_operation <= BUS_WRITE;
37   tributary := tributary_name;
38 }
39
40 Procedure select_affluent(affluent_name : in slave_name_type)
41 Length 10;
42 Selection transaction;
43 {
44   address_map <= get_slave_address(affluent_name);
45   bus_operation <= BUS_READ;
46   affluent := affluent_name;
47 }
48
49 End GW;
```

The NSDL-based description of bus architecture device 1000 has been split into two files for better readability. Specifically, the NSDL-based description of bus architecture device 1000 is split into the following portions: (1) a package that hosts all of the type declarations for bus architecture device 1000; and (2) a description of the bus architecture device 1000.

The NSDL-based description of bus architecture device 1000 does not need information about the actual implementation of the bus protocol of bus architecture device 1000; rather, NSDL-based description only needs information about commands required to initiate transactions within bus architecture device 1000. The transactions are defined by the "select_tributary" and "select_affluent" functions included in NSDL-based description.

The "select_tributary" function (lines 31-38) writes the good address to the good register (exploiting custom types and functions) in order to command a "write" operation to the bus. The "select_affluent" function (lines 40-47) reads the good address from the good register (exploiting custom types and functions) in order to command a "read" operation from the bus.

Since bus architecture device 1000 is a "transactional" crossroad device, NSDL-based description of bus architecture device 1000 does not require "select" or "deselect" procedures; rather, the "select" and "deselect" procedures are marked as "transactions" so that the testing tool knows that the connection will only be active once, and then the affluent and tributary will be set back to "deselected".

As described herein, crossroad devices such as bus architecture device 1000 (and other crossroad devices) are completely outside of the current capabilities of the P1687 standard. The description of crossroad devices such as bus architecture device 1000 (and other crossroad devices) is only made possibly by use of NSDL.

As described herein, a system-on-chip can be described using NSDL and, further, the system-level description of the system-on-chip may be utilized by a testing tool for testing the system-on-chip. An exemplary testing tool adapted for testing a system-on-chip described using NSDL is depicted and described with respect to FIG. 11. Furthermore, testing of a system-on-chip described using NSDL may be better understood with respect to FIG. 12-FIG. 20.

Figure 11:
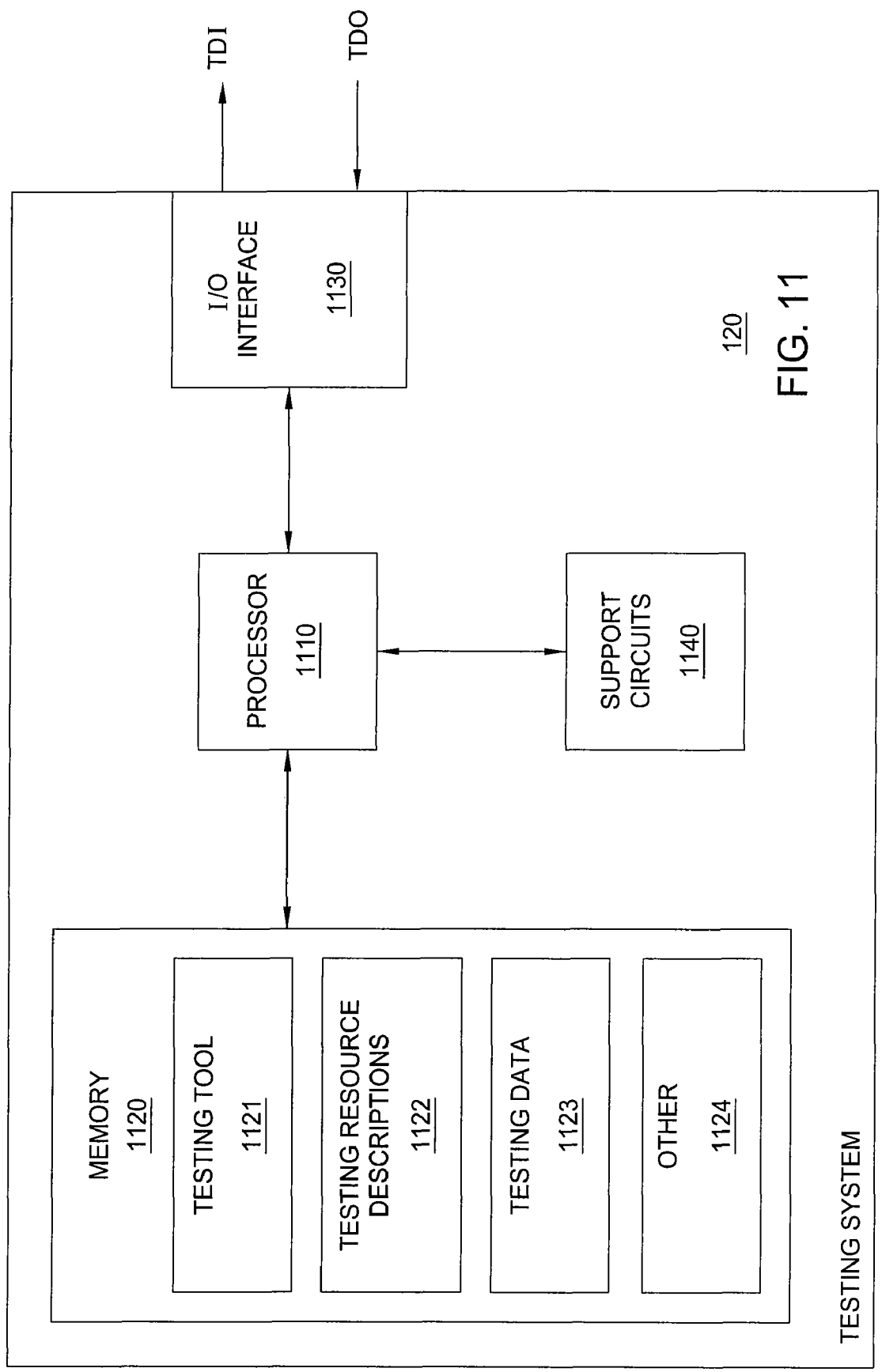
FIG. 11 depicts a high-level block diagram of the testing system of the testing environment of FIG. 1.

FIG. 11 depicts a high-level block diagram of the testing system of the testing environment of FIG. 1. Specifically, TS 120 includes a processor 1110, a memory 1120, an input-output (I/O) interface 1130, and support circuits 1140. The processor 1110 is coupled to each of the memory 1120, I/O interface 1130, and support circuits 1140. The processor 1110 cooperates with memory 1120, I/O interface 1130, and support circuits 1140 to provide various testing functions depicted and described herein.

As depicted in FIG. 11, memory 1120 stores resources adapted for use in performing system testing. Specifically, memory 1120 stores a testing tool 1121, testing resource descriptions 1122, and testing data 1123 adapted for use in performing system testing. The memory 1120 may store any other programs, descriptions, data, and the like which may be used to perform system testing (denoted as other 1124).

The testing tool 1121 controls system testing. The testing tool 1121 may include one or more testing procedures. The testing procedures may be generated by one or more testing compilers. The testing procedures may be executed in order to test one or more systems. The testing tool 1121 includes any other procedures, programs, and the like which may be used to control system testing.

The testing resource descriptions 1122 may include any descriptions adapted for use in system testing, such as component descriptions, system descriptions, and the like, as well as various combinations thereof. The testing resource descriptions 1122 may include descriptions of system topology. The testing resource descriptions 1122 may include any other descriptions which may be processed for use in performing system-on-chip testing.

The testing resource descriptions 1122 may include one or more libraries such that description templates may be maintained for different types of testing resources (and, thus, may be accessed and modified as needed). The templates may be component-level templates (e.g., a template for a certain IP, a template for a certain instrument, and the like), system topology templates, and the like, as well as various combinations thereof.

The testing data 1123 includes any data adapted for use in performing system testing. The testing data 1123 may include input bitstream data, output bitstream data (e.g., expected output bitstreams determined by the testing system and actual output bitstreams captured from the system-on-chip), and the like, as well as various combinations thereof. The testing data 1123 may include any other data which may be applied to a system being tested and/or recovered from a system being tested.

The I/O interface 1130 provides an interface from TS 120 to S-o-C 110. The I/O interface 1130 is a JTAG-based interface. The I/O interface 1130 supports a TDI interface by which TS 120 may apply input bitstreams to S-o-C 110 in response to execution of a testing procedure by processor 1110. The I/O interface 1130 supports a TDO interface by which TS 120 may recover actual output bitstreams from S-o-C 110 response to execution of a testing procedure by processor 1110.

Although primarily depicted and described herein with respect to one TDI interface and one TDO interface, I/O interface 1130 may support any number and type(s) of testing interfaces required or desired for testing different system-on-chip configurations. For example, for JTAG-based testing, I/O interface 1130 may also support interfaces for TCK signals, TMS signals, and, optionally, TRST signals.

The support circuits 1140 include any additional circuitry which may be used in performing system testing. For example, support circuits 1140 may include additional processors, additional memory, additional interfaces, testing bitstream generation circuits, testing bitstream processing circuits, and the like, as well as various combinations thereof. The support circuits 1140 include any additional circuitry which may be required by testing system 120.

The processor 1140 cooperates with memory 1120, I/O interface 1130, and support circuits 1140 to provide various system-on-chip testing functions described herein.

The processor 1140 generates descriptions (e.g., function-level descriptions, component descriptions, and the like). The processor 1140 processes descriptions from testing resource descriptions 1122 in order to generate descriptions (e.g., using component descriptions to analyze component interconnections, to generate system descriptions, and the like). The processor 1140 stores the descriptions as part of testing resource descriptions 1122.

The processor 1140 generates testing procedures for testing a system-on-chip and stores the testing procedures as part of testing tool 1121. The processor 1140 generates testing data using testing procedures from testing tool 1121 and stores the testing data as part of testing data 1123.

The processor may cooperate with memory 1120, I/O interface 1130, and support circuits 1140 to provide any other system-on-chip testing functions described herein.

Figure 12:
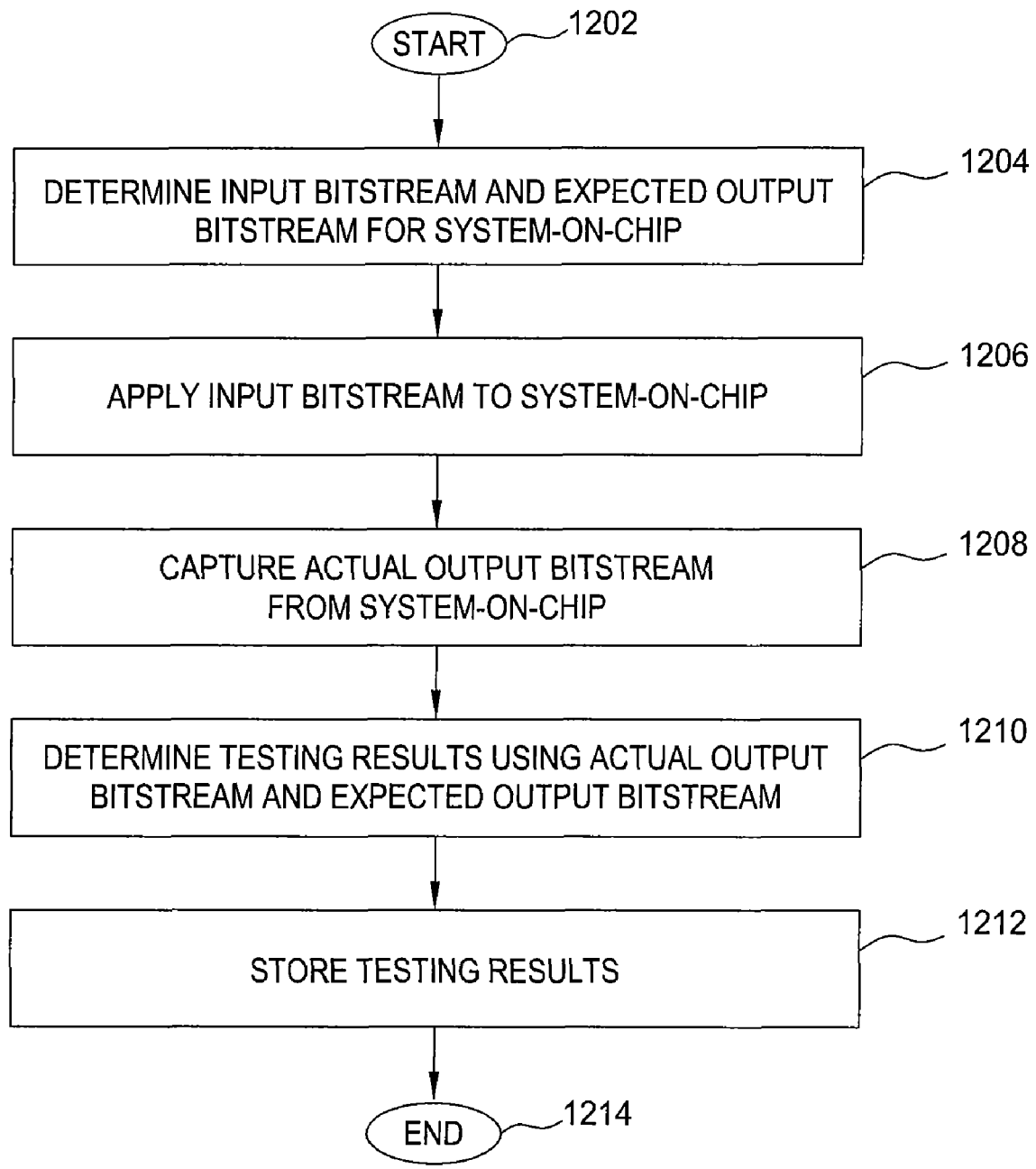
FIG. 12 depicts an exemplary method executed by the testing system of FIG. 1 for testing a system through a JTAG connection.
Figure 13:
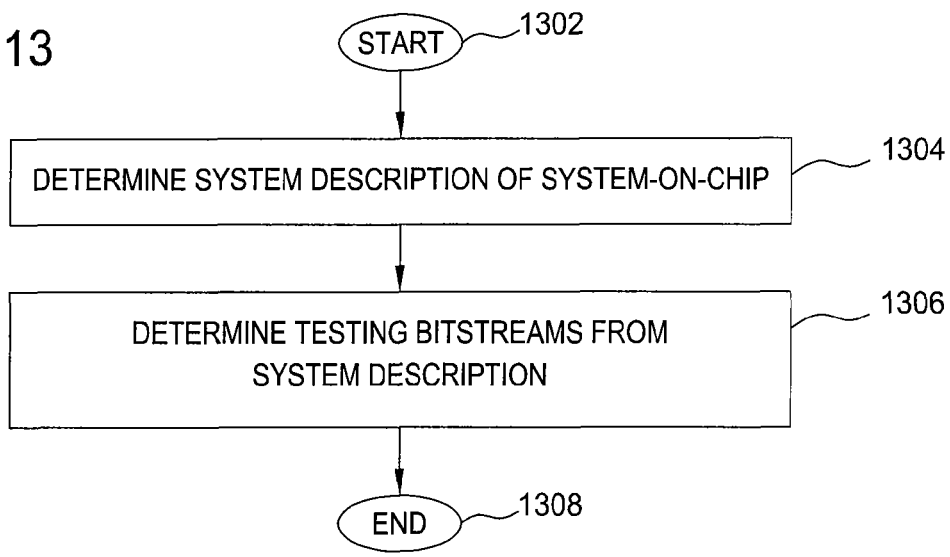
FIG. 13 depicts an exemplary method executed by the testing system of FIG. 1 for testing a system through a JTAG connection.
Figure 14:
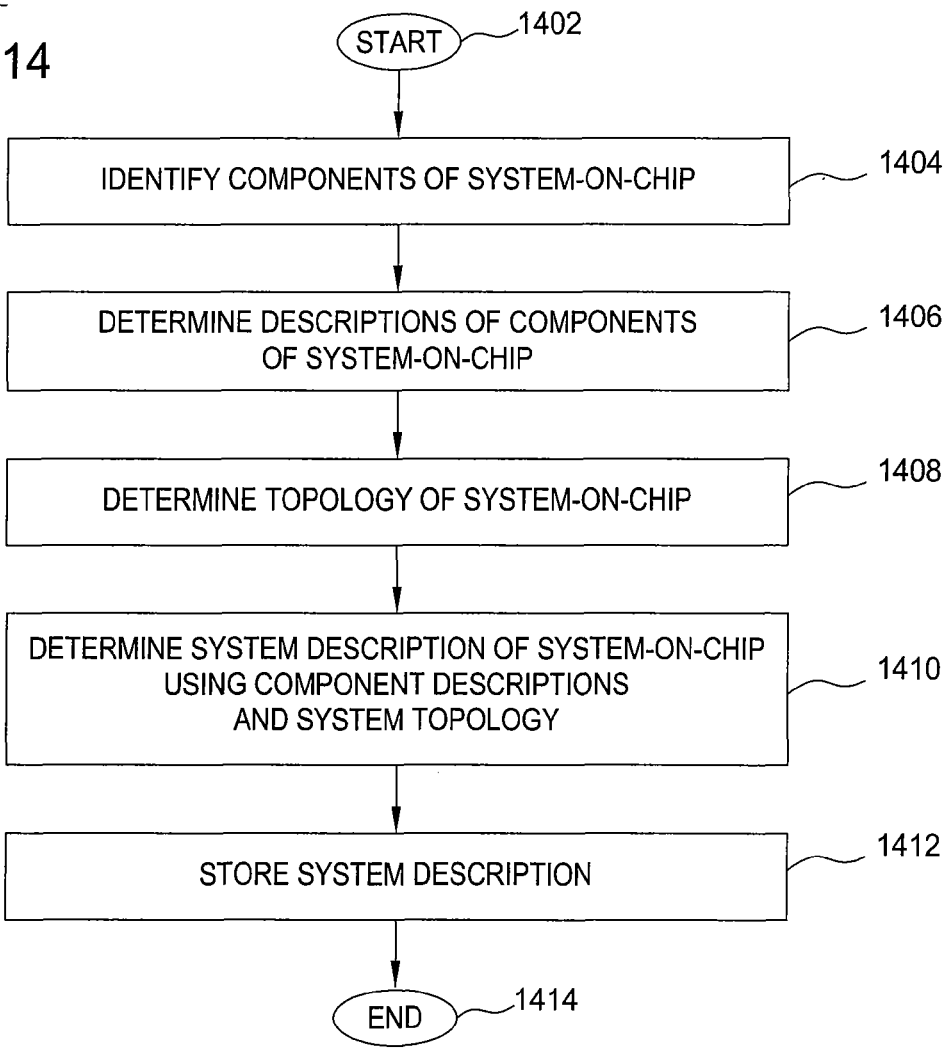
FIG. 14 depicts an exemplary method executed by the testing system of FIG. 1 for testing a system through a JTAG connection.

The testing of a system-on-chip using an NSDL-based description of the system-on-chip may be better understood with respect to FIG. 12-14, which provide methods for testing a system-on-chip using an NSDL-based description of the system-on-chip. The testing of a system-on-chip using an NSDL-based description of the system-on-chip may be further understood with respect to FIG. 15 and FIG. 16 (which provide an example depicting testing of one component of a system-on-chip), FIG. 17 (which provides a method for testing a component of a system-on-chip), and FIG. 18-FIG. 20 (which provide an example depicting testing of a system-on-chip).

FIG. 12 depicts an exemplary method executed by the testing system of FIG. 1 for testing a system through a JTAG connection. Although depicted and described as being performed serially, at least a portion of the steps of method 1200 of FIG. 12 may be performed contemporaneously, or in a different order than depicted and described with respect to FIG. 12. The method 1200 begins at step 1202 and proceeds to step 1204.

At step 1204, testing bitstreams are determined for the system-on-chip. The testing bitstreams include an input bitstream and an expected output bitstream. The testing bitstreams may be determined in any manner described herein. In one embodiment, the testing bitstreams are determined using the method depicted and described with respect to FIG. 13.

At step 1206, the input bitstream is applied to the system-on-chip. The input bitstream may be applied to the system-on-chip via the TDI interface of the system-on-chip. At step 1208, an actual output bitstream is captured from the system-on-chip. The actual output bitstream may be captured from the system-on-chip via the TDO interface of the system-on-chip.

At step 1210, testing results are determined using the actual output bitstream and the expected output bitstream. The testing results may be determined by comparing the actual output bitstream and the expected output bitstream (e.g., to determine whether or not there were any errors during testing). At step 1212, the testing results are stored.

At step 1214, method 1200 ends.

FIG. 13 depicts an exemplary method executed by the testing system of FIG. 1 for testing a system through a JTAG connection. Specifically, method 1300 of FIG. 13 includes a method for determining testing bitstreams for use in testing the system-on-chip. Although depicted and described as being performed serially, at least a portion of the steps of method 1300 of FIG. 13 may be performed contemporaneously, or in a different order than depicted and described with respect to FIG. 13. The method 1300 begins at step 1302 and proceeds to step 1304.

At step 1304, a description of the system-on-chip (denoted herein as a system description) is determined. The system description may be determined in any manner described herein. The system description is an NSDL-based description of the system-on-chip. In one embodiment, the system description is determined using the method depicted and described with respect to FIG. 14.

At step 1306, the testing bitstreams for testing the system-on-chip are determined from the system description of the system-on-chip. The testing bitstreams include the input bitstream to be applied to the system-on-chip and an expected output bitstream which may be compared to an actual output bitstream captured from the system-on-chip.

At step 1308, method 1300 ends.

FIG. 14 depicts an exemplary method executed by the testing system of FIG. 1 for testing a system through a JTAG connection. Specifically, method 1304 of FIG. 14 includes a method for determining a system description of the system-on-chip. Although depicted and described as being performed serially, at least a portion of the steps of method 1304 of FIG.

14 may be performed contemporaneously, or in a different order than depicted and described with respect to FIG. 14. The method 1304 begins at step 1402 and proceeds to step 1404.

At step 1404, components of the system-on-chip are identified. The components of the system-on-chip may be identified in any manner. In one embodiment, components of the system-on-chip are identified as part of testing resources supplied with the system-on-chip. In one embodiment, components of the system-on-chip are identified by analyzing the system-on-chip. The components of the system-on-chip may be identified in any other manner.

At step 1406, a component description is determined for each of the components of the system-on-chip. The component descriptions may be determined in any manner.

In one embodiment, in which the component descriptions are pre-defined, the component descriptions may be determined by simply reading the pre-defined descriptions. In one embodiment, in which the component descriptions are not pre-defined, the component descriptions may be defined on-the-fly by analyzing each of the components.

The description of a component specifies the internal scan path of the component. In one embodiment, the description of a component represents the component in terms of register values. In one such embodiment, in which a component supports multiple functions, each of the functions of the component may be represented in terms of register values. The description of a component in terms of register values may be better understood with respect to FIG. 15. The component descriptions are specified using NSDL.

At step 1408, the topology of the system-on-chip is determined. The topology of the system-on-chip describes interconnections between components of the system-on-chip. The topology of the system-on-chip is determined by analyzing interconnections between the components of the system-on-chip.

At step 1410, the system description of the system-on-chip is determined. The system description is determined using the component descriptions and the system topology. The system description of the system-on-chip represents the scan path of the system-on-chip, including internal scan paths of each of the respective components of the system-on-chip and interconnections between the components of the system-on-chip. The system description may include any other information which may be used to describe the system-on-chip. At step 1412, the system description of the system-on-chip is stored.

At step 1414, method 1304 ends.

FIG. 15 depicts use of a description of one of the components of the system-on-chip of FIG. 2 to determine register values for a test procedure for testing that component. Specifically, a description of component $210_A$ of S-o-C 110 (omitted for purposes of clarity) is translated into a set of register values (denoted as register values 1510) for component $210_A$ of S-o-C 110. The register values 1510 of component $210_A$ include register values for each of the three functions supported by component $210_A$. The register values for each of the three functions supported by component $210_A$ may be processed to determine values for testing bitstreams used for testing component $210_A$.

As depicted in FIG. 15, functions of component $210_A$ are described in terms of register values of component registers $A_0, A_1, A_2$ of which component $210_A$ is composed. The first function is defined as: "000", wait 4 cycles, "001". The second function is defined as: "111", wait 1 cycle, "010", wait 5 cycles, "101". The third function is defined as: "000", wait 2 cycles, "100", wait 10 cycles, "000". In other words, register values 1510 specify mappings from functions to component register values for component $210_A$. This description (i.e., mapping from functions to register values) shows the ease with which a description of a component may be processed in order to determine testing bitstreams.

As depicted in FIG. 15, for each of the functions of component $210_A$, register values 1510 indicate: (1) how the component registers are written and read for the function, and (2) how the component register values must be interpreted for the function. Thus, in a description language, such as NSDL, the description of the component includes descriptions of the functions of the component, which may in turn be translated into register values for use in a testing procedure for testing the component within the context of the system-on-chip.

Although omitted for purposes of clarity in describing the mapping from functions to register values, the specific description of component $210_A$ in terms of NSDL is an algorithmic description, composed in a manner as depicted and described with respect to FIG. 3-FIG. 5. This NSDL-based description of component $210_A$ enables the mapping from functions to register values to be determined. Although omitted for purposes of clarity, similar descriptions may be defined for each of the other components of S-o-C 110 (i.e., components $210_B$-component $210_E$).

FIG. 16 depicts use of a description of the composition of the system-on-chip of FIG. 2 to determine testing bitstreams for a testing procedure for testing one of the components of the system-on-chip of FIG. 2. As depicted in FIG. 16, testing bitstreams 1610 are generated for use in testing at least a portion of S-o-C 110. Specifically, testing bitstreams 1610 include an input bitstream $1611_I$ applied to the TDI port of S-o-C 110 and an output bitstream $1611_O$ received from the TDO port of S-o-C 110.

The testing bitstreams 1610 are generated by TS 120 using a description of S-o-C 110 (specified using NSDL). The description of S-o-C 110 (also referred to herein as a system description) includes descriptions of the testing resources of S-o-C 110 (e.g., descriptions of components 210, descriptions of component interconnections 220, and the like, as well as various combinations thereof). The system description of S-o-C 110 describes the topology of S-o-C 110 and, thus, the system scan path of S-o-C 110.

As described herein, TS 120 generates testing bitstreams 1610 based on the system description (which provides a description of the system scan path) of S-o-C 110. Thus, since the system description of S-o-C 110 provides a description of the system scan path of S-o-C 110, TS 120 is able to determine which portions of testing bitstreams 1610 generated for S-o-C 110 correspond to which portions of the system scan path of S-o-C 110. This is depicted in FIG. 16.

As depicted in FIG. 16, specific bit positions within input bitstream $1611_I$ and output bitstream $1611_O$ (i.e., bit positions that correspond to component $210_A$) have been located. The location of the specific positions within input bitstream $1611_I$ and output bitstream $1611_O$ that correspond to registers within component $210_A$ is enabled by use of an NSDL-based description of S-o-C 110 (which provides information about the system scan path of S-o-C 110, including respective locations of components 210 within S-o-C 110).

Although omitted for purposes of clarity in describing the translation from component registers to bitstreams, the specific description of S-o-C 110 in terms of NSDL is an algorithmic description which describes the topology of S-o-C 110 and, thus, the system scan path of S-o-C 110. This NSDL-based description of S-o-C 110 enables the translation from register values to bitstreams to be performed.

Figure 17:
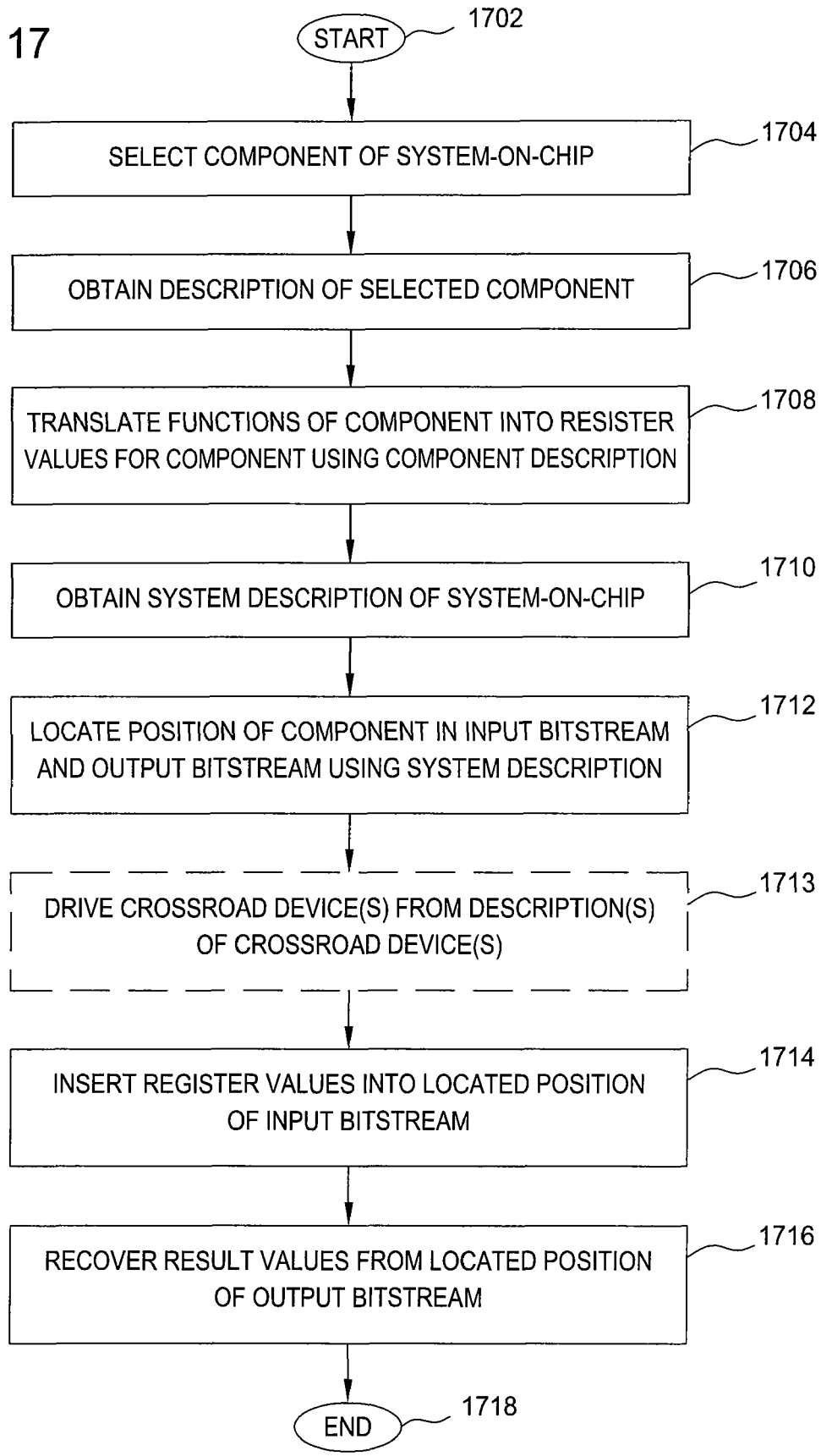
FIG. 17 depicts an exemplary method executed by the testing system of FIG. 1 for testing a component of a system in an IJTAG/NSDL framework.

FIG. 17 depicts an exemplary method executed by the testing system of FIG. 1 for testing a component of a system in an IJTAG/NSDL framework. Specifically, method 1700 of FIG. 17 includes a method for testing one component of the system-on-chip. Although depicted and described as being performed serially, at least a portion of the steps of method 1700 of FIG. 17 may be performed contemporaneously, or in a different order than depicted and described with respect to FIG. 17. The method 1700 begins at step 1702 and proceeds to step 1704.

At step 1704, a component of a system-on-chip is selected (i.e., selected as the component of the system-on-chip that will be tested).

At step 1706, a description of the selected component is obtained.

At step 1708, for each function supported by the component, the function is translated into register values associated with the registers of the component. The functions of the component are translated into register values using the description of the component.

At step 1710, a system description of the system-on-chip is obtained. The system description of the system-on-chip specifies the system scan path of the system-on-chip, determined from descriptions of components of the system-on-chip and a description of the topology of the system-on-chip. The system description may be used to specify testing bitstreams for the system-on-chip.

At step 1712, the position of the selected component within the testing bitstreams of the system-on-chip is determined using the topology of the system-on-chip. The position of the selected component within the testing bitstreams specifies one or more bit positions within the input bitstream and one or more bit positions within the actual output bitstream.

At step 1713 (an optional step), a crossroad device is driven (i.e., if access to the component is controlled by a crossroad device). The crossroad device is driven by processing an algorithmic description of the crossroad device. Driving the crossroad device enables the crossroad device to be selected in order to dynamically add the associated component to the scan path of the system-on-chip. After access to the component is no longer required, the crossroad device may then be deselected to remove the associated component from the scan path of the system-on-chip. This step is optional because access to a component may or may be controlled by a crossroad device.

At step 1714, register values are inserted into the located position of the input bitstream. The input bitstream may then be applied to an input test access port of the system-on-chip (i.e., for testing at least a portion of the system-on-chip). At step 1716, result values are recovered from the located position of the output bitstream (i.e., from the output bitstream captured by the testing system from an output test access portion of the system-on-chip). The recovered result values may then be processed in order to determine various testing results.

At step 1718, method 1700 ends.

Figure 18:
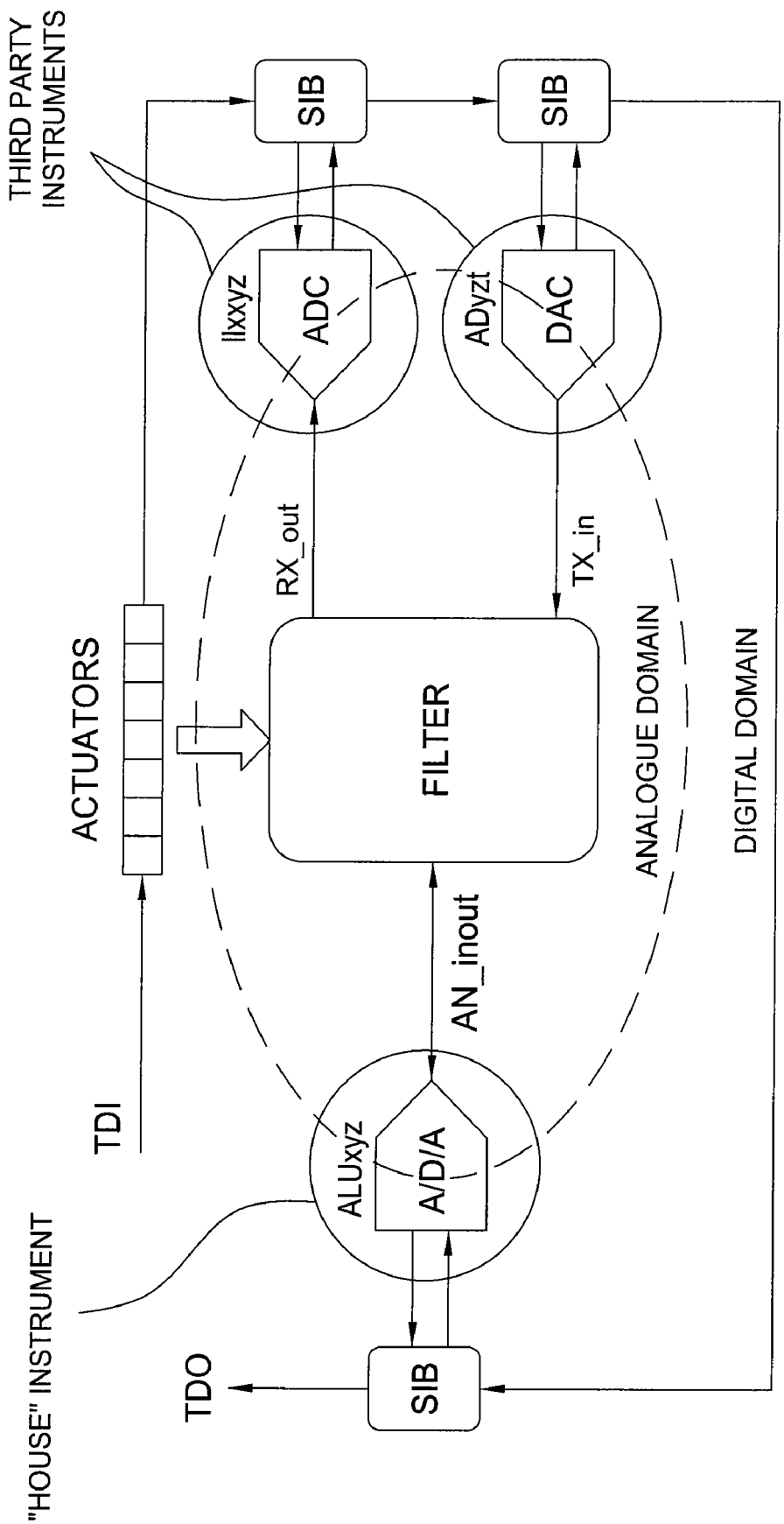
FIG. 18 depicts a high-level block diagram of an exemplary system-on-chip.

FIG. 18 depicts a high-level block diagram of an exemplary system-on-chip. As depicted in FIG. 18, system-on-chip 1800 includes a filter and three instruments, including an analog-to-digital converter (ADC), a digital-to-analog converter (DAC), and an antenna access unit (AAU). The AAU supports analog-to-digital-to-analog conversion. The filter supports an output connection to the ADC (denoted as RX_out) and an input connection from the DAC (denoted as TX_in). The filter supports a bidirectional connection with the AAU (denoted as AN_inout).

As depicted in FIG. 18, access to the three instruments is provided via a scan path from a TDI input to a TDO output. The scan path includes a set of actuator registers and three SIB cells (one for each of the three instruments, which enable the respective instruments to be added to the scan path). The actuator registers interface with the filter. A first SIB cell provides access to the ADC instrument (via an affluent and tributary). A second SIB cell provides access to the DAC instrument (via an affluent and tributary). A third SIB cell provides access to the AAU instrument (via an affluent and tributary).

A description of the scan path follows. The TDI input is coupled to the input of the set of actuator registers. The output of the set of actuator registers is coupled to the input of the first SIB cell. The output of the first SIB is coupled to the input of the second SIB cell. The output of the second SIB cell is coupled to the input of the third SIB cell. The output of the third SIB cell is coupled to the TDO output. This sequence from TDI input to TDO output forms the scan path of the system-on-chip 1800 when each of the SIBs is deselected (i.e., if none of the SIBs are "selected" such that their respective instruments are added to the scan path).

As depicted in FIG. 18, each of the three instruments may be easily added to the scan path by selecting the affluent and tributary interfaces of the respective SIB cells associated with the three instruments. For example, the first SIB may be selected such that the ADC instrument may be added to the scan path for testing. For example, the first SIB and third SIB may be selected such that the ADC and AAU instruments may both be added to the scan path for testing. As described herein, an NSDL-based description of the system-on-chip 1800 simplifies testing of system-on-chip 1800.

Figure 19:
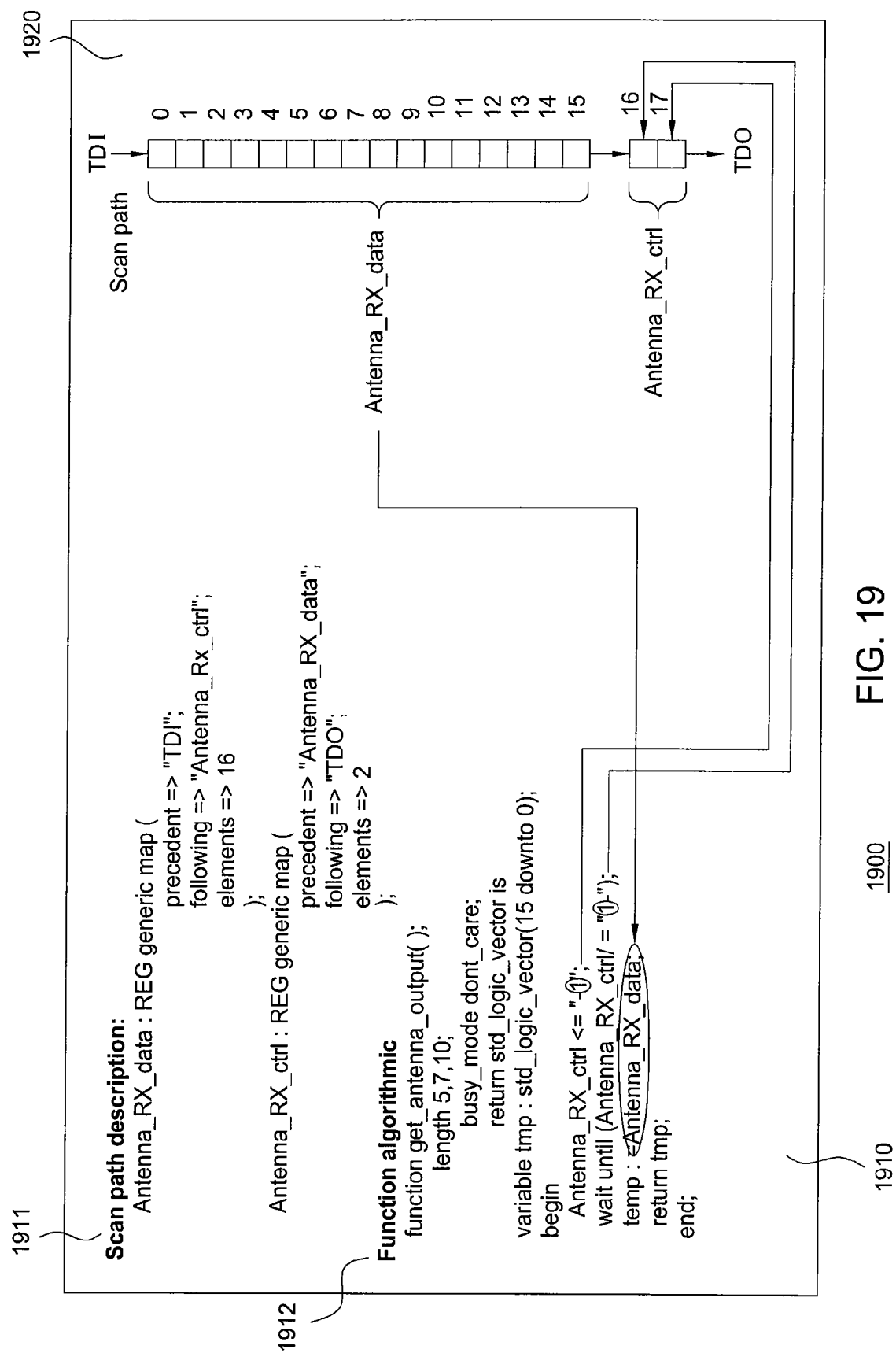
FIG. 19 depicts use of a description of one of the components of the system-on-chip of FIG. 18 to determine register bit values for a test procedure for testing that component.

FIG. 19 depicts use of a description of one of the components of the system-on-chip of FIG. 18 to determine register bit values for a test procedure for testing that component. Specifically, FIG. 19 depicts a mapping of a description of the ADC instrument (denoted as description 1910) to register values associated with registers of the ADC instrument (denoted as registers 1920). As depicted in FIG. 19, the description 1910 includes a description of the scan path (denoted as scan path description 1911) and an algorithmic representation of the function performed by the ADC instrument (denoted as function algorithmic 1912).

The description 1910 is an NSDL-based (algorithmic) description. The scan path description 1911 identifies the registers of the ADC instrument (which include data registers and control registers), and describes how the registers are arranged (e.g., identifying "precedent", "following", and length information). The function algorithmic 1912 describes the operation of the function performed by the ADC instrument. From description 1910, a testing tool can easily determine bitstream values which may be used to test the ADC instrument.

Figure 20:
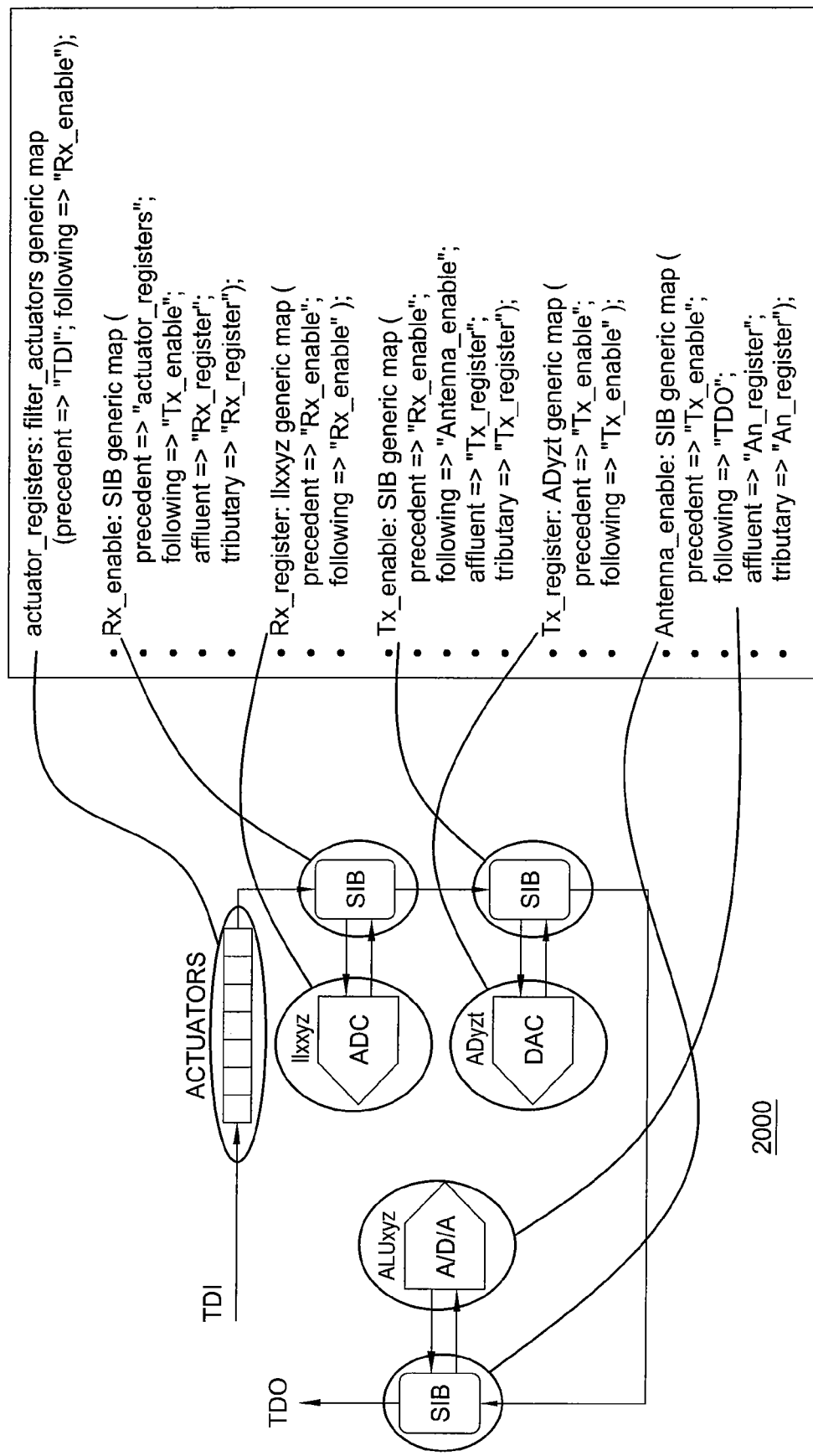
FIG. 20 depicts use of descriptions of the components of the system-on-chip of FIG. 18 to determine a description of the composition of the system-on-chip of FIG. 18.

FIG. 20 depicts use of descriptions of the components of the system-on-chip of FIG. 18 to determine a description of the composition of the system-on-chip of FIG. 18. Specifically, FIG. 20 depicts a description of the topology of the system-on-chip of FIG. 18 (denoted as topology 2010). The topology 2010 is specified using a generic mapping of each of the inputs and outputs of each of the components of system-on-chip 1800 (e.g., the actuator registers, SIBs, and instruments).

For example, the description of the actuator registers indicates that the input to the actuator registers is the TDI input ("precedent=>"TDI") and that the output from the actuator registers is the first SIB, which is denoted as RX_enable because it enables access to the RX-register of the ADC instrument (following=>"RX_enable"). In other words, the actuator registers component is described in terms of the components with which it interfaces.

For example, the description of the first SIB (i.e., the RX_enable component) indicates that the input to the RX_enable component is the actuator registers (precedent=>"actuator_registers") and the output of the first SIB is the second SIB, which is denoted as TX_enable because it enables access to the TX_register of the DAC instrument (following=>"Tx_enable").

Additionally, since the first SIB enables access to the ADC instrument, the description of the first SIB also describes the access to the ADC instrument. Specifically, the description of the first SIB indicates that access from the first SIB to the ADC instrument is enabled via one input (affluent=>"Rx_register") and one output (tributary=>"Rx_enable").

From these examples, it is clear that the entire topology of the system-on-chip may be easily described using NSDL. Furthermore, the locations of each of the components of the system-on-chip within the topology of the system-on-chip may be easily determined since the topology provides a description of interconnections between the components of the system-on-chip.

As described herein, using the descriptions of the components of the system-on-chip (which provide mappings from functions of the components to register values for registers of the components) and the description of the topology of the system-on-chip, various types of tests may be executed on the system-on-chip. Thus, FIGS. 18-20 depict benefits of describing a system-on-chip using NSDL.

From the foregoing descriptions, the various advantages and benefits of using the NSDL language to describe a system-on-chip are apparent. The algorithmic nature of NSDL enables an algorithmic description of a system-on-chip (no matter how complicated the topology) which may be processed for determining testing bitstreams adapted for testing the system-on-chip (e.g., testing multiple components, testing one component, testing a subset of functions of a component, and the like, as well as various combinations thereof). Thus, using NSDL, a hierarchical description of the system scan path of a system-on-chip may be determined for use in testing the system-on-chip.

The NSDL language supports features of IJTAG in a manner that BSDL/HSDL simply cannot, including providing algorithmic descriptions of system-on-chip components (e.g., IPs, instruments, crossroad devices, and so forth), system-on-chip topology (e.g., interconnections between components, inter-component dependencies, so forth), and the like, as well as various combinations thereof, thereby enabling an algorithmic system-level description of the system-on-chip. Thus, the NSDL language enables hierarchical scan path organization, thereby enabling translation of register values into testing bitstreams which may be used for testing the system-on-chip.

The NSDL language may be implemented in many ways.

In one embodiment, NSDL is implemented using existing features of VHDL. Whereas BSDL was defined as a subset of VHDL, NSDL utilizes a superset of VHDL. Since VHDL is a leading Register Transfer Level (RTL) description language, it is well suited for expressing the testing requirements of the components it describes. By remaining compatible with VHDL, NSDL may be supported by existing compilers with minimal changes. Furthermore, use of VHDL ensures that transitioning to NSDL will be a smooth experience for people used to VHDL and, further, ensures that translation and adaptation of existing sources and tools will be easy. Thus, NSDL utilizing VHDL minimizes the impact on the existing community of users, thereby simplifying adoption of NSDL by the existing community of users.

By contrast, BSDL was developed as a subset of VHDL in an effort to make BSDL both backward compatible and forward compatible with VHDL. A subset indicates that nothing is added (i.e., all information is carried by structural syntax rules embedded into already existing VHDL rules, which are then interpreted in a different way than normal). While backward compatibility is automatic, the impossibility of defining new constructs makes evolution difficult. This structural limitation led developers to overuse the two most generic constructs (attributes and character strings), often in a counterintuitive manner. In other words, BSDL was effectively constrained within a small portion of VHDL, thereby eliminating any possibility of VHDL having contextual meaning.

As described herein, NSDL provides many advantages in system-on-chip testing. Similarly, using VHDL to implement NSDL provides many advantages in system-on-chip testing.

The components of a system-on-chip may be modeled on the VHDL entity-component couplet, thereby enabling descriptions of individual functions supported by components of the system-on-chip. Thus, access to each component may be provided through the internal scan path of the component, which may include hierarchy. Further, a component may come with a corresponding set of test procedures that a testing system may use to test the component, where properties of the procedures are specified using NSDL (e.g., length, dependencies, and the like) while the bodies of the procedures are specified using VHDL. Thus, this enables system architects to handle system-level descriptions in a manner similar to the manner in which component architects handle component-level descriptions.

The scan path of a system-on-chip may be composed as a series of entities which may be instantiated like VHDL components and, thus, may be easily regrouped into packages or libraries. Further, many more complicated representations are easily handled (e.g., multiple instantiations of a given type of component, inter-component dependencies, and the like, as well as various combinations thereof). Further, NSDL enables building of the system scan chain in a manner that is an improvement over classical VDL signal mapping. The test procedures developed for testing a system-on-chip may reference the system scan path or portions of the system scan path (called slices, which may include groups of components or even a subset or subset of one component).

Although primarily depicted and described herein with respect to embodiments in which NSDL is implemented using VHDL, NSDL may be implemented using other hardware descriptions languages (which may include hardware description languages which have not yet been developed).

As described herein, in addition to improving JTAG-based testing, as well as enabling use of crossroad devices in JTAG-based testing, the NSDL language also enables parallel access to components of a system-on-chip, thereby enabling improvements in system-on-chip testing (e.g., improved test scheduling, improved testing efficiency, and the like, as well as various combinations thereof).

In one embodiment, such as P1687, parallel access is primarily intended as a way of optimizing bandwidth for data transmission, while serial access still retains control of the testing. The NSDL language can describe these ancillary resources and insert them into the testing flow (e.g., into the methods 1200 and 1700 depicted and described with respect to FIG. 12 and FIG. 17, respectively).

Furthermore, NSDL may also be expanded to describe more complex Test Access Mechanisms (TAMs), e.g., using crossroad devices to provide parallel access for testing a system-on-chip, using fan-out/fan-in schemes to provide parallel access for testing a system-on-chip, and the like, as well as various combinations thereof.

The use of parallel access for testing a system-on-chip (or multiple system-on-chips) may be better understood with respect to FIG. 21-FIG. 28.

Figure 21:
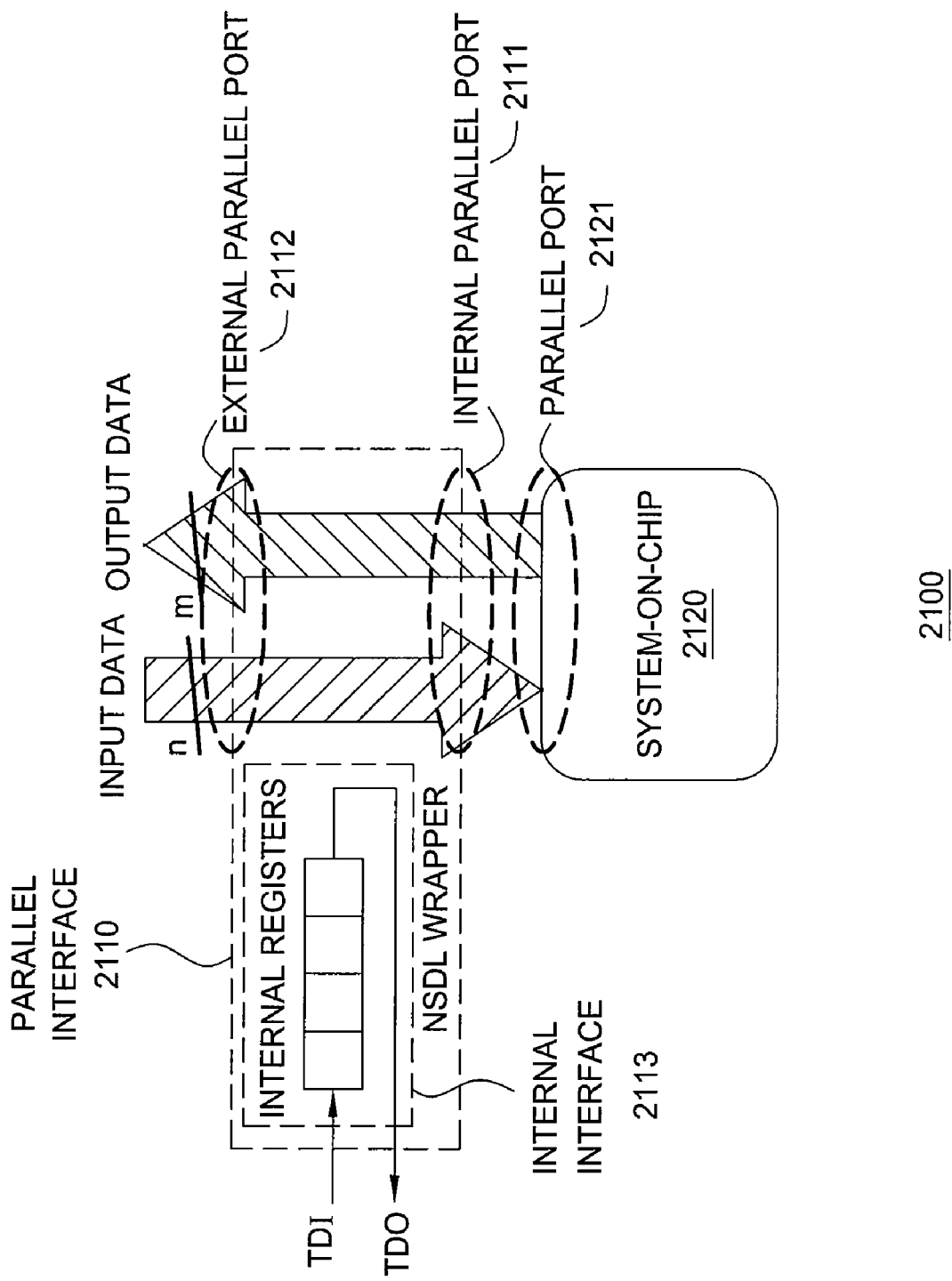
FIG. 21 depicts a high-level block diagram of a general connection scheme of a parallel access interface.

FIG. 21 depicts a high-level block diagram of a general connection scheme of a parallel access interface. Specifically, general connection scheme 2100 provides a parallel access interface 2110 to a system-on-chip 2120. The parallel access interface 2110 includes an internal parallel port 2111, an external parallel port 2112, and an internal interface 2113. The system-on-chip 2120 includes a parallel port 2121.

As depicted in FIG. 21, parallel access to system-on-chip 2120 is provided by a connection between internal parallel port 2111 and parallel port 2121. The exploitation of parallel port 2121 requires: (1) connection and synchronization of parallel port 2121 to system-on-chip 2120 (which may be done at instantiation time) and (2) handling of parallel port 2121 by a testing system (omitted for clarity).

As depicted in FIG. 21, internal parallel port 2111 and external parallel port 2112 enable n input connections (n>0) and m output connections (m>0) to be connected to parallel port 2121 of system-on-chip 2120.

The parallel access to system-on-chip 2120 is provided in two ways.

The parallel access to system-on-chip 2120 is provided externally. External access from a testing system to system-on-chip 2120 is provided using external parallel port 2112. The external parallel port 2112 functions as an interface between a testing system and internal parallel port 2111. The external parallel port 2112 supports n input connections and m output connections (corresponding to the n/m input/output connections of internal parallel port 2111, respectively).

The parallel access to system-on-chip 2120 is provided internally. Internal access from a testing system to system-on-chip 2120 is provided using internal interface 2113. In one embodiment, internal interface 2113 may be implemented using one or more internal registers connected to the system scan path. In this embodiment, the internal registers may be used to control the behavior of parallel access interface 2110 or to query the status of parallel access interface 2110.

As stated above, the testing system which would access internal parallel port 2111 via the internal interface 2112 or the external interface 2113 is omitted for purposes of clarity.

The parallel access interface 2110 is described using NSDL.

The NSDL description of parallel access interface 2110 includes: (1) a description of the internal port(s) (e.g., width information, data flow directions, and like information) and (2) parallel access functions/procedures.

The NSDL description of parallel access interface 2110 may also optionally include: (3) a description of external parallel port 2112 (e.g., width information, data flow directions, and like information).

The NSDL description of parallel access interface 2110 may also optionally include: (4) a description of internal interface 2113 (e.g., a description of registers utilized for control functions and/or status functions).

In one embodiment, parallel access from a testing system to a system-on-chip having a plurality of components may be described using a description of a serial test access interface for coupling testing bitstreams between the testing system and the components (where the serial test access interface provides access to the components using a serial scan path of the system-on-chip), and a description of a parallel test access interface for coupling testing bitstreams between the testing system and the components (where the parallel test access interface provides access to the components without using a serial scan path of the system-on-chip, i.e., not directly via the serial scan path, even though access may be controlled by one or more values of the serial scan path). The descriptions of the serial test access interface and the parallel test access interface may be stored for use in testing.

In one embodiment, parallel access from a testing system to a system-on-chip may be described using description of a parallel interface module adapted for coupling the testing system to a core module of the system-on-chip and storing the description of the parallel interface module, where the parallel interface includes at least one serial register adapted for accessing the core module using a scan path of the system-on-chip and at least one parallel register adapted for accessing the core module without using the scan path of the system-on-chip. The description may be stored for use in testing.

In one embodiment, parallel access from a testing system to a system-on-chip may be described by using a description of a serial test access port adapted for coupling testing bitstreams between the testing system and the components, a description of a parallel test access port adapted for coupling testing bitstreams between the testing system and the components, and a description of an interface port adapted for coupling the serial test access port and the parallel test access port to at least a portion of the components of the system-on-chip. The descriptions may be stored for use in testing the system-on-chip.

As described herein, the descriptions that are generated are stored. As such, the descriptions may be received by a processor (e.g., from a memory, from another system, or from any other source of such descriptions) in order to perform various tests using parallel access (e.g., component-level tests, system-level tests, and the like, as well as various combinations thereof).

The parallel access from a testing system to a system-on-chip may be described in other ways.

The communications between parallel interface 2110 and system-on-chip 2120 may be synchronous or asynchronous.

In one embodiment, communications between parallel interface 2110 and system-on-chip 2120 are synchronized with the scan chain. In one such embodiment, at the rising edge of the 1149.1 "update" signal, the value(s) on the parallel port 2121 is sampled. In this embodiment, the testing system merely has to present the value(s) to the port (for inputs) and/or collect the value(s) from the port (for outputs).

In one embodiment, communications between parallel interface 2110 and system-on-chip 2120 are implemented as a synchronized burst. In one such embodiment, to optimize bandwidth, a burst of data is sent to parallel port 2121 (on the input) and/or read from parallel port 2121 (on the output). In one such embodiment, the burst data may be sent/read starting at the rising edge of the 1149.1 "update" signal. The parallel interface 2110 will specify the characteristics of the data burst to the testing system.

In one embodiment, communications between parallel interface 2110 and system-on-chip 2120 are asynchronous. In this embodiment, parallel port 2121 operates on its own, handling its own protocol for operating the connection. In this embodiment, the testing system will allow only high-level access (sending data and receiving data). The protocol of the transaction is handled by a parallel interface driver of the testing system.

In one embodiment, system-on-chip 1220 may support multiple such modes of communication with parallel interface 2110. In such embodiments, a set of functions may be used to switch between the different modes of communication. For example, the set of functions may include: "disable_port", which disables the parallel port; "set_scan_synchro", which toggles to the scan chain synchronized access mode; "set_burst", which toggles to the burst access mode; and "set_asynchro", which toggles to the asynchronous mode.

FIG. 22 depicts a high-level block diagram illustrating two exemplary parallel access connection schemes.

As depicted in FIG. 22, the exemplary parallel access connection schemes are described within the context of the testing environment of FIG. 1. The exemplary parallel access connection schemes are utilized to connect testing system 120 to system-on-chip 110. Specifically, the exemplary parallel access connection schemes are utilized to connect testing system 120 to a JTAG interface 2201 and a parallel interface 2202 of system-on-chip 110.

As depicted in FIG. 22, a first parallel access connection scheme 2210 utilizes a common cable for JTAG and parallel access. The first parallel access connection scheme 2210 utilizes a single connection device (denoted as JTAG-parallel interface device) 2111 for both the JTAG interface 2201 to the scan path of system-on-chip 110 and the parallel interface 2202 of system-on-chip 110.

As depicted in FIG. 22, a second parallel access connection scheme 2220 utilized separate JTAG and parallel connections. The second parallel access connection scheme 2210 utilizes a first connection device (denoted as JTAG interface device 2121) for the JTAG interface 2201 to the scan path of system-on-chip 110 and a second connection device (denoted as parallel interface device 2122) for the parallel interface 2202 of system-on-chip 110.

With respect to second parallel access connection scheme 2210, although depicted and described with respect to an embodiment in which testing system 120 is the testing source/sink for the both JTAG interface 2201 and parallel interface 2202, in other embodiments, the testing source and/or sink for JTAG interface 2201 and parallel interface 2202 may be different. For example, JTAG interface 2201 or parallel interface 2202 may use a testing source and/or sink other than testing system 120.

In general, depending on the implementation of the parallel interface, the testing system performing testing of a system-on-chip via the parallel interface may not be able to directly access the parallel port of the system-on-chip, e.g., due to the many constructs disposed between the testing system and the parallel port of the system-on-chip. An example is depicted and described in FIGS. 23A and 23B.

Figure 23A:
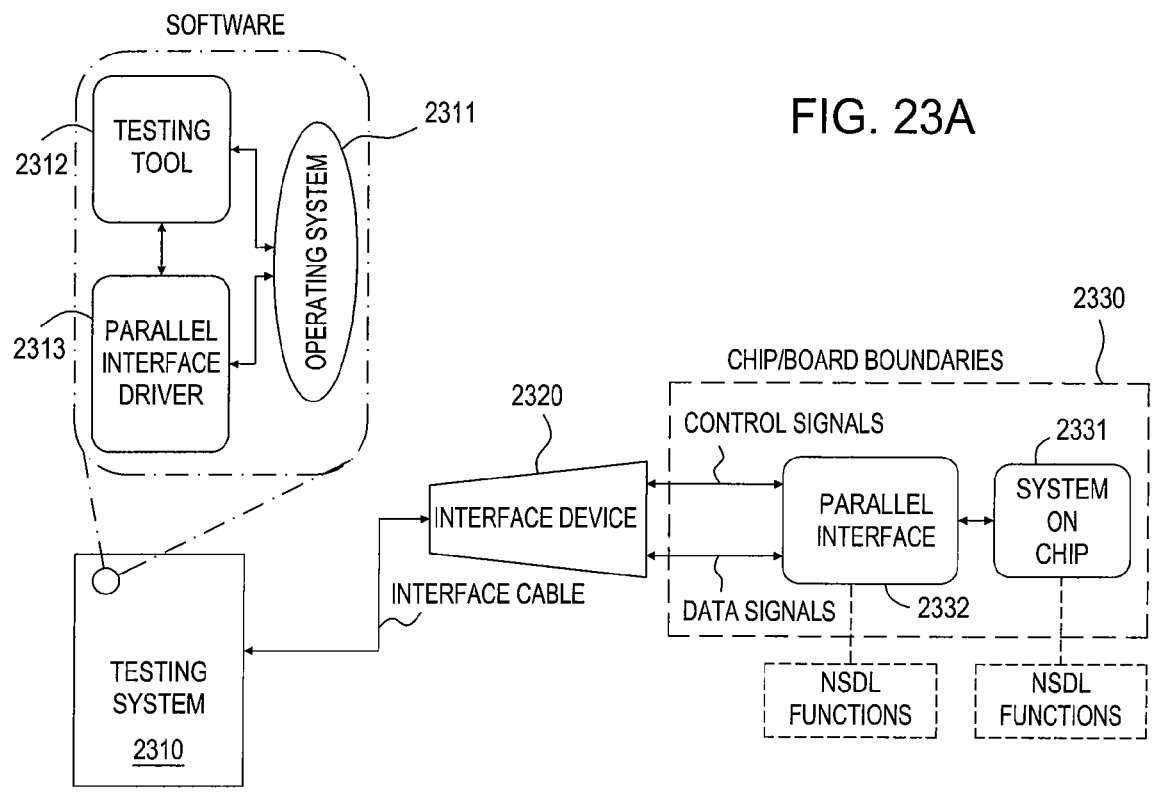
FIG. 23A depicts a high-level block diagram of an exemplary testing environment.

FIG. 23A depicts a high-level block diagram of an exemplary testing environment. The exemplary testing environment 2300 enables a testing system to perform testing on a system-on-chip using a parallel access interface which provides parallel access to the system-on-chip. Specifically, testing environment 2300 includes a testing system (TS) 2310 and a chip/board (C/B) 2330, which are interconnected via an interface device (ID) 2320.

The TS 2310 is a testing system adapted for performing testing of a system-on-chip via a parallel access interface. The TS 2310 may be implemented in any manner for implementing a system for testing a system-on-chip using parallel access to the system-on-chip. In one embodiment, TS 2310 may be implemented as an adapted version of TS 120 depicted and described with respect to FIG. 11 (e.g., adapted to support parallel testing capabilities).

The TS 2310 includes software adapted for use in for performing testing of a system-on-chip via a parallel access interface. Specifically, TS 2310 includes an operating system 2311 controlling a testing tool 2312 and a parallel interface driver 2313. The TS 2310 includes other hardware and software (e.g., processors, memory, support circuits, and the like) adapted for performing testing of a system-on-chip (which is omitted for purpose of clarity).

In one embodiment, testing tool 2312 may be the same as testing tool 1121 (or at least functions depicted and described with respect to testing tool 2312 may be implemented as part of testing tool 1121.

The C/B 2330 includes a system-on-chip 2331 and a parallel interface 2332. The system-on-chip 2331 may be any system-on-chip described herein. The parallel interface 2332 is a parallel interface as depicted and described with respect to FIGS. 21 and 22. The interaction between parallel interface 2332 and system-on-chip 2331 may be better understood with respect to FIG. 21. As depicted in FIG. 23A, system-on-chip 2331 and parallel interface 2332 are each described using NSDL.

The ID 2320 functions as an interface between TS 2310 and C/B 2330. The interface between TS 2310 and ID 2320 may be implemented using any type of interface supported by TS 2310 (e.g., a USB cable or any other type of interface which may be supported by TS 2310). The interface between ID 2320 and C/B 2330 may be implemented as any type of interface supported by C/B 2330. In one embodiment, ID 2320 supports separate data and control interfaces to C/B 2330 such that data signals and control signals may be applied from TS 2310 to C/B 2330 independently.

As described herein, testing tool 2312 handles data exchanges with parallel interface 2332 (and, thus, system-on-chip 2331) and parallel interface driver 2313 handles protocol exchanges with parallel interface 2332 (and, thus, system-on-chip 2331). In other words, parallel interface driver 2313 prevents testing tool 2312 from having to manage protocol exchanges with parallel interface 2332. As depicted in FIG. 23A, data exchanges and protocol exchanges between TS 2310 and C/B 2330 are supported by ID 2320.

In one embodiment, parallel interface driver 2313 handles protocol exchanges with parallel interface 2332 using functions supported by operating system 2311 (e.g., using buffers, semaphores, mailboxes, and the like, as well as various combinations thereof). In this embodiment, testing tool 2312 does not directly control the JTAG port of the system-on-chip; rather, testing tool 2312 interacts with drivers which provide various functions to testing tool 2312 (e.g., using functions declared by the driver and imported by testing tool 2312).

Figure 23B:
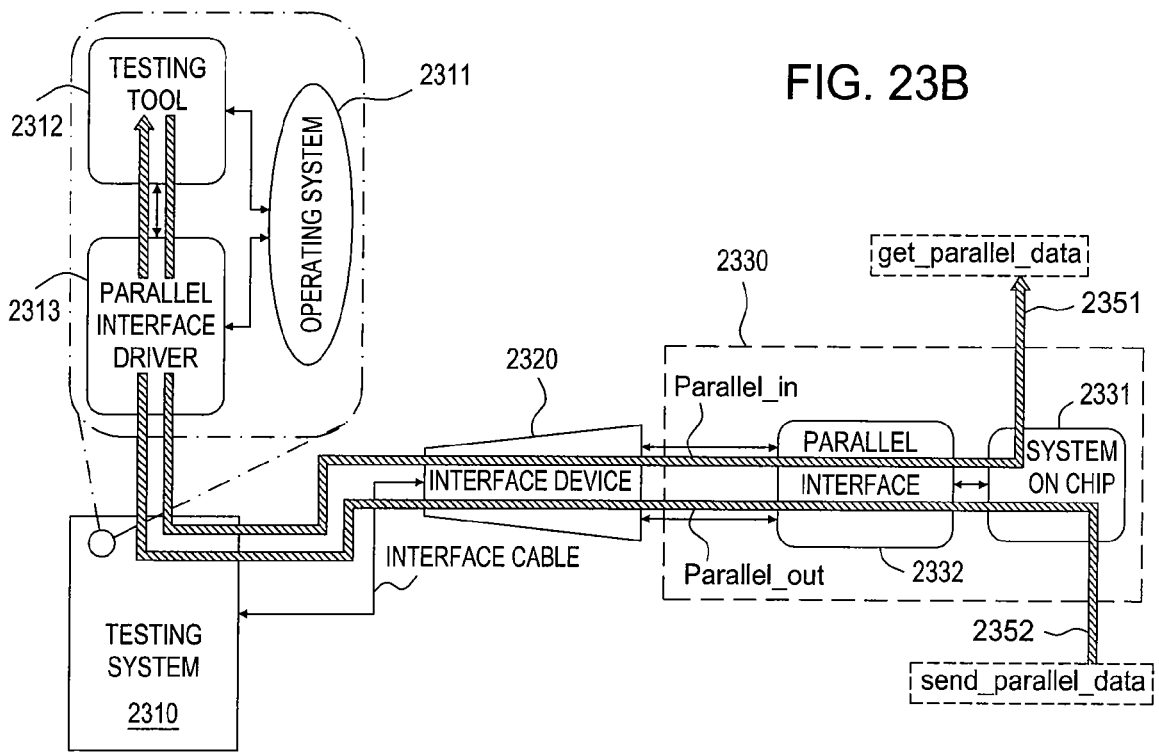
FIG. 23B depicts a high-level block diagram of data flow within the exemplary testing environment of FIG. 23A.

FIG. 23B depicts a high-level block diagram of data flow within the exemplary testing environment of FIG. 23A. As depicted in FIG. 23B, data flows from TS 2310 to C/B 2330 (denoted as data flow 2351) and from C/B 2330 to TS 2310 (denoted as data flow 2352). In data flow 2351, data flows from testing tool 2312 to parallel interface driver 2313 to interface device 2320 to parallel interface 2332 to system-on-chip 2331. In data flow 2352, data flows along the reverse path from system-on-chip 2331 to testing tool 2312. As described herein, only the data flows are important within the context of testing environment 2300.

An NSDL-based description of system-on-chip 2331 includes one or more parallel ports connected (e.g., at instantiation time) to the corresponding parallel interface, one or more parallel slices (where the data for parallel transactions is stored), and one or more parallel transaction functions adapted for initiating transactions on the parallel port. The parallel slice(s) may be identified using specific naming (e.g., "parallel_xxxx"). The parallel transaction functions may be identified using specific naming (e.g., "send_parallel_data" and "get_parallel_data"). For example, prototypes of parallel transaction functions may include:

```
function send_parallel_data (sending_slice : in string)
    return boolean;
function get_parallel_data (receiving_slice : in string)
    return boolean;
```

The exemplary parallel transaction functions described herein advertise activity on the parallel port and, further, indicate modifications to serial testing bitstreams in order to control serial testing bitstreams. The implementation of the "parallel slice" informs the testing system (illustratively, testing tool 2312 of TS 2310) of the details of data flow between the parallel port of the system-on-chip and the remainder of the system-on-chip (referred to herein as the "core" of the system-on-chip). The connection between the parallel port of the system-on-chip and the core of the system-on-chip may be implemented in many ways (examples of which are depicted and described with respect to FIGS. 24-27).

Figure 24:
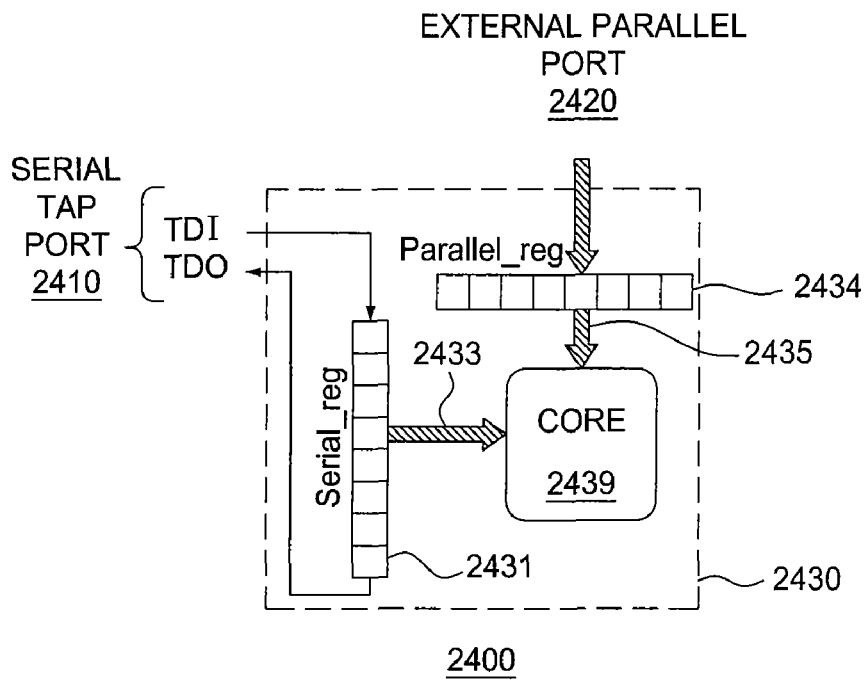
FIG. 24 depicts a high-level block diagram of an exemplary connection between a parallel port and core of a system-on-chip.

FIG. 24 depicts a high-level block diagram of an exemplary connection between a parallel port and core of a system-on-chip. As depicted in FIG. 24, the exemplary connection utilizes a completely independent parallel port (independent of the serial scan path). Specifically, connection 2400 includes a TAP port 2410 and an external parallel port 2420 providing parallel access to a system-on-chip 2430. The system-on-chip 2430 includes a core 2439, which may be accessed via the TAP port 2410 or via the external parallel port 2420.

The core 2439 is accessed via TAP port 2410 using serial registers 2431 in the serial scan path of system-on-chip 2430. The serial registers 2431 control access to core 2439 via a first interface 2433. The core 2439 is accessed via external parallel port 2420 using parallel registers 2434 which are outside of the serial scan path of system-on-chip 2430. The parallel registers 2434 control access to core 2439 via a second interface 2435.

As depicted in FIG. 24, access to core 2439 via parallel registers 2434 is completely independent of serial registers 2431. Thus, all control signals are handled by parallel logic without any need for intervention from the serial scan path of system-on-chip 2430. The function "get_parallel_data" simply takes the name of the parallel slice (illustratively, "parallel_reg") as an argument and, since no modifications to the bitstream are required, the body of the function is empty.

Figure 25:
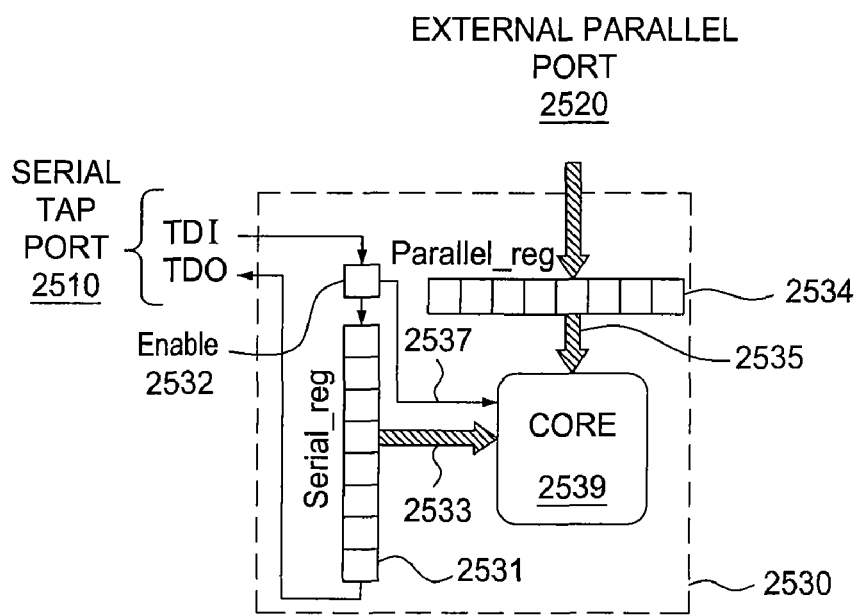
FIG. 25 depicts a high-level block diagram of an exemplary connection between a parallel port and core of a system-on-chip.

FIG. 25 depicts a high-level block diagram of an exemplary connection between a parallel port and core of a system-on-chip. As depicted in FIG. 25, the exemplary connection utilizes an independent parallel port with serial control. Specifically, connection 2500 includes a TAP port 2510 and an external parallel port 2520 providing parallel access to a system-on-chip 2530. The system-on-chip 2530 includes a core 2539, which may be accessed via the TAP port 2510 or via the external parallel port 2520.

The core 2539 is accessed via TAP port 2510 using serial registers 2531 in the serial scan path of system-on-chip 2530. The serial registers 2531 control access to core 2539 via a first interface 2533. The core 2539 is accessed via external parallel port 2520 using parallel registers 2534 which are outside of the serial scan path of system-on-chip 2530. The parallel registers 2534 control access to core 2539 via a second interface 2535.

As depicted in FIG. 25, access to core 2539 via parallel registers 2534 and associated second interface 2535 is controlled using an additional enable register 2532 in the serial scan path of system-on-chip 2530. The enable register 2532 controls access to core 2539 via parallel registers 2534 using a control interface 2537 from enable register 2532 to core 2539. Thus, the serial scan path of system on chip 2530 includes: TDI→enable register 2532→serial registers 2531→TDO.

Thus, as depicted in FIG. 25, access to core 2539 via parallel registers 2534 is controlled serially from the serial scan path of system-on-chip 2530. In this embodiment, the function "get_parallel_data" takes the name of the parallel slice (illustratively, "parallel_reg") as an argument and, further, since modification to the bitstream is required, the body of the function will include an instruction to set the value of enable register 2532 to the desired value.

Figure 26:
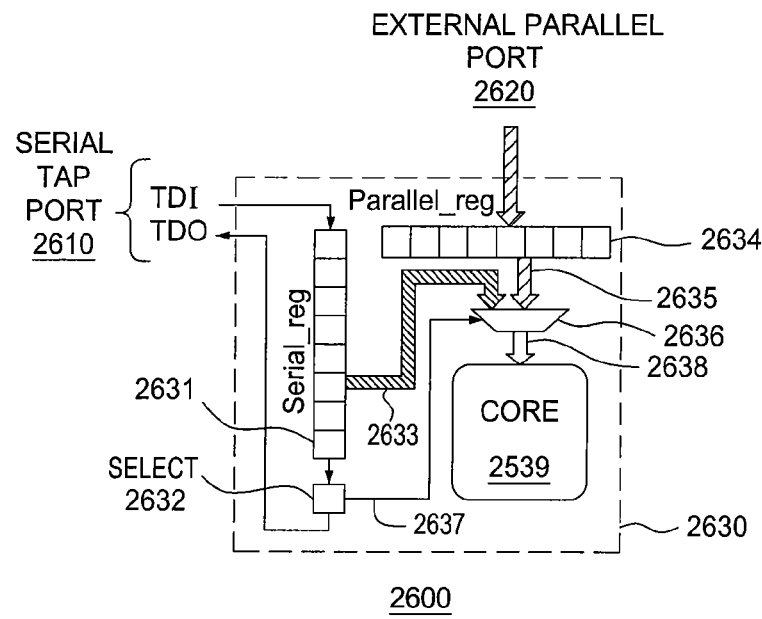
FIG. 26 depicts a high-level block diagram of an exemplary connection between a parallel port and core of a system-on-chip.

FIG. 26 depicts a high-level block diagram of an exemplary connection between a parallel port and core of a system-on-chip. As depicted in FIG. 26, the exemplary connection utilizes a shared access port to the core for serial and parallel data. Specifically, connection 2600 includes a TAP port 2610 and an external parallel port 2620 providing parallel access to a system-on-chip 2630. The system-on-chip 2630 includes a core 2639, which may be accessed via the TAP port 2610 or via the external parallel port 2620.

The core 2639 is accessed via TAP port 2610 using serial registers 2631 in the serial scan path of system-on-chip 2630. The serial registers 2631 control access to core 2639 via a first interface 2633. The core 2639 is accessed via external parallel port 2620 using parallel registers 2634 which are outside of the serial scan path of system-on-chip 2630. The parallel registers 2634 control access to core 2639 via a second interface 2635.

As depicted in FIG. 26, access to core 2639 via serial registers 2631 and parallel registers 2634 is controlled using a shared access port 2636. The shared access portion 2636 takes first interface 2633 from serial registers 2631 as a first input and takes second interface 2635 from parallel registers 2634 as a second input. The shared access port 2636 selects one of the inputs and provides the selected one of the inputs to core 2639 via a shared access interface 2638.

As depicted in FIG. 26, selection of one of the inputs by shared access port 2636 is controlled using an additional enable register 2632 in the serial scan path of system-on-chip 2630. The enable register 2632 controls access to core 2539 via shared access port 2636 and shared access interface 2638 using a control interface 2637 from enable register 2632 to shared access port 2636. Thus, the serial scan path of system on chip 2630 includes: TDI→serial registers 26314→enable register 2632→TDO.

Thus, as depicted in FIG. 26, access to core 2639 via parallel registers 2634 is controlled serially from the serial scan path of system-on-chip 2630. In this embodiment, system-on-chip 2539 will advertise dichotomy (e.g., by labeling serial registers 2631 and parallel registers 2634 as "alternate"). In such embodiments, the testing system knows that when the parallel interface is active, serial registers 2631 have no influence on core 2639 (i.e., they are effectively "dead storage"). This rule is associative in that many registers may share the same parallel port.

Figure 27:
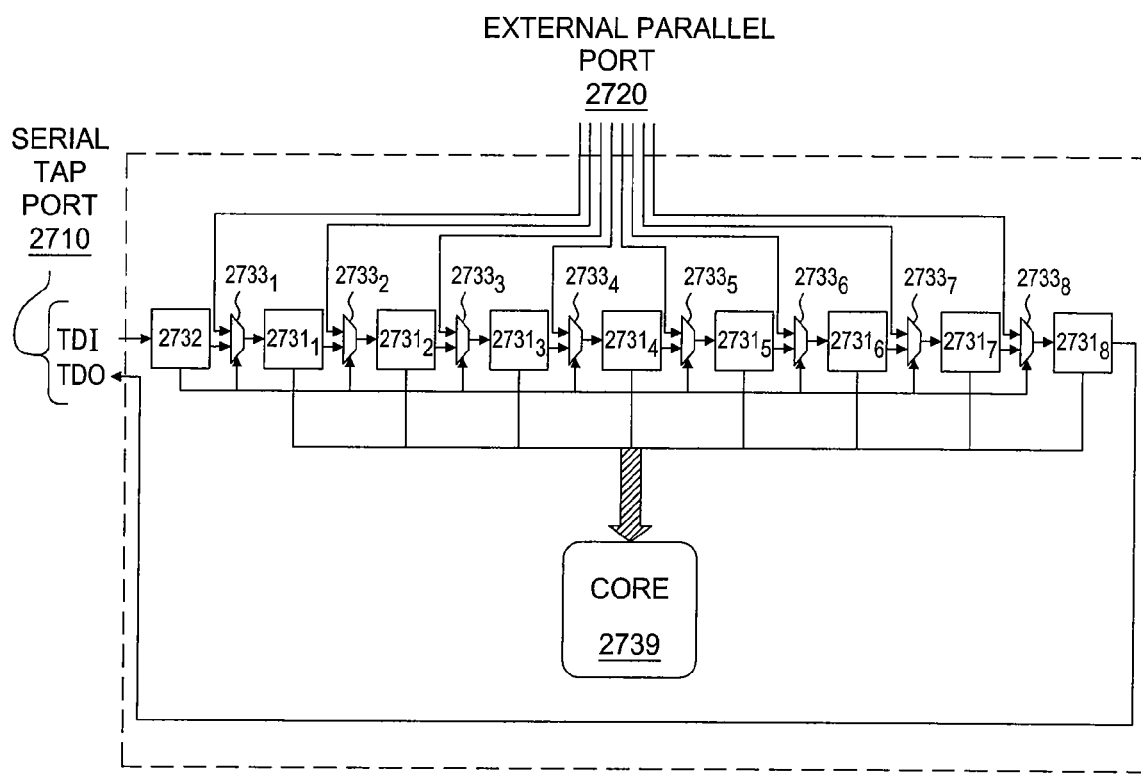
FIG. 27 depicts a high-level block diagram of an exemplary connection between a parallel port and core of a system-on-chip.

FIG. 27 depicts a high-level block diagram of an exemplary connection between a parallel port and core of a system-on-chip. As depicted in FIG. 27, the serial registers and parallel registers which provide parallel access to the core of the system-on-chip share the same flip-flops, thereby minimizing resources required to provide parallel access to the core of the system-on-chip. Specifically, connection 2700 utilizes an enable register 2732, a plurality of data registers $2731_1$-$2731_8$ (collectively, data registers 2731), and a plurality of shared access ports $2733_1$-$2733_8$ (collectively, shared access ports 2733).

As depicted in FIG. 27, the data input of enable register 2732 is a TDI input, the data output of enable register 2732 is one of the inputs of a first shared access port $2733_1$, the data output of first shared access port $2733_1$ is the data input of a first data register $2731_1$, a first data output of first data register $2731_1$ is one of the inputs of a second shared access port $2733_2$, the data output of second shared access port $2733_2$ is the data input of a second data register $2731_2$, a first data output of second data register $2731_2$ is one of the inputs of a third shared access port $2733_3$, the data output of third shared access port $2733_3$ is the data input of a third data register $2731_3$, and so forth, until the first data output of eighth data register $2731_8$ is a TDO output.

As further depicted in FIG. 27, each of the shared access ports 2733 includes a second data input (in addition to being coupled to a data output of the previous register in the scan path). The second data inputs of shared access ports $2733_1$-$2733_8$ are coupled to respective data inputs from external parallel port 2720 (denoted herein as parallel input connections), respectively. Thus, each shared access port 2733 selects data from one of its two data inputs (i.e., selecting either data input from the previous register in the serial scan path or data input from the one of the parallel input connections of external parallel port 2720 that is connected to that shared access port 2733).

As depicted in FIG. 27, the output of enable register 2732 is applied to each shared access port 2733 as an input selection signal for each shared access port 2733, thereby controlling selection of data by each shared access port 2733.

If the value of enable register 2732 indicates that serial data (from TAP port 2710) should be provided to the core 2739, the input selection signal provided from enable register 2732 to each shared access port 2733 directs each shared access port 2733 to select the input from the previous register in the scan path (rather than from the parallel input connection that is connected to the shared access port from external parallel port 2720).

In this case, shared access port 2733, selects the input from enable register 2732 (rather than from the parallel input connection of external parallel port 2720), thereby causing the value of enable register 2732 to be read into first data register $2731_1$ (and, thus, provided to core 2739). Similarly, in this case, shared access port $2733_2$ selects the input from first data register $2731_1$ (rather than from the parallel input connection of external parallel port 2720), thereby causing the value of first data register $2731_1$ to be read into second data register $2731_2$ (and, thus, provided to core 2739). In other words, although descriptions of the remaining data transitions are omitted for clarity, similar data transitions by others of the data registers 2731 enable serial data to be provided to core 2739.

If the value of enable register 2732 indicates that parallel data (from external parallel port 2720) should be provided to the core 2739, the input selection signal provided from enable register 2732 to each shared access port 2733 directs each shared access port 2733 to select the input from the parallel input connection that is connected to the shared access port from external parallel port 2720 (rather than from the previous register in the scan path).

In this case, shared access port $2733_1$ selects the input from the parallel input connection of external parallel port 2720 that is connected to shared access port $2733_1$ (rather than from enable register 2732), thereby causing the value from that parallel input connection of external parallel port 2720 to be read into first data register $2731_1$ (and, thus, provided to core 2739). Similarly, in this case, shared access port $2733_2$ selects the input from the parallel input connection of external parallel port 2720 that is connected to shared access port $2733_2$ (rather than from first data register $2731_1$), thereby causing the value from that parallel input connection of external parallel port 2720 to be read into second data register $2731_2$ (and, thus, provided to core 2739). In other words, although descriptions of the remaining data transitions are omitted for clarity, similar data transitions by others of the data registers 2731 enable parallel data to be provided to core 2739.

Furthermore, while a direct NSDL description of connection 2700 would be quite complicated, it should be noted that this type of connection is functionally equivalent to connection 2600 depicted and described with respect to FIG. 26. In connections 2600 and 2700, it is the value of the "select" slice which decides whether serial data reaches the core or parallel data (reaches the core. The only different between connection 2600 and connection 2700 is in the expected values: in connection 2700 the registers are shared, so in the case of parallel access the value to be expected is the parallel value, as the serial data is overwritten.

Although primarily depicted and described herein with respect to providing parallel access to a system-on-chip having one parallel port (for purposes of clarity), parallel access may be provided to a system-on-chip having multiple parallel ports. Similarly, although primarily depicted and described herein with respect to providing parallel access to a system-on-chip having one parallel slice (for purposes of clarity), parallel access may be provided to a system-on-chip having multiple parallel slices.

In such embodiments, multiple parallel ports may be identified in any manner. For example, multiple parallel ports may be identified using ordinal numbering (e.g., such as described with respect to crossroad devices). For example, a system-on-chip with n parallel inputs and m parallel outputs will have the following ports: "parallel_in_<i>", i=0, 1, . . . , n−1; "parallel_out_<k>", k=0, 1, . . . , m−1. Further, each parallel port will have its own function(s), each of which may be identified in any manner (e.g., by using a corresponding port name appended at the end, such as "get_parallel_data_parallel_in_0", "set_scan_synchro_paralle_out_3", and the like).

By contrast, there are no restrictions with respect to naming of multiple parallel slices, as long as the respective names of the parallel slices indicate that the slices are parallel slices (e.g., the names may begin with "parallel_"). In one embodiment, in which "send_parallel_data" and "get_parallel_data" take a slice name as a parameter, it is possible to connect any port with any parallel register. In another embodiment, in which "send_parallel_data" and "get_parallel_data" do not take a slice name as a parameter, the system-on-chip may declare exactly how each port "connects" to one or more parallel slices.

The NSDL description of the parallel interface includes a description of the scan path and its related functions. The NSDL description indicates the actual physical ports (parallel pins) to which the parallel interface connects. This may be handled by classical BSDL/HSDL rules in top-level files (e.g., such as in the manner with which BSDL identifies TAP signals). The realization of the parallel communication protocol is entrusted to the parallel interface driver. The testing system is told which parallel pins are controlled by which parallel interface driver.

Although primarily depicted and described herein with respect to input data flow for the parallel port, output data flow for the parallel port will be symmetrical. In other words, for each of the input connection types which may be implemented for input data flows to the system-on-chip (as depicted and described with respect to FIG. 24-FIG. 27), a corresponding symmetrical output connection type may be implemented for output data flow from the system-on-chip.

Although primarily depicted and described herein with respect to a parallel access interface supporting a simple internal connection between the internal parallel port of the parallel access interface and the parallel port of the system-on-chip, a parallel access interface may support more complex internal connections between internal parallel port of the parallel access interface and the parallel port of the system-on-chip. In this manner, NSDL can describe any Test Access Mechanism (TAM), regardless of its complexity.

In one embodiment, the internal connection between the internal parallel port of the parallel access interface and the parallel port of the system-on-chip may be provided using one or more crossroad devices. In one such embodiment, select and deselect functions may be utilized to handle the internal connection, either from the serial scan path or from the parallel port.

In another embodiment, the internal connection between the internal parallel port of the parallel access interface and the parallel port of the system-on-chip may be provided using a fan-in/fan-out scheme. In such embodiments, the bits of the parallel port may be used for driving multiple system-on-chip devices (i.e., bandwidth of the external parallel port is shared among the multiple system-on-chip devices by the internal parallel port).

Thus, although primarily depicted and described herein with respect to a parallel access interface which provides parallel access to one system-on-chip device, in other embodiments a parallel access interface may provide parallel access to multiple system-on-chip devices. A general connection scheme of such a parallel access interface is depicted and described with respect to FIG. 28.

Figure 28:
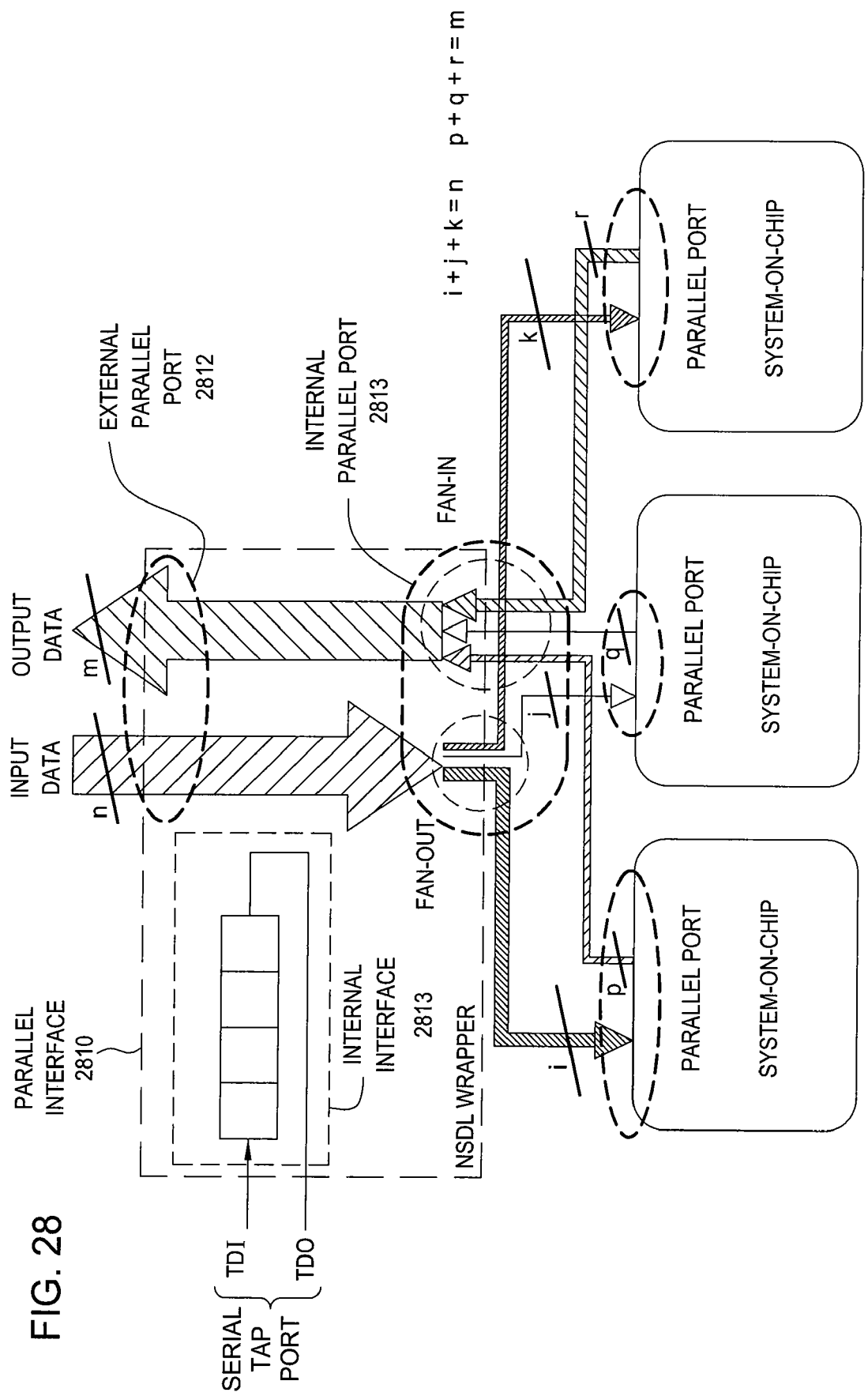
FIG. 28 depicts a high-level block diagram an internal connection scheme of a parallel access interface.

FIG. 28 depicts a high-level block diagram an internal connection scheme of a parallel access interface. Specifically, internal connection scheme 2800 provides a parallel access interface 2810 to three system-on-chips 2820₁-2820₃ (collectively, system-on-chips 2820). The parallel access interface 2810 includes an internal parallel port 2811, an external parallel port 2812, and an internal interface 2813. The external parallel port 2812 and internal parallel port 2811 support n input connections from a testing system to system-on-chips 2820 and m output connections from system-on-chips 2820 to a testing system.

As depicted In FIG. 28, each system-on-chip 2820 includes a parallel port supporting parallel input connections and parallel output connections. The internal port of parallel access interface 2810 supports: (1) a fan-out of the input data flow to each of the system-on-chips 2120 and (2) a fan-in to the output data flow from each of the system-on-chips 2120. The n input connections of external parallel port 2812 fan out into i input connections to system-on-chip 2820₁, j input connections to system-on-chip 2820₂, and k input connections to system-on-chip 2820₃ (i.e., n=i+j+k). The m output connections of external parallel port 2812 fan in from p output connections from system-on-chip 2820₁, q output connections from system-on-chip 2820₂, and r output connections from system-on-chip 2820₃ (i.e., m=p+q+r).

Thus, using the NSDL description language, system-on-chip devices of any complexity may be easily described. Any test resources of a system-on-chip device may be described, including components (e.g., IPs, instruments, crossroad devices, and the like), interconnections between components, and the like, as well as various combinations thereof. In NSDL, the descriptions of test resources of a system-on-chip are algorithmic descriptions, where each algorithmic description includes one or more compositional rules defined in a format adapted for being understood by a testing tool.

Figure 29:
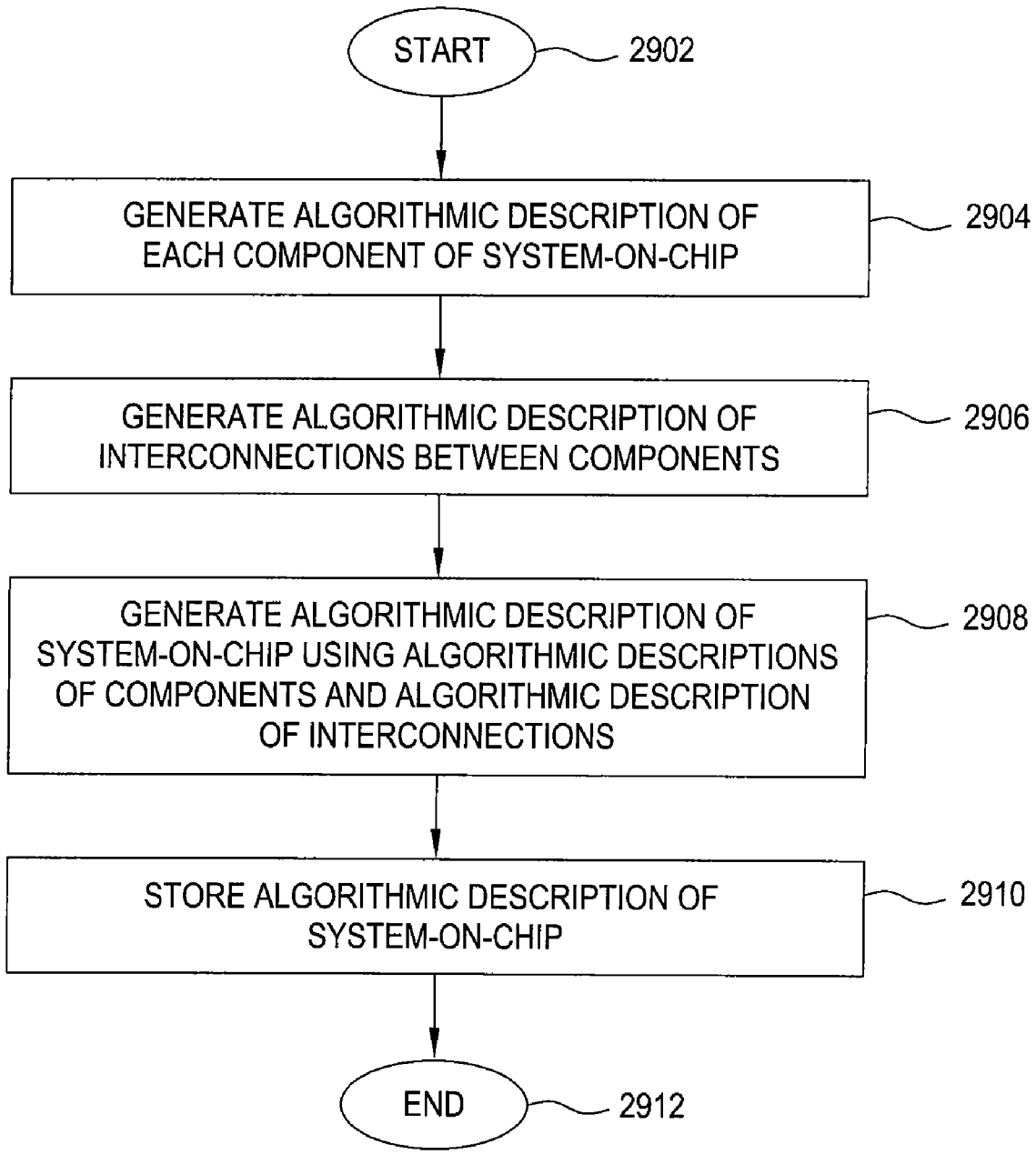
FIG. 29 depicts a method for describing test resources of a system-on-chip.

FIG. 29 depicts a method for describing test resources of a system-on-chip. Although depicted and described as being performed serially, at least a portion of the steps of method 2900 of FIG. 29 may be performed contemporaneously, or in a different order than depicted and described with respect to FIG. 29. The method 2900 begins at step 2902 and proceeds to step 2904.

At step 2904, an algorithmic description of each component of the system-on-chip is generated.

The algorithmic description of each component describes a mapping of at least one function supported by the component to at least one register value for the component. The algorithmic description of each component describes an internal scan path of the component.

In one embodiment, an algorithmic description of a component of a system-on-chip is generated by identifying at least one function supported by the component, generating an algorithmic description of the component which defines, for each of the at least one function, a mapping of the function to at least one register value for at least one register of the component, and storing the algorithmic description of the component.

At step 2906, an algorithmic description of the interconnections between components of the system-on-chip is generated. The algorithmic description of the interconnections between components specifies a system-level topology of the system-on-chip.

At step 2908, an algorithmic description of the system-on-chip is generated using the algorithmic descriptions of the components and the algorithmic description of the interconnections between components.

The algorithmic description of the system-on-chip describes a topology of the system-on-chip, from which a description of a scan path of the system-on-chip may be composed.

At step 2910, the algorithmic description of the system-on-chip is stored. The individual algorithmic descriptions of each of the components may be stored. The algorithmic description of the interconnections between components is stored. The algorithmic descriptions may be stored in any manner. At step 2912, method 2900 ends.

The algorithmic descriptions are adapted for being understood by a testing tool for use in testing the system-on-chip. As such, the algorithmic descriptions may be received by a processor (e.g., from a memory, from another system, or from any other source of such descriptions) in order to perform various tests (e.g., component-level tests, system-level tests, and the like, as well as various combinations thereof).

As described herein, in one embodiment, the NSDL language may be implemented using VHDL. In one such embodiment, grammatical rules for NSDL may be formalized through contextual Backus Normal Form (BNF) grammar. For example, BNF easily describes the generation of the syntactical structure, as in the following example:

```
<entity_declaration> ::=
        ENTITY <identifier> IS
            <entity_header>
            <entity_declarative_part>
        [BEGIN
            <entity_statement_part> ]
        END [ENTITY] [ <entity_simple_name> ] ;
```

In this example, the symbol '::=' indicates that the left-hand side element can be derived into the right-hand construct. The right hand-side can be composed either by more derivations lexemes (atomic elements no longer derivable, indicated in UPPER-CASE characters). A node is a derivation point, while a leaf is a node that can no longer be derived (i.e., right-hand side contains only lexemes). Square brackets '[' and ']' are used to express optional derivations (they are useful for defining recursive rules). The symbols '<' and '>' are used to indicate a further derivation. Quotation marks are used to indicate a string, coherently with VHDL rules.

This type of syntax can generate any possible "phrase" that structurally matches the language, and can be used to verify if a given text belongs to the language (i.e., it follows the rules). It is merely a structural description and it cannot convey any information about its "meaning", rather, attributes must be added to take care of this contextual information:

Left_hand↑(H)↓(L)::=right_hand_0↑(H0)↓(L0)
 [right_hand_1↑(H1)↓(L1)], where:
↑(L) indicates an information that is derived from lower-level derivations and that is transmitted to higher-level ones;
↓(H) indicates an information that is derived from higher-level derivations and that is transmitted to lower-level ones;
each node can define a set of rules to define how H is computed starting from H0 . . . Hn, and how the different L0 . . . Ln are obtained starting from L; and
each level can define a set of conditions on H, L, Hi and Li, for the phrase to have a "meaning" in the language.

The following rules (numbered [1] through [14]) describe declarations of IPs and instruments:

[1] <IP_declaration> ↑(H,n)↑(P_info)↑(Ext)↑(Cross)↑(Par)::=
        IP <identifier> IS
            <device_header> ↑(Ext)↑(Cross_decl)↑(Par)
        BEGIN
            <IP_instrument_archi_body>↑(H,n)↓(Ext)↑(P_info)
                ↑(Sel_Cross) ↑(Par_dec)
            END [IP] [<device_simple_name>] ;
    Rule: Cross=Cross_decl ∪ Sel_Cross
        If Cross_decl /= ø, check that there is a "select" /"deselect" statement
            for each "wired" element and at least a "select" for each
            "transaction" element.
        NB: Cross_decl = ø ↔ Sel_Cross = ø, otherwise error
        Check that all inter-module dependencies in "architecture_ body" have
            been resolved.
        If Par /= ø check that inside (H,n) there is at least one parallel register,
            and that inside (P_info) there is the declaration of corresponding
            "get_parallel_data"/ "send_parallel_data".
        If Par_dec/= ø check its consistency with the information in Par (port
            names, parallel registers, connections, fanning, etc...)
        NB: Par_decl = ø ↔ Par = ø, otherwise error

[2] <instrument_declaration>↑(H,n)↑(P_info)↑(Ext)↑(Cross)↑(Par) ::=
        INSTRUMENT <identifier> IS
            <device_header> ↑(Ext)↑(Cross_decl)↑(Par)
        ↑(Cross_decl)
        BEGIN
            <IP_instrument_archi_body>↑(H,n)↓(Ext)↑(P_info)
                ↑(Sel_Cross)↑(Par_dec)
            END [instrument] [device_simple_name] ;
    Rule: Cross=Cross_decl ∪ Sel_Cross [Same as rule 1]

[3] <IP_instrument_archi_body>↑(P_info)↓(Ext)↑(Sel_Cross)↑(Par_dec)
    ::=
        ARCHITECTURE < architecture_simple_name > OF <entity_name> IS
            architecture_declarative_part
        BEGIN
            <IP_instr_stat_part>↑(H,n)↑(P_info)↓(Ext)↑(Sel_Cross)↑(Par_dec)
            END [ ARCHITECTURE ] [ <architecture_simple_name> ] ;

[4] <IP_instr_stat_part>↑(H,n)↑(P_info)↓(Ext)↑(Sel_Cross)↑(Par_dec)    ::=
        <internal_scan_path>↑(H,n)
        [<parallel_declarations>↑(Par_dec)]
        <IP_instrument_statement_part>↓(Ext)↑(P_info) ↑(Sel_Cross)

[5] <device_header> ↑(Ext)↑(Cross_decl)↑(Par) ::=
        GENERIC (
            [ <crossroad_information>↑(Cross_decl) ]
            [ ; <parallel_information>↑(Par) ]
            [ ; <external_dependencies>↑(Ext) ]);
        This rule enables definition of the links with the scan path and
        declaration of eventual external references.
        NB: <crossroad_information> is derived in Rule [10]

[6] <external_dependencies> ↑(Ext) ::=
        <external_reference>↑(New_Ext)[;<external_dependencies>↑(Old_Ext)]
    Rule: Ext= New_Ext ∪ Old_Ext

[7] <external_reference> ↑(Ext)::= <string_identifier> : string
    Rule: ↑(Ext)= string_identifier Each one of these entries defines a symbolic name for an external element. This symbol will be used to refer to this element for external function dependencies.

```
[8] IP_instrument_statement_part ↓(Ext)↑(P_info)::=
       <proc_func_list>↓(Ext)↑(P_use)↑(Sel_Cross)
       [TEST_SET <proc_func_list>↓(Ext)↑(P_test) END TEST_SET;]
```

This rule describes the set of mandatory procedures on the usage of the instrument and the optional test procedure set. P_Info=P_Test∪P_use

```
[9]  <internal_scan_path> ↑(H,n) ::=
        <component_instantiation_statement> [<internal_scan_path>]
```

In the case of "Partial Access" or "Full Access", the scan path is described by direct instantiation of its components (see rules [37]-[41] for contextual rules of (H,n)). Note that this rule enables instrument and IP nesting. "No Access" devices are identified by the absence of this derivation.

```
[10] <crossroad_information> ↑(Cross)::=
        PRECEDENT : STRING := "TDI";
           FOLLOWING : STRING := "TDO"
        [ <tributaries>↑(Affls) ]
        [ <affluents>↑(Tribs) ]
        ;
        Rule: Cross = Affls ∪ Tribs
[11] <tributaries>↑(Tribs) ::=
          TRIBUTARY : STRING := "deselected" ;
        | <numbered_tributaries>↑(num_tribs);
        Rule: Tribs = "tributary"
           | Tribs = num_tribs
[12] <numbered_tributaries>↑(Tribs) ::=
           TRIBUTARY_<numeral> : STRING := "deselected"
           [; <numbered_tributaries>↑(Old_Tribs)]
           Rule: Tribs = "tributary_<numeral>" ∪ Old_tribs
[13] <affluents> ↑(Affls)::=
           AFFLUENT : STRING := "deselected" ;
         | <numbered_affluents>↑(num_affls) ;
         Rule: Affls = "affluent"
           | Affls = num_affls
[14] <numbered_affluents> ↑(Affls)::=
           AFFLUENT_<numeral> : STRING := "deselected"
           [; <numbered_affluents>↑(Old_Affls)]
           Rule: Affls = "affluent_<numeral>" ∪ Old_Affls
```

The instrument and IP definitions of Rules [1]-[14] permit instantiation of an IP/Instrument multiple times (like what is done with classical VHDL components). This is depicted in Rule [15].

```
[15] component_instantiation_statement ::=
          instantiation_label :
             instantiated_unit
             [ generic_map_aspect ]
             [ port_map_aspect ] ;
```

From the syntactical point of view, this instantiation rule (Rule [15]) is exactly the same as in classical VHDL. All novelties are on the contextual side:

(1) Instantiation creates a copy of device into the scan path. The compiler can easily retrieve its information from the compilation library and use them to complete the system scan path.

(2) The generic map takes care of specifying the precise scan path insertion point ("precedent", "following", affluents and tributaries).

(3) The other generic mappings will resolve the symbolic names of external elements into real ones (i.e. the label of the corresponding instance). The testing tool will also have to check that the referred procedures actually exist in the instantiated element.

The following rules (numbered [16] through [33]) describe exemplary procedures:

```
[16] <proc_func_list>↓(Ext)↑(P_info) ::=
     [<proc_func_proto_list>]<complete_proc_func_list>↓
     (Ext)↑(P_info)
[17] <proc_func_proto_list> ::=
<proc_func_prototype> [; <proc_func_proto_list>]
[18] <proc_func_prototype> ::= <procedure_prototype> |
                  <function_prototype>
[19] <procedure_prototype> ::=
      procedure <procedure_name> (<formal_parameter_list>)
         [DEPENDENCIES (<dep_list>);]
         LENGTH ( <length_descriptor>);
            BUSY_MODE ( <mode_identifier>);
         [CONNECTION <connection_type>;]
      Rule: Procedure prototypes are just a syntactical artifice to make the
code more readable for a human user. They carry no contextual
information.
      NB: The "connection" derivation is allowed only for selection
procedures.
[20] <function_prototype> ::=
      FUNCTION <procedure_name> (<formal_parameter_list>)
         [DEPENDENCIES (<dep_list>);]
            LENGTH ( <length_descriptor>);
            BUSY_MODE ( <mode_identifier>);
         [<optional_attributes>]
         RETURN <type> ;
      Rule: Procedure prototypes are just a syntactical artifice to make the
code more readable for a human user. They carry no contextual
information.
      NB: The "connection" derivation is allowed only for selection
procedures.
[21] <formal_parameter_list>
      Rule: Parameters follow the syntax of normal VHDL parameters.
Reference to scan path slices will be done by explicit naming.
[22] <complete_proc_func_list>↓(Ext)↑(P_info)↑(Cross) ::=
            <complete_procedure>↓(Ext)↑(new_P) ↑(Cross_Info)
            [;<complete_proc_func_list>↓(Ext)↑(OldP)↑(Old_Cross)] |
            <complete_function>↓(Ext)↑(new_P)
               [;<complete_proc_func_list>↓(Ext) ↑(OldP)]
      Rule: P_info=Old_P ∪ New_P
      Cross=Old_Cross ∪ Cross_info
[23] <complete_procedure>↓(Ext)↑(Proc_info)↑(Cross_info)::=
      PROCEDURE <procedure_name↑(Sel_info)>
         (<formal_parameter_list>↑(P))
         [DEPENDENCIES (<dep_list>)↓(Ext)↑(D);]
            LENGTH ( <length_descriptor>↑(L));
      BUSY_MODE (<mode_identifier>)↑(M);
         [CONNECTION <connection_type>↑(C_type);]
         IS
      begin
         <procedure_body>
      END <procedure_name>;
      Rule:
         P= parameter information (standard VHDL). One parameter at
least should refer to a slice or a static bitstream.
         L= procedure length information
         D= dependencies information
         M= Busy mode information
         <procedure_name> is a literal identifier
         <procedure_body> derivation like in normal VHDL
         Proc_info=P ∪ L ∪ D ∪ M
         Cross_info= if Sel_info/= ø (naming rules in Sel [1] – Sel [6])
               then Cross_info= Sel_info ∪ C_type
         NB: Sel_info= ø ↔ C_type= ø, otherwise error
[24] <complete_function>↓(Ext)↑(Proc_info)::=
      FUNCTION <function_name> (<formal_parameter_list>↑(P))
         [DEPENDENCIES (<dep_list>)↓(Ext)↑(D);]
```

-continued

```
    LENGTH ( <length_descriptor>↑(L));
    BUSY_MODE (<mode_identifier>)↑(M);
    RETURN <type> IS
    BEGIN
    < function_body>
    END < function_name>;
    Rule:
        P= parameter information (standard VHDL). One parameter at
least should refer to a slice or a static bitstream
        L= procedure length information
        D= dependencies information
        M= Busy mode information
        < function_name> is a literal identifier
        < function_body> derivation like in normal VHDL
        Proc_info=P ∪ L ∪ D ∪ M
[25] <dep_list>↓(Ext)↑(D_new) ::=
        <dependence>↓(Ext)↑(D)[;dep_list↓(Ext)↑(D_old)]
    Rule: D_new= D_old ∪ D or D_new=D
[26] <dependence>↓(Ext)↑(D) ::= <string_identifier>↑(P)|
        <string_identifier>↑(E).<string_identifier>↑(P)
    Rule:
        P= name of depending procedure
        E= name of external device P is defined in
        Check E ∈Ext, otherwise error
        D= P ∪ E
[27] <mode_identifier>↑(M) ::= HOLD | DONT_CARE
    Rule: M= "hold" or "dont_care"
[28] <length_descriptor>↑(L) ::= <length_exp>↑(T)
[: <end_cond>↑(C)]
    Rule: L=T∪ C
[29] < length_exp >↑(T) ::= <time_exp>↑(T) |
        <time_exp>↑(L),<time_exp>↑(A),<time_exp>↑(U)
    Rule: T=T or L ∪ A ∪ U
        L= Lower bound for function length
        A= Average function length
        U= Upper bound for function length
[30] < time_exp >↑(T) ::= <numeral><time_type> | <numeral>
    Rule: T contain either absolute time or clock count (if no time unit is
specified)
[31] < end_cond >↑(C) ::= <boolean_expression>
    Rule: A Boolean expression that indicates the ending condition of the
procedure. It should use signals from the slices, identified by explicit
naming.
[32] <connection_type> ::= WIRED | TRANSACTION
[33] <optional_attributes> ::=
    Rule: This derivation is left open by purpose. By defining optional
parameters any two actors will be able to exchange information in the
format they prefer, instead of one arbitrary chosen at standardisation
time. This could be used, for instance, to give an estimation of the
switching activity for power management, or directly give the
joules/watts. The Test Tool will ignore derivations it does not
implement, eventually producing a warning.
```

As described herein, selection procedures are identified by their name. The following rules (numbered Sel [1] through Sel [6]) explain control of the naming of selection procedures in BNF-like syntax. The exemplary crossroad devices depicted and described herein with respect to FIG. 8, FIG. 9, and FIG. 10 illustrate exemplary application of these rules.

```
    sel[1] <procedure_name> ↑(Sel_info) :: =
            <radix>[<extentions>↑(Affls)↑(Tribs)]
        Rule : Sel_info=(Affls) ∪ (Tribs)
    sel[2] <radix> ::= SELECT | DESELECT
    sel[3] <extensions> ::=
            <affluents↑(Affls)> | <tributaries↑(Tribs)>
    sel[4] <affluents↑(Affls)> ::= AFFLUENT
                    | <numbered_affluents↑(Nmb_Affls)> |
                    ø
        Rule : if (affluent) Affls="All";
            if (numbered_affluents) Affls= Nmb_Affls
            if (ø) Affls= ø;
```

Explanation: This rule detects the affluent the function commands. It can be none (i.e. the rule ends as an empty set), all affluents (not specified), or just a subset (one or more affluent_<nmb>);

```
    sel[5] <numbered_affluents↑(New_Affls)> ::=
            AFFLUENT_<nmb>[;< numbered_affluents↑(Old_Affls)>]
        Rule : <nmb> can be any natural number
            New_Affls= Old_Affls∪affluenut_<nmb>;
    sel[6] <tributariess↑(Tribs)> ::= TRIBUTARY
                    | <numbered_tributaries↑(Nmb_Tribs)> |
                    ø
        Rule : if (tributary) Tribs="All";
            if (numbered_tributaries) Tribs= Nmb_Tribs
            if (ø) Tribs= ø;
```

Explanation: This rule detects the tributaries the function commands. It can be none (i.e. the rule ends as an empty set), all tributaries (not specified), or just a subset (one or more tributary_<nmb>);

For selection procedures to be used by an automatic test generation tool, there is need also for standardized arguments, so that the automatic test generation tool knows how to handle them. Following the actual selection algorithm, there can be two ways of referencing the derivations: (1) by explicit naming, i.e. using a "string" or equivalent type; (2) by ordinal numbering of the derivation, i.e. using a std_logic_vector of the good size.

The arguments will change following the derivations the procedure controls (as seen from the selection rules Sel [1]-Sel [6])). The following prototypes are relative to the most general cases (NB: even if the example is a "select", the same rules are of course valid for "deselect" too):

1) select(tributary_nmb: in std_logic_vector,
    affluent_nmb: in std_logic_vector)
2) select(tributary_name: in string,
    affluent_name: in string)

The automatic test generation tool will just have to fill in correspondent name/number. In the case of more precise selection functions, only some of the arguments need be used (e.g., the deselection functions of the hierarchical switch device of FIG. 9, eventually having none if the name itself already univocally identifies the target (e.g., the SIB of FIG. 8).

The following rules (Rules [34] through [41] are based on VHDL 93, and are compatible with it, but are sensibly simpler. All derivations not directly related to NSDL have been removed. It should be noted that Rule [34] through Rule [39] are classical VHDL syntactical rules, shown here only to describe the new contextual rules.

```
[34] library_unit ::=
        primary_unit
        | secondary_unit
[35] primary_unit ↑(H,n)↑(P_info)↑(Cross)↑(Par) ::=
        entity_declaration↑(H,n)
        | configuration_declaration
        | package_declaration
        | IP_declaration ↑(H,n)↑(P_info)↑(Ext)↑(Cross)↑(Par)
        | Instrument_declaration ↑(H,n)↑(P_info)↑(Ext)↑(Cross)↑(Par)
    Note: This is the rule where NSDL integrates with VHDL, allowing
the definition of IPs and Instruments as top-level entities. It is also the
point where the testing tool completes the hierarchy analysis, whose
information is stored
in (H,n), (P_info), (Cross) and (Par).
    Rule: Ext = ø, otherwise error (that is the top module)
[36] secondary_unit ::=
```

```
                architecture_body
              | package_body
[37] entity_declaration ↑(H,n)::=
            ENTITY <identifier> IS
                entity_header
                entity_declarative_part
            [ BEGIN
                architecture_body ↑(H,n)]
            END [ entity ] [ entity_simple_name ] ;
    Rule: This rule describes the scan path internals of the defined entity,
to be used by the compiler at instantiation time. It can be used to describe
non-P1687 compliant entities that have a scan path but not a set of
functions/procedures. Note that entities remain like in classical VHDL,
so they do not allow external dependencies.
[38] architecture_body ↑(H,n) ::=
            ARCHITECTURE <architecture_simple_name> OF entity_name
                IS architecture_declarative_part
            BEGIN
                architecture_statement_part ↑(H,n)↑(P,F)
            END [ architecture ] [ <architecture_simple_name> ] ;
    Rule: Check integrity of scan chain defined by (P,F) (beginning at
TDI, ending at TDO, no holes, linear apart from hierarchy, etc..).
[39] architecture_statement_part ↑(H,n)↑(P,F)::=
[component_instantiation_statement ↑(H_i,n_i)↑(P,F)_i]
    Rule:
        H= ∪ Hi + (H_in, H_out)_i
        (P,F)= ∪ (P,F)i,
        n=Σ_i n_i
[40] <scan_path>↑(SP_info) ::=
            <component_instantiation_statement>↑(C_info)
        [<scan_path>↑(S_old)]
    Rule: This rule can also be interpreted as a contextual check on
VHDL rule on concurrent statements that limits the development of
the rule to instances of scan-chain related cell instances.
        SP_info = S_old ∪ C_infor
        Check for scan path integrity using P and F inside C_info
[41] component_instantiation_statement ↑(C_info) ::=
    V instantiation_label :
        instantiated_unit ↑(H,n)↑(P,F[,H_in, H_out])
        [ generic_map_aspect ]
        [ port_map_aspect ] ;
    Rule: n (number of cells), H(Hierarchy information), P(revious),
        F(ollowing),( H,n) taken from "instatiated_unit"
        description in database
        H_in, H_out hierarchical scan paths introduced by control cells
        C_info = (H,n) ∪ (P,F[,H_in, H_out])
```

The following rules (numbered [42] through [57]) include exemplary formal rules for parallel access:

```
[42] <parallel_information> ↑(Par)::=
        [ <parallel_inputs> ↑(par_in)]
        [ <parallel_outputs>↑(par_out) ]
        ;
    Rule: Par = par_in ∪ par_out
[43] <parallel_declarations>↑(Par_dec) ::=
        [<parallel_connection> ↑(par_connection)]
        [<alternates>↑(alter_info)]
        [ <fanning>↑(fanning_info)]
    Rule: Par_dec = par_connection•fanning_info•alter_info
[44] <parallel_inputs>↑(par_in) ::=
            <single_parallel_input>↑(idf)
        | <numbered_par_inputs>↑(par_ins) ;
    Rule: par_in = idf
        | par_in = par_ins
[45] <single_parallel_input>↑(idf)::=
            PARALLEL_IN : STRING := "deselected" ;
    Rule: idf = "parallel_in"
[46] <numbered_par_inputs>↑(par_in) ::=
            <numbered_par_input>↑(idf)
            [; <numbered_par_inputs>↑(par_ins)]
    Rule: par_in = idf ∪ par_ins
[47] <numbered_par_input>↑(idf)::=
            PARALLEL_IN_<numeral> : STRING := "deselected"
    Rule: idf = "parallel_in_<numeral>"
[48] <parallel_outputs> ↑(par_out)::=
            <single_parallel_output>↑(idf)
            | <numbered_par_outputs> ↑(par_outs);
    Rule: par_out = idf
        | par_out = par_outs
[49] <single_parallel_output>↑(idf)::=
            PARALLEL_OUT : STRING := "deselected" ;
    Rule: idf = "parallel_out"
[50] <numbered_par_outputs>↑(par_outs) ::=
            <numbered_par_output> ↑(idf)
            [; <numbered_par_outputs>↑(old_par_outs)]
    Rule: par_outs = idf ∪ old_par_outs
[51] <numbered_par_output>↑(idf) ::=
            PARALLEL_OUT_<numeral> : STRING := "deselected"
    Rule: idf = "parallel_out_<numeral>"
[52] <fanning>↑(fanning_info) ::=
            <port_name>↑(idf) FAN <provenance>↑(provenance_info);
    Rule: fanning_info = idf ∪ provenance_info
[53] <port_name>↑(idf) ::= <single_parallel_output>↑(idf)
            |<numbered_par_outputs>↑(idf)
            | <single_parallel_input>↑(idf)
            | <numbered_par_inputs>↑(idf)
[54] <provenance> ↑(provenance_info) ::=
            <port_name>↑(idf)[&<provenance>↑(old_prov)]
    Rule: provenance_info = old_prov ∪ idf
    NB: "identifier"
```

This rule allows the description of both fan-in and fan-outs (depicted and described with respect to FIG. 28), without any restriction on the parallel ports used for the composition. The composition is done following the concatenation rules of VHDL signals ('&' symbol), using the entire ports.

```
[55] <alternates>↑(alter_info) ::=
        <serial_reg>↑(idf) IS ALTERNATE OF <alter_regs>↑(idf_list);
    Rule: alter_info = idf ∪ idf_list
[56] <register_list>↑(idf_list) ::=
        <parallel_reg>↑(idf) [,<register_list>↑(old_idf_list)];
    Rule: idf_list = idf ∪ old_idf_list
        "parallel_reg" is a classical VHDL identifier
[57] <parallel_connection>↑(par_connection) ::=
        <port_name>↑(idf) CONNECTS <register_list>↑(idf_list);
    Rule: par_connection = idf ∪ idf_list
```

As described herein, in a manner similar to crossroad devices, parallel interface exploits some naming rules to identify key resources. The elements needing naming include:

Parallel Slices: A slice that can be access by a parallel connection has its name beginning with "parallel_". Following the connection schemes, these slices can be completely independent of the serial scan path or part of the serial scan path.

Parallel Functions: Access to the parallel resources is obtained through two specific functions: "get_parallel_data" and "send_parallel_data".

As described herein, there are three possible synchronization modes for a parallel interface: synchronised with the scan chain, burst, and asynchronous. In one embodiment, toggling between these modes is done by specific functions that, just like for crossroad selection functions, specify how the bitstream must be changed, if needed. These functions include:

function set_scan_synchro return boolean;

function set_burst(length: in burst_length_type) return boolean;

function set_asynchro return boolean;

function disable_port return boolean;

The testing tool can easily know which mode is active by keeping track of the calls to these functions. A device will only declare the functions for the modes it actually implements.

The type "burst_length_type" must be defined inside the parallel interface, as a subtype of integer, such that the developer can indicate the range of values allowed for the burst. Examples include: "subtype burst_length_type is Integer range 3 to 10", "type burst_length_type is (6,8,10)", and the like. This solution means that each Parallel Interface will declare its own "burst_length_type", which will be valid only locally and so will not interfere with eventual other interfaces.

In an embodiment in which a parallel interface has more than one port, the name of the port to which the function refers will be appended to the function name. Examples include "set_scan_synchro_parallel_out_0", "disable_port_parallel_in", and the like.

The foregoing BNF rules merely constitute examples of rules which may be used to implemented NSDL. The present invention is not intended to be limited to or by such rules.

Figure 30:
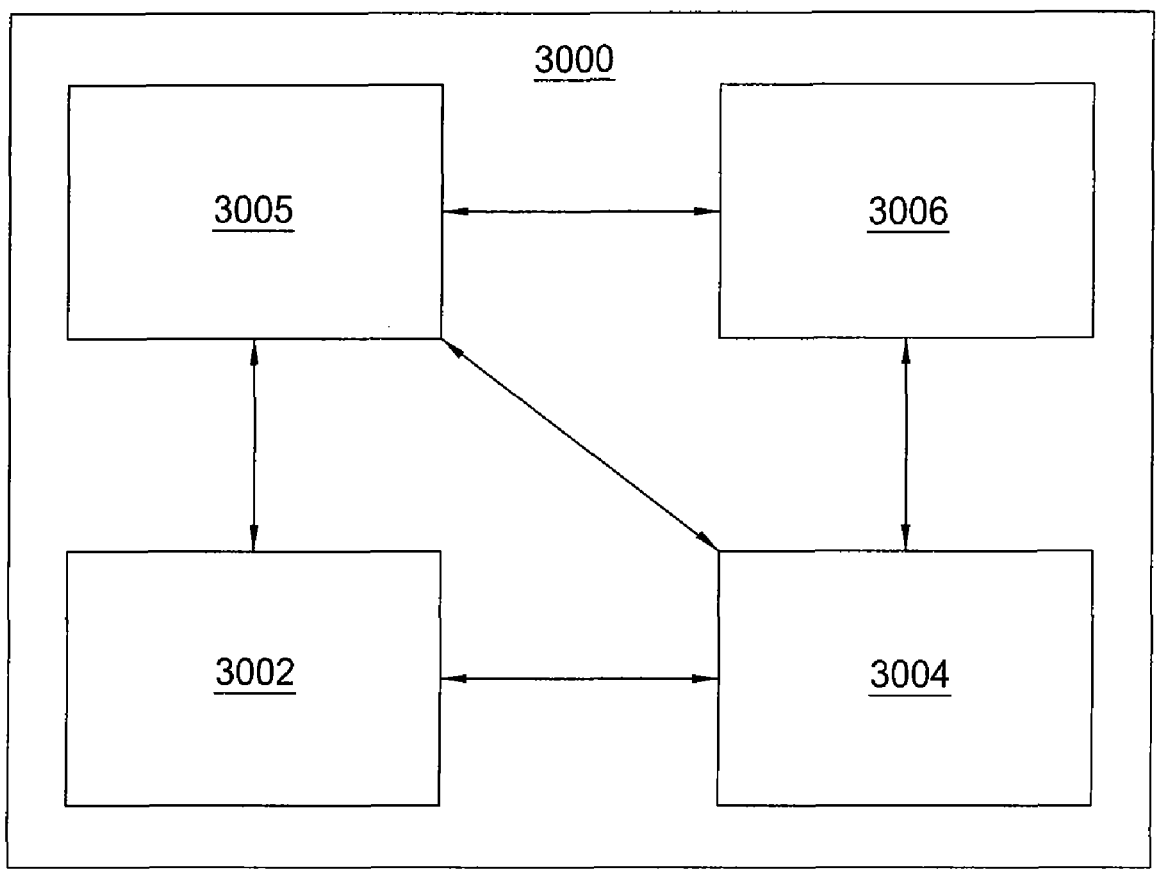
FIG. 30 depicts a high-level block diagram of a general-purpose computer suitable for use in performing the functions described herein.

FIG. 30 depicts a high-level block diagram of a general-purpose computer suitable for use in performing the functions described herein. As depicted in FIG. 30, system 3000 comprises a processor element 3002 (e.g., a CPU), a memory 3004, e.g., random access memory (RAM) and/or read only memory (ROM), a testing module 3005, and various input/output devices 3006 (e.g., storage devices, including but not limited to, a tape drive, a floppy drive, a hard disk drive or a compact disk drive, a receiver, a transmitter, a speaker, a display, an output port, and a user input device (such as a keyboard, a keypad, a mouse, and the like)).

It should be noted that the present invention may be implemented in software and/or in a combination of software and hardware, e.g., using application specific integrated circuits (ASIC), a general purpose computer or any other hardware equivalents. In one embodiment, the present testing process 3005 can be loaded into memory 3004 and executed by processor 3002 to implement the functions as discussed above. As such, testing process 3005 (including associated data structures) of the present invention can be stored on a computer readable medium or carrier, e.g., RAM memory, magnetic or optical drive or diskette, and the like.

Although primarily depicted and described herein with respect to specific implementations of system-on-chip devices which may be described and tested using NSDL, various other system-on-chip devices may be described and tested using NSDL. Although primarily depicted and described herein with respect to using NSDL to describe and test system-on-chip devices, various other electronic circuits may be described and tested using NSDL. The present invention is not intended to be limited to describing and testing specific electronic circuits depicted and described herein.

Although primarily depicted and described herein with respect to specific implementations of a testing system which may be utilized to describe and test system-on-chip devices using NSDL, various other implementations of testing systems may be utilized to describe and test system-on-chip devices using NSDL. The present invention is not intended to be limited to specific implementations of testing systems depicted and described herein.

It is contemplated that some of the steps discussed herein as software methods may be implemented within hardware, for example, as circuitry that cooperates with the processor to perform various method steps. Portions of the present invention may be implemented as a computer program product wherein computer instructions, when processed by a computer, adapt the operation of the computer such that the methods and/or techniques of the present invention are invoked or otherwise provided. Instructions for invoking the inventive methods may be stored in fixed or removable media, transmitted via a data stream in a broadcast or other signal bearing medium, and/or stored within a memory within a computing device operating according to the instructions.

Although various embodiments which incorporate the teachings of the present invention have been shown and described in detail herein, those skilled in the art can readily devise many other varied embodiments that still incorporate these teachings.

What is claimed is:

1. A method for describing at least a portion of a system for enabling testing of at least a portion of the system, the system comprising a plurality of components, the method comprising: using a processor for:
   receiving an algorithmic description of a composition of the components of the system, wherein the algorithmic description of the composition of components comprises algorithmic descriptions of the respective components of the composition and a description of interconnections between the components of the composition;
   receiving, for each component of the composition, an algorithmic description of access to the component, wherein the algorithmic description of access to the component comprises an algorithmic description of one or more access mechanisms configured for use in accessing the component and a description of one or more interconnections between the one or more access mechanisms and the component; and
   storing the algorithmic description of the composition and the algorithmic descriptions of access to the components for use in testing at least a portion of the system.

2. The method of claim 1, wherein, for each component of the composition, the algorithmic description of the component describes a mapping of each of at least one function supported by the component to at least one register value for the component.

3. The method of claim 2, wherein, for each component of the composition, the at least one function comprises at least one of a function for testing the component and a function for executing an operation on the component.

4. The method of claim 1, wherein, for each component, the algorithmic description of the component specifies a description of an internal scan path of the component, wherein the description of the internal scan path of the component comprises scan path length information and scan path hierarchy information.

5. The method of claim 1, wherein the description of the interconnections between the components comprises a description of a topology of at least a portion of the system, wherein the description of the topology comprises a description of a scan path of the at least a portion of the system, wherein the description of the system scan path comprises scan path length information and scan path hierarchy information.

6. The method of claim 1, further comprising:
   processing the algorithmic description of the composition and the algorithmic descriptions of access to the components for determining an input bitstream for testing the at least a portion of the system and an expected output bitstream expected from testing the at least a portion of the system.

7. The method of claim 6, wherein the algorithmic description of the composition and the algorithmic descriptions of access to the components are configured for use in identifying, for each of the components, which bit positions of the input bitstream are associated with the component and which bit positions of an associated actual output bitstream are associated with the component.

8. The method of claim 1, wherein an algorithmic description comprises at least one compositional rule in a format adapted for being understood by a testing tool.

9. An apparatus for describing at least a portion of a system for enabling testing of at least a portion of the system, the system comprising a plurality of components, the apparatus comprising:
a processor configured for:
receiving an algorithmic description of a composition of the components of the system, wherein the algorithmic description of the composition of components comprises algorithmic descriptions of the respective components of the composition and a description of interconnections between the components of the composition; and
receiving, for each component of the composition, an algorithmic description of access to the component, wherein the algorithmic description of access to the component comprises an algorithmic description of one or more access mechanisms configured for use in accessing the component and a description of one or more interconnections between the one or more access mechanisms and the component; and
storing the algorithmic description of the composition and the algorithmic descriptions of access to the components for use in testing at least a portion of the system.

10. The apparatus of claim 9, wherein, for each component of the composition, the algorithmic description of the component describes a mapping of each of at least one function supported by the component to at least one register value for the component.

11. The apparatus of claim 10, wherein, for each component of the composition, the at least one function comprises at least one of a function for testing the component and a function for executing an operation on the component.

12. The apparatus of claim 9, wherein, for each component, the algorithmic description of the component specifies a description of an internal scan path of the component, wherein the description of the internal scan path of the component comprises scan path length information and scan path hierarchy information.

13. The apparatus of claim 9, wherein the description of the interconnections between the components comprises a description of a topology of at least a portion of the system, wherein the description of the topology comprises a description of a scan path of the at least a portion of the system, wherein the description of the system scan path comprises scan path length information and scan path hierarchy information.

14. The apparatus of claim 9, wherein the processor is configured for processing the algorithmic description of the composition and the algorithmic descriptions of access to the components for determining an input bitstream for testing the at least a portion of the system and an expected output bitstream expected from testing the at least a portion of the system.

15. The apparatus of claim 14, wherein the algorithmic description of the composition and the algorithmic descriptions of access to the components are configured for use in identifying, for each of the components, which bit positions of the input bitstream are associated with the component and which bit positions of an associated actual output bitstream are associated with the component.

16. The apparatus of claim 9, wherein an algorithmic description comprises at least one compositional rule in a format adapted for being understood by a testing tool.

17. A computer non-transitory readable storage medium storing instructions which, when executed by a computer, cause the computer to perform a method for describing at least a portion of a system for enabling testing of at least a portion of the system, the system comprising a plurality of components, the method comprising:
receiving an algorithmic description of a composition of the components of the system, wherein the algorithmic description of the composition of components comprises algorithmic descriptions of the respective components of the composition and a description of interconnections between the components of the composition;
receiving, for each component of the composition, an algorithmic description of access to the component, wherein the algorithmic description of access to the component comprises an algorithmic description of one or more access mechanisms configured for use in accessing the component and a description of one or more interconnections between the one or more access mechanisms and the component; and
storing the algorithmic description of the composition and the algorithmic descriptions of access to the components for use in testing at least a portion of the system.

18. The computer readable storage medium of claim 17, wherein, for each component of the composition, the algorithmic description of the component describes a mapping of each of at least one function supported by the component to at least one register value for the component.

19. The computer readable storage medium of claim 18, wherein, for each component of the composition, the at least one function comprises at least one of a function for testing the component and a function for executing an operation on the component.

20. The computer readable storage medium of claim 17, wherein, for each component, the algorithmic description of the component specifies a description of an internal scan path of the component, wherein the description of the internal scan path of the component comprises scan path length information and scan path hierarchy information.

21. The computer readable storage medium of claim 17, wherein the description of the interconnections between the components comprises a description of a topology of at least a portion of the system, wherein the description of the topology comprises a description of a scan path of the at least a portion of the system, wherein the description of the system scan path comprises scan path length information and scan path hierarchy information.

22. The computer readable storage medium of claim 17, further comprising:
processing the algorithmic description of the composition and the algorithmic descriptions of access to the components for determining an input bitstream for testing the at least a portion of the system and an expected output bitstream expected from testing the at least a portion of the system.

23. The computer readable storage medium of claim 22, wherein the algorithmic description of the composition and the algorithmic descriptions of access to the components are configured for use in identifying, for each of the components, which bit positions of the input bitstream are associated with the component and which bit positions of an associated actual output bitstream are associated with the component.

24. The computer readable storage medium of claim 17, wherein an algorithmic description comprises at least one compositional rule in a format adapted for being understood by a testing tool.

* * * * *